United States Patent
Kimura et al.

(10) Patent No.: US 11,993,728 B2
(45) Date of Patent: May 28, 2024

(54) COMPOSITION FOR ELECTRONIC DEVICES, INK FOR ELECTRONIC DEVICES, AND METHOD FOR PRODUCING ELECTRONIC DEVICE

(71) Applicant: Konica Minolta, Inc., Tokyo (JP)

(72) Inventors: Akihiro Kimura, Hino (JP); Miyuki Okaniwa, Sagamihara (JP); Hiroto Ito, Yokohama (JP)

(73) Assignee: KONICA MINOLTA, INC., Tokyo (JP)

( * ) Notice: Subject to any disclaimer, the term of this patent is extended or adjusted under 35 U.S.C. 154(b) by 1015 days.

(21) Appl. No.: 16/955,627

(22) PCT Filed: Feb. 14, 2019

(86) PCT No.: PCT/JP2019/005266
§ 371 (c)(1),
(2) Date: Jun. 18, 2020

(87) PCT Pub. No.: WO2019/163625
PCT Pub. Date: Aug. 29, 2019

(65) Prior Publication Data
US 2021/0008872 A1    Jan. 14, 2021

(30) Foreign Application Priority Data
Feb. 23, 2018   (JP) ................................ 2018-030241
Apr. 18, 2018   (JP) ................................ 2018-079531

(51) Int. Cl.
*C09D 7/20*   (2018.01)
*C09D 11/36*  (2014.01)
(Continued)

(52) U.S. Cl.
CPC ................ *C09D 7/20* (2018.01); *C09D 11/36* (2013.01); *C09D 11/38* (2013.01); *H10K 85/322* (2023.02); *H10K 50/16* (2023.02)

(58) Field of Classification Search
CPC .......... C09D 7/20; C09D 11/36; C09D 11/38; H10K 71/15; H10K 85/654; H10K 85/655; H10K 85/6574; H10K 85/322
See application file for complete search history.

(56) References Cited

U.S. PATENT DOCUMENTS

2018/0094000 A1*   4/2018   Hatakeyama ........ H10K 85/657

FOREIGN PATENT DOCUMENTS

| CN | 107406759 A | 11/2017 |
|----|----|----|
| WO | 2009/063850 A1 | 5/2009 |

(Continued)

OTHER PUBLICATIONS

Office Action for related Chinese Application No. 201980014009.9, dated Dec. 8, 2022, and English translation thereof (23 pages).
(Continued)

*Primary Examiner* — Khanh T Nguyen
(74) *Attorney, Agent, or Firm* — LUCAS & MERCANTI, LLP

(57) ABSTRACT

The present invention addresses the problem of providing: a composition for electronic devices in which when a film is formed therefrom, the amount of residual solvents including fluorine-containing solvents within the film is reduced, the effects of residual solvents on a device are minimized, and it is thus possible to achieve high element performance; an ink for electronic devices that is suitable for wet processes and that makes it possible to achieve high liquid stability and element performance as a result of containing the composition for electronic devices; and a method for producing an electronic device. This composition for electronic devices contains a component A and a component B and is characterized in that the component A is a fluorine-containing solvent and the component B is a compound having a structure represented by general formula (1).

10 Claims, 2 Drawing Sheets

(51) Int. Cl.
   *C09D 11/38*   (2014.01)
   *H10K 85/30*   (2023.01)
   H10K 50/16    (2023.01)

(56) References Cited

FOREIGN PATENT DOCUMENTS

WO   2016/143624 A1   9/2016
WO   2016/152418 A1   9/2016

OTHER PUBLICATIONS

International Preliminary Report on Patentability for corresponding International Application No. PCT/JP2019/005266 dated Aug. 27, 2020 with English translation (11 pages).
JPO, Notice of the Reasons for Rejection for the related Japanese Patent Application No. 2020-501712, dated Jun. 28, 2022, with English translation.
PCT, International Search Report for the corresponding application No. PCT/JP2019/005266, dated May 14, 2019, with English translation (4 pages).

* cited by examiner

COMPOSITION FOR ELECTRONIC DEVICES, INK FOR ELECTRONIC DEVICES, AND METHOD FOR PRODUCING ELECTRONIC DEVICE

CROSS REFERENCE TO RELATED APPLICATION

This Application is a 371 of PCT/JP2019/005266 filed on Feb. 14, 2019, which, in turn, claimed the priority of Japanese Patent Application No. 2018-030241 filed on Feb. 23, 2018 and Japanese Patent Application No. 2018-079531 filed on Apr. 18, 2018, all of the above applications are incorporated herein by reference.

TECHNICAL FIELD

The present invention relates to a composition for an electronic device, an ink for an electronic device, and a method for manufacturing an electronic device. More particularly, the present invention relates to a composition for an electronic device in which the residual amount of a solvent containing a fluorine-containing solvent in a formed film is reduced, and the influence of the residual solvent on the device may be suppressed to exhibit high device performance, and an ink for an electronic device and a method for manufacturing an electronic device in which the composition for the electronic device contains the composition for a wet process suitability and may exhibit high liquid stability and device performance.

BACKGROUND

When manufacturing an electronic device such as an organic electroluminescence element (hereinafter referred to as an organic EL element), an organic thin film solar cell, or an organic transistor, two manufacturing methods are used: a dry process and a wet process. Since the dry process is the preparation of the device performed by vacuum deposition, while it is advantageous that it is easy to laminate a plurality of layers, the material use efficiency is not suitable for mass production. In contrast, the wet process is a production process that is highly efficient in material use and suitable for mass production, while the "solvent for dissolving the material of the upper layer without dissolving the lower layer" needs to be selected for each layer in order to laminate the functional layer, and the selection range of the solvent for the upper layer becomes narrower because of its characteristics.

In order to cope with this problem, a method of utilizing a fluorine-containing solvent as disclosed in Patent Document 1 is known. However, since the fluorine-containing solvent has a very strong dipole interaction derived from the high electronegativity of fluorine, there has been a disadvantage that the solvent tends to remain in the film without volatilizing by interacting with the solute. Therefore, there is a problem that the residual solvent lowers the device performance. Among them, when there is a material having Lewis basicity such as a heteroatom in the material, it is known that the residual amount of the fluorine-containing solvent is particularly large, and a technique for reducing the residual amount of the solvent containing the fluorine-containing solvent in the film has been demanded.

PRIOR ART DOCUMENT

Patent Document

Patent Document 1: WO2009/063850

SUMMARY OF THE INVENTION

Problems to be Solved by the Invention

The present invention has been made in view of the above-mentioned problems and situation. An object of the present invention is to provide a composition for an electronic device in which the residual amount of a solvent containing a fluorine-containing solvent in a formed film is reduced, and the influence of the residual solvent on the device is suppressed to exhibit high device performance, and to provide an ink for an electronic device and a method for manufacturing an electronic device in which the composition for an electronic device contains the composition, which have wet process suitability and exhibits high liquid stability and device performance.

Means to Solve the Problems

In order to solve the above problems, the present inventor has found that, in the process of examining the cause of the above problems, an electronic device composition containing a specific π-conjugated boron compound having a relatively low electronegativity and a Lewis acidity that traps a Lewis base, and a fluorine-containing solvent reduces the amount of the remaining solvent containing a fluorine-containing solvent in a formed film, and suppresses the influence of the remaining solvent on the device, thereby obtaining a composition for an electronic device capable of exhibiting high device performance. In addition, the inventors have found that by containing the composition for an electronic device, an ink for an electronic device and a method for manufacturing an electronic device having wet process suitability and capable of exhibiting high liquid stability and device performance is obtained.

That is, the above-mentioned problem according to the present invention is solved by the following means.

1. A composition for an electronic device comprising a component A and a component B, wherein the component A is a fluorine-containing solvent, and the component B is a compound having a structure represented by the following Formula (1).

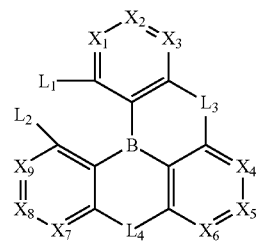

Formula (1)

In Formula (1), $X_1$ to $X_9$ each independently represent —$CW_m$ (where m represents 1 to 9, and representing each of the substituents —$CW_1$ to —$CW_9$ corresponding to any of $X_1$ to $X_9$, respectively) or a nitrogen atom. $W_1$ to $W_9$ each independently represent a hydrogen atom or a substituent. When $L_1$ and $L_2$ are not linked to each other, $L_1$ and $L_2$ each independently represent a hydrogen atom or a substituent $W_{m1}$ (where m represents 1 or 2, and representing a substituent $W_{11}$ or $W_{21}$ corresponding to either $L_1$ or $L_2$, respectively). $L_1$ and $L_2$ may be linked to each other, in which case $L_1$ and $L_2$ are linked to each other via any one atom of oxygen, sulfur, carbon and nitrogen to form a 6-membered ring, provided that the carbon atom represents $CS_1S_2$, and the nitrogen atom represents $NR_1$. $L_3$ and $L_4$ each independently represent an oxygen atom, a sulfur atom, $-CS_{n1}S_{n2}$, or $-NR_{n3}$ (where n represents 3 or 4, and representing the substituents $-CS_{31}S_{32}$, $-NR_{33}$, $-CS_{41}S_{42}$, or $-NR_{43}$ corresponding to either $L_3$ or $L_4$, respectively). $S_1$, $S_2$, $S_{31}$, $S_{32}$, $S_{41}$, $S_{42}$, $R_1$, $R_{33}$, $R_{43}$, $W_{11}$ and $W_{12}$ each independently represent a substituent.

2. The composition for an electronic device according to item 1, further comprising a component C which is a solvent or a solute, wherein a Hansen solubility parameter distance ($Ra_2$) between the component A and the component B is longer than a Hansen solubility parameter distance ($Ra_1$) between all solvents in the composition for an electronic device and all solutes in the composition for an electronic device.
3. The composition for electronic devices according to item 2, wherein $Ra_1$ is 10 or less.
4. The composition for an electronic device according to item 2 or 3, wherein the component C contains an atom having an unshared electron pair.
5. The composition for an electronic device according to any one of items 2 to 4, wherein the component C is an alcohol.
6. The composition for an electronic device according to any one of items 2 to 5, wherein the atom having an unshared electron pair of the component C is a nitrogen atom having an unshared electron pair that does not participate in aromaticity.
7. The composition for an electronic device according to any one of items 1 to 6, wherein any one of $X_1$ to $X_9$, $W_m$, $R_1$, $R_{33}$ and $R_{43}$ of a compound having the structure represented by Formula (1) has one or more fluorine-containing solvent solubilizing groups, and the fluorine-containing solvent solubilizing group is a substituent having a fluorine atom or a nitrogen atom.
8. The composition for an electronic device according to any one of items 1 to 7, being used as a composition for forming an electron transport layer or an electron injection layer of an organic electroluminescent element.
9. An ink for an electronic device, wherein the ink contains the composition for an electronic device according to any one of items 1 to 8.
10. The ink for an electronic device according to item 9, wherein the ink for the electronic device is an inkjet printing ink.
11. A method of manufacturing an electronic device, wherein the ink for an electronic device according to item 10 is discharged from an inkjet head to form a thin film for an electronic device.

Effect of the Invention

According to the above-mentioned means of the present invention, it is possible to provide a composition for an electronic device in which the residual amount of a solvent containing a fluorine-containing solvent in a formed film is reduced and the influence of the residual solvent on the device may be suppressed to exhibit high device performance, and to provide an ink for an electronic device and a method for manufacturing an electronic device in which the composition for an electronic device contains the composition, which have wet process suitability and exhibits high liquid stability and device performance.

The expression mechanism or action mechanism of the effect of the present invention is not clarified, but is inferred as follows.

As described above, when a thin film constituting an electronic device (element) is formed by a wet process using a fluorine-containing solvent, it is known that the residual amount of the solvent containing the fluorine-containing solvent increases due to interaction, and the device performance may deteriorate, particularly when the solute dissolved in the material has Lewis basicity such as a heteroatom.

The present invention provides a composition for electronic devices, which has a π-conjugated boron compound having a relatively low electronegativity and a Lewis acidity that traps a Lewis base, and a fluorine-containing solvent. By this, the residual amount of the solvent containing the fluorine-containing solvent in the formed film is reduced, an electronic device composition capable of exhibiting high device performance by suppressing the influence of the residual solvent on the device is obtained. It is considered that, by incorporating the electronic device composition, it is possible to provide an ink for an electronic device and a method for manufacturing an electronic device that have wet process suitability and exhibits high liquid stability and device performance.

It is known that the π-conjugated boron compound exhibits excellent device performance particularly when applied to a charge transport material of an organic EL element. For example, WO 2017/18326 and WO 2015/102118 have shown that fabrication of electronic devices by dry processes has high electron transport properties derived from π-conjugated boron compounds. However, when the π conjugated boron compound shown in these examples is formed by a dry process, a crystal is formed partially or entirely in the film, resulting in a problem that the device performance will decrease.

As a countermeasure to this problem, it has been known to form a film of a π-conjugated boron compound by a wet process as disclosed in WO 2016/143624 and WO 2016/152418, but there is no example in which the residual amount of a solvent containing fluorine in a film is reduced by actively utilizing Lewis acidity of a π-conjugated boron compound with respect to a fluorine-containing solvent, which is a feature of the present invention.

EMBODIMENTS TO CARRY OUT THE INVENTION

Figure 1:
FIG. 1 is a schematic diagram for forming an electronic device by ejecting via an inkjet head.

The composition for an electronic device of the present invention is a composition for an electronic device containing a component A and a component B, wherein the component A is a fluorine-containing solvent, and the component B is a compound having a structure represented by Formula (1). This feature is a technical feature common to or corresponding to the embodiments described below.

In an embodiment of the present invention, from the viewpoint of the effect expression of the present invention, the composition for an electronic device further contains a component C, which may be a solvent or a solute, and it is preferable that the distance ($Ra_2$) of the Hansen solubility parameter (HSP) between the component A and the component B is longer than the distance ($Ra_1$) of the Hansen solubility parameter (HSP) between all the solvents in the composition for an electronic device and all the solutes in the composition for an electronic device, from the viewpoint of improving the liquid stabilities of the composition for an electronic device.

Further, it is preferable that $Ra_1$ is 10 or less from the viewpoint of further improving the liquid stabilities of the electronic device compositions.

In addition, it is preferable that the component C contains an atom having an unshared electron pair, and it is preferable that the component C is an alcohol or the atom having an unshared electron pair of the component C is a nitrogen atom having an unshared electron pair that does not participate in aromaticity, from the viewpoint of further improving the liquid stability of the composition for an electronic device.

Further, it is preferable that any one of $X_1$ to $X_9$, $W_m$, $R_1$, $R_{33}$ and $R_{43}$ of the compound having the structure represented by Formula (1) has one or more fluorine-containing solvent solubilizing groups, and that the fluorine-containing solvent solubilizing group is a substituent having a fluorine atom or a nitrogen atom, from the viewpoint of improving liquid stability of the composition for electronic devices.

The composition for an electronic device of the present invention is preferably used as a composition for an electron transport layer or an electron injection layer from the viewpoint of improving device performance.

The ink for an electronic device of the present invention contains the composition for an electronic device.

In addition, it is preferable that the ink for electronic device is an ink for inkjet printing from the viewpoint that high productivity of inkjet printing may be utilized.

The method for manufacturing an electronic device of the present invention is characterized in that the ink for an electronic device is ejected from an inkjet head to form a thin film for an electronic device. By using the ink for an electronic device of the present invention, it is possible to suppress the influence of the remaining fluorine-containing solvent on the electronic device by having wet process suitability and lowering the remaining amount of the fluorine-containing solvent in the film, and to exhibit high device performance.

Hereinafter, the present invention and the constitution elements thereof, as well as configurations and embodiments to carry out the present invention will be detailed in the following. In the present description, when two figures are used to indicate a range of value before and after "to", these figures are included in the range as a lowest limit value and an upper limit value.

«Outline of Composition for Electronic Device of the Present Invention»

The composition for an electronic device of the present invention is a composition for an electronic device containing a component A and a component B, characterized in that the component A is a fluorine-containing solvent and the component B is a compound having a structure represented by the following Formula (1), and in more detail, the composition for an electronic device exhibits high device performance because the residual amount of a solvent containing a fluorine-containing solvent in a formed film may be reduced by containing a fluorine-containing solvent as a component A, and a specific π-conjugated boron compound as a component B having a relatively low electronegativity and a Lewis acidity that traps a Lewis base.

The present invention has been found to provide an ink for an electronic device and a method for manufacturing an electronic device which have wet process suitability and exhibits high liquid stability and device performance by applying the composition for an electronic device to an inkjet printing ink.

Therefore, in the composition for an electronic device of the present invention, since the component B, which is a solute, is dissolved in the component A, which is a fluorine-containing solvent, to form a solution, the liquid stability is an important characteristic, and the Hansen solubility parameter (HSP) distance, which is one index representing the liquid stability, will be described first.

<Hansen Solubility Parameter (HSP) Distance>

The Hansen solubility parameter (HSP) distance (hereinafter also referred to as "HSP distance") according to the present invention refers to an index representing the solubility similarity between substances using the Hansen solubility parameter (Hansen Solubility Parameter: HSP; also referred to as "HSP value").

The Hansen solubility parameter represents solubility in a multidimensional (typically three-dimensional) vector, which is represented by a dispersion term, a polarity term, and a hydrogen bond term. The similarity of the vectors is expressed as the distance of the Hansen solubility parameter, and those having similar vectors may be judged to have high solubility with each other.

In the following, the HSP value and the HSP distance will be described in more detail.

(HSP Value)

The Hansen solubility parameter (HSP value) is an index of solubility indicating how much a certain substance (e.g., a dispersoid such as a solute) is dissolved in a certain substance (e.g., a dispersion medium such as a solvent). It is obtained by dividing the solubility parameter (SP value) introduced by Hildebrand into three vectors of a dispersion term (dD), a polarity term (dP), and a hydrogen bond term (dH) and capturing them as a three-dimensional vector.

Substance-specific HSP values are defined in the following Equation (a), and this concept proposed by Hansen is described in "Hiroshi Yamamoto, Steven Abbott, Charles M. Hansen, Chemical Industry, March 2010 issue" published by Chemical Industry Co., Ltd.

$$\text{HSP value} = (dD^2 + dP^2 + dH^2)^{1/2} \qquad \text{Equation (a):}$$

dD: Dispersion term
dP: Polarity term
dH: Hydrogen bond term (HSP Distance)

Next, the Hansen Solubility Parameter (HSP) distance (hereinafter referred to as the HSP distance) is a distance between HSP vectors of arbitrarily different substances such as a solvent and a polymer, and is an index that the smaller the HSP distance, the easier it is to dissolve. The HSP distance is defined in the following Equation (b), and this approach is described in "Hiroshi Yamamoto, Steven Abbott, Charles M. Hansen, Chemical Industry, April 2010 issue" published by Chemical Industry Co., Ltd.

$$\text{HSP distance} = (4 \times (dD_1-dD_2)^2 + (dP_1-dP_2)^2 + (dH_1-dH_2)^2)^{1/2} \quad \text{Equation (b):}$$

$dD_1$: Dispersion term of arbitrary substance 1
$dD_2$: Dispersion term of arbitrary substance 2
$dP_1$: Polarity term of arbitrary substance 1
$dP_2$: Polarity term of arbitrary substance 2
$dH_1$: Hydrogen bond term of arbitrary substance 1
$dH_2$: Hydrogen bond term of arbitrary substance 2

However, when dealing with HSPs of new materials, the value of the hydrogen bond term cannot be calculated by a general calculation method such as, for example, aggregation energy density calculation, and the value of the HSP cannot be obtained. In that case, the HSP parameters may be handled only by the dispersion term and the polarity term. In this case, the HSP distance (Ra) is calculated by using Equation (c) instead of Equation (b).

$$\text{HSP distance} = (4 \times (dD_1-dD_2)^2 + (dP_1-dP_2)^2)^{1/2} \quad \text{Equation (c):}$$

In the present invention, the HSP value and the HSP distance are specifically determined as follows.

The Forcite module of Material Studio ver. 8 was used to calculate the dispersion term and the polarity term for the HSPs of the solvents and solutes. When there are a plurality of solvents, the HSP distance was obtained by multiplying the ratio corresponding to each material according to the volume ratio of the solvents. Specifically, when there are a solvent 1 and a solvent 2, and the volume ratio thereof is $V_1$, $V_2$ as a percentage, the dispersing term and the polar term of the solvent are calculated as in Equation (d). Therefore, when the component C is a solvent, the HSP distance is calculated as shown in Equation (e). Here, the solute component is denoted as solute 3. When the component C is a solute, HSP distances between the solvent and the solute are calculated for the π-conjugated boron material and the component C independently of each other, and the value is used as $Ra_1$ of the solvent and the solute having the larger value, i.e., the solvent having the lower solubility. However, when the component C is a material having an atom with an unshared electron pair, a mixture in which a boron atom and an atom having an unshared electron pair are coordinated is regarded as one solute, and the calculation of the dispersion term and the polarity term is performed. For example, assuming a π-conjugated boron material and triethylamine (TEA) as shown in the following Example reaction formula X1, the dispersion term and the polarity term are not calculated independently, but the dispersion term and the polarity term are calculated by calculating the dispersion term and the polarity term, respectively, by regarding the mixture X1 as a solute, and the HSP and HSP distances are calculated. The HSP distance at this time is expressed by Formula (f) when any fluorine-containing solvent 1 is used.

$$dD_{solvent} = dD_1 \times V_1 + dD_2 \times V_2$$

$$dP_{solvent} = dP_1 \times V_1 + dP_2 \times V_2 \quad \text{Equation (d):}$$

$dD_1$: Dispersion term of arbitrary solvent 1
$dD_2$: Dispersion term of arbitrary solvent 2
$dP_1$: Polarity term of arbitrary solvent 1
$dP_2$: Polarity term of arbitrary solvent 2

$$\text{HSP distance} = (4 \times ((dD_1 \times V_1 + dD_2 \times V_2) - dD_3)^2 + ((dP_1 \times V_1 + dP_2 \times V_2) - dP_3)^2)^{1/2} \quad \text{Equation (e):}$$

$dD_1$: Dispersion term of arbitrary solvent 1
$dD_2$: Dispersion term of arbitrary solvent 2
$dD_3$: Dispersion term of arbitrary solute 3
$dP_1$: Polarity term of arbitrary solvent 1
$dP_2$: Polarity term of arbitrary solvent 2
$dP_3$: Polarity term of arbitrary solute 3

Example Reaction Formula X1

$$\text{HSP distance} = (4 \times (dD_1-dD_{X1})^2 + (dP_1-dP_{X1})^2)^{1/2} \quad \text{Equation (f):}$$

$dD_1$: Dispersion term of arbitrary fluorine-containing solvent 1
$dD_{X1}$: Dispersion term of mixture X1
$dP_1$: Polarity term of arbitrary fluorine-containing solvent 1
$dP_{X1}$: Polarity term of mixture X1

In an embodiment of the present invention, the composition for an electronic device further includes a component C, which may be a solvent or a solute, and it is preferable that the HSP distance ($Ra_2$) of the component A and the component B is long ($Ra_2 > Ra_1$) with respect to the HSP distance ($Ra_1$) of all the solvents in the composition for an electronic device and all the solutes in the composition for an electronic device, from the viewpoint of liquid stabilization. Further, it is preferable that $Ra_1$ is 10 or less.

It is preferable that the composition for an electronic device containing a π-conjugated boron compound and a fluorine-containing solvent according to the present invention has high liquid stability as described above when it is used in a wet process as an ink for an electronic device.

As a means for improving the liquid stability, a means for mixing a third component other than the component A and the component B (component C according to the present invention) within a range that does not affect the residual amount of the fluorine-containing solvent in the film is considered. The third component to be mixed here may be either a solvent or a solute, and may be evaluated from the HSP distance (Ra) between the solvent and the solute. Since the liquid stability of the composition for an electronic device is improved as the HSP distance becomes shorter, the composition for an electronic device having high liquid stability may be provided by making the HSP distance of all the solvents and all the solutes in the composition for an electronic device shorter than the HSP distance of only the fluorine-containing solvent and only the π-conjugated boron compound. Especially, in consideration of a period until the composition for an electronic device is substantially produced as an ink and ejected as an ink, it is desirable that the HSP distance is 10 or less, and among them, the one containing an alcohol solvent is excellent in liquid stability.

Another means of improving liquid stability is to mix a third component with an unshared electron pair. In this method, the third component is coordinated to the vacant orbital of the boron site, and the polarity of the π-conjugated boron compound may be changed to further improve the liquid stability to the fluorine-containing solvent. The third component may be desorbed by heating after film formation by a wet process, and in this case, since the third component may be removed from the film, the fluorine-containing solvent does not adversely affect the remaining in the film. When the third component is a material remaining in the film, there is a concern that interaction with the fluorine-containing solvent may occur, but since the Lewis acidity of the π-conjugated boron compound traps the third component, the amount of solvent remaining in the film containing the fluorine-containing solvent decreases. It is more preferable that the atom having the unshared electron pair is a nitrogen atom.

As yet another means, there is also a means for giving a liquid stabilizing group to the structure of the π-conjugated boron compound itself. In view of the above-mentioned means, it is preferable that the solubilizing group is a substituent having a fluorine group or a functional group capable of coordination bonding to boron of a π-conjugated boron compound in order to enhance the affinity with the solvent. In this case, coordination bonds occur between π-conjugated boron compounds or within molecules. However, as described above, even if the functional group has a nucleophilic property having a Lewis basicity, it is inferred that the residual amount of the solvent in the film containing the fluorine-containing solvent decreases due to the Lewis acidity of the π-conjugated boron compound.

In any case, the index of the liquid stability may be judged by the HSP distance, which contributes to the construction of an appropriate material.

<Configuration of the Present Invention>

(1) Component A

The component A according to the present invention is a solvent containing a fluorine compound, which is referred to as a fluorine-containing solvent in the present invention.

The fluorine-containing solvent functions as a liquid, that is, a solvent under normal temperature and pressure. When it is a liquid, the solute (for example, the component B according to the present invention) may be uniformly distributed when a film is formed.

Examples thereof include fluorine-containing hydrocarbons, fluorine-containing alcohols, fluorine-containing aromatic compounds, fluorine-containing ethers, fluorine-containing ketones, fluorine-containing esters, fluorine-containing amides, and fluorine-containing carboxylic acids.

Among these, in the present invention, it is preferable to use a fluorine-containing alcohol from the viewpoint of obtaining an element of high light emission efficiency driven with low voltage.

As one of preferable fluorine-containing alcohols, the compounds represented by the following Formula (a), Formula (b), or Formula (c) may be cited.

$$A\text{-}CH_2OH \qquad \text{Formula (a):}$$

In Formula (a), A represents $CF_3$ or $CHF_2(CF_2)_n$, where n is an integer of 1 to 5. More preferably, n is an integer of 1 to 3, more preferably n is 1. Specific examples of the fluorine-containing alcohol include, for example, the following compounds.

Formula (b)

$$H-\underset{\underset{B}{|}}{\overset{\overset{A}{|}}{C}}-OH$$

Formula (c)

$$D-\underset{\underset{B}{|}}{\overset{\overset{A}{|}}{C}}-OH$$

In Formulas (b) and (c), A, B, and D each independently represent $CH_{3-x}F_x$ or $CH_{3-x}F_x(CH_{2-y}F_y)_n$, where x represents 1 to 3, y represents 1 to 2, and n represents 0 to 1.

Specific examples of these fluoroalcohols include the following compounds:

2,2,3,3-Tetrafluoropropanol,
2,2,3,3,3-Pentafluoropropanol,
2-Triforomethyl-2-propanol,
2,2,3,3,4,4-Hexafluorobutanol,
2,2,3,3,4,4,5,5-Octafluoropentanol,
1,1,1,3,3,3-Hexafluoro-2-propanol,
2,2,2-Trifluoro-1-ethanol,
2,3-Difluorobenzyl alcohol,
2,2,2-Trifluoroethanol,
1,3-Difluoro-2-propanol,
1,1,1-Trifluoro-2-propanol,
3,3,3-Trifluoro-1-propanol,
2,2,3,3,4,4,4-Heptafluoro-1-butanol,
2,2,3,3,4,4,5,5-Octafluoro-1-pentanol,
3,3,4,4,5,5,5-Heptafluoro-2-pentanol,
2,2,3,3,4,4,5,5,6,6,7,7,8,8-Ppentadecafluoro-1-octanol,
3,3,4,4,5,5,6,6,7,7,8,8,8-Tridecafluoro-1-octanol,
1H,1H,9H-Perfluoro-1-nonanol,
1H,1H,2H,3H,3H-Perfluorononane-1,2-diol,
1H,1H,2H,2H-Perfluoro-1-decanol,
1H,1H,2H,3H,3H-Perfluoroundecan-1,2-diol.

Fluorine containing propanol is further preferred, and 2,2,3,3-tetrafluoro-2-propanol, 1,1,1,3,3,3-hexafluoro-2-propanol, or 2,2,3,3,3-pentafluoropropanol is further preferred.

These fluorine-containing solvents used in the present invention are preferably distilled.

(2) Component B (2.1)

The component B according to the present invention is a π-conjugated boron compound having a structure represented by the following Formula (1).

Formula (1)

In Formula (1), $X_1$ to $X_9$ each independently represent $-CW_m$ (where m represents 1 to 9, and representing each of the substituents $-CW_1$ to $-CW_9$ corresponding to any of $X_1$ to $X_9$, respectively) or a nitrogen atom. $W_1$ to $W_9$ each independently represent a hydrogen atom or a substituent. When $L_1$ and $L_2$ are not linked to each other, $L_1$ and $L_2$ each independently represent a hydrogen atom or a substituent $W_{m1}$ (where m represents 1 or 2, and representing a substituent $W_{11}$ or $W_{21}$ corresponding to either $L_1$ or $L_2$, respectively). $L_1$ and $L_2$ may be linked to each other, in which case $L_1$ and $L_2$ are linked to each other via any one atom of oxygen, sulfur, carbon and nitrogen to form a 6-membered ring, provided that the carbon atom represents $CS_1S_2$, and the nitrogen atom represents $NR_1$. $L_3$ and $L_4$ each independently represent an oxygen atom, a sulfur atom, $-CS_{n1}S_{n2}$, or $-NR_{n3}$ (where n represents 3 or 4, and representing the substituents $-CS_{31}S_{32}$, $-NR_{33}$, $-CS_{41}S_{42}$, or $-NR_{43}$ corresponding to either $L_3$ or $L_4$, respectively). $S_1$, $S_2$, $S_{31}$, $S_{32}$, $S_{41}$, $S_{42}$, $R_1$, $R_{33}$, $R_{43}$, $W_1$ and $W_{12}$ each independently represent a substituent.

In Formula (1), $X_1$ to $X_9$ is each independently represent $-CW_m$ (where m represents 1 to 9, and representing a substituent $-CW_1$ to $-CW_9$ corresponding to any of $X_1$ to $X_9$, respectively) or a nitrogen atom, $W_1$ to $W_9$ each independently represent a hydrogen atom or a substituent, but at least one of $X_1$ to $X_9$ is preferably $-CW_m$, more preferably 3 to 6 of $X_1$ to $X_9$, and even more preferably all of $X_1$ to $X_9$ is $-CW_m$. A large number of $CW_m$ is preferable because it improves thermodynamic stabilities.

Further, $L_1$ and $L_2$ independently represent a hydrogen atom or a substituent $W_{m1}$ (where m represents 1 or 2, and representing substitution $W_{11}$ or $W_{21}$ corresponding to either $L_1$ and $L_2$, respectively).

The substituents represented by $W_1$ to $W_9$, $W_{11}$ and $W_{21}$ include, but are not limited to, an alkyl group, an alkoxy group, an amino groups, an aromatic ring group, and an aromatic heterocyclic group. Note that these substituents include the case where a part of the structure has another substituent.

The alkyl groups represented by $W_1$ to $W_9$, $W_{11}$ and $W_{21}$ may be a straight-chain, branched, or cyclic structure. Examples thereof are: a straight, branched or cyclic alkyl group having 1 to 20 carbon atoms. Specific examples are: a methyl group, an ethyl group, an n-propyl group, an isopropyl group, an n-buty group, an s-butyl group, a t-butyl group, an n-pentyl group, a neopentyl group, an n-hexyl group, a cyclohexyl group, a 2-ethylhexyl group, an n-heptyl group, an n-octyl group, a 2-hexyloctyl group, an n-nonyl group, an n-decyl group, an n-undecyl group, an n-decyl group, an n-tridecyl group, an n-tetradecyl group, an n-pentadecyl group, an n-hexadecyl group, an n-heptadecyl group, an n-octadecyl group, an n-nonadecyl group, and an n-icosyl group. More preferable examples are: a methyl group, an ethyl group, an isopropyl group, a π-butyl group, a cyclohexyl group, a 2-ethylhexyl group, and 2-hexyloctyl group. These alkyl groups may further have a halogen atom, an aromatic hydrocarbon ring group described later, an aromatic heterocyclic group described later, and an amino group described later.

The alkoxy groups represented by $W_1$ to $W_9$, $W_{11}$ and $W_{21}$ may be a straight-chain, branched, or cyclic structure. Examples of the alkoxy group include linear, branched, or ring alkoxy groups having 1 to 20 carbon atoms. Specific examples thereof are: a methoxy group, an ethoxy group, an n-propoxy group, an isopropoxy group, an n-butoxy group, an isobutoxy group, a t-butoxy group, an n-pentyloxy group, a neopentyloxy group, an n-hexyloxy group, a cyclohexyloxy group, an n-heptyloxy group, an n-octyloxy group, a 2-ethylhexyloxy group, a nonyloxy group, a decyloxy group, a 3,7-dimethyloctyloxy group, an n-undecyloxy group, an n-dodecyloxy group, an n-tridecyloxy group, an n-tetradecyloxy group, a 2-n-hexyl-n-octyloxy group, an n-pentadecyloxy group, an n-hexadecyloxy group, an n-heptadecyloxy group, an n-octadecyloxy group, an n-nonadecyloxy group, and an n-icosyloxy group. Among these, a methoxy group, an ethoxy group, an isopropoxy group, a π-butoxy group, a cyclohexyloxy group, a 2-ethylhexyloxy group, and a 2-hexyloctyloxy group are preferred. Examples of the substituent of these alkoxy groups include a halogen atom, an aromatic hydrocarbon ring group described later, an aromatic heterocyclic group described later, an amino group described later.

Examples of an aromatic hydrocarbon ring group represented by $W_1$ to $W_9$, $W_{11}$ and $W_{21}$ are: a benzene ring, an indene ring, a naphthalene ring, an azulene ring, a fluorene ring, a phenanthrene ring, an anthracene ring, an acenaphthylene ring, a biphenylene ring, a chrysene ring, a naphthacene ring, a pyrene ring, a pentalene ring, an aceanthrylene ring, a heptalene ring, a triphenylene ring, an as-indacene ring, a chrysene ring, an s-indacene ring, a pleiadene ring, a phenalene ring, a fluoranthene ring, a perylene ring, and an acephenanthrylene ring, a biphenyl ring a terphenyl ring, and a tetraphenyl ring. These aromatic hydrocarbon ring groups may further have a halogen atom, the above-described alkyl group, the above-described alkoxy group, an aromatic heterocyclic group described later, and an amino group described later.

Examples of an aromatic heterocyclic group represented by $W_1$ to $W_9$, $W_{11}$ and $W_{21}$ are: a carbazole ring, an indoloindole ring, a 9,10-dihydroacridine ring, a phenoxazine ring, a phenothiazine ring, a dibenzothiophene ring, a benzofurylindole ring, a benzothienoindole ring, an indolocarbazole ring, a benzofurylcarbazole ring, a benzothienocarbazole ring, a benzothienobenzothiophene ring, a benzocarbazole ring, a dibenzocarbazole ring, a dibenzofuran ring, a benzofurylbenzofuran ring, and a dibenzosylol ring. These aromatic heterocyclic groups may further have a halogen atom, the above-described alkyl group, the above-described alkoxy group described, the above-described aromatic hydrocarbon ring group, and an amino group described later Examples of the substituent of the amino group represented by $W_1$ to $W_9$, W11 and W21 include a halogen atom, the above-described alkyl group, the above-described aromatic hydrocarbon ring group, and the above-described aromatic heterocyclic group.

In Formula (1), $L_1$ and $L_2$ may be bonded to each other, and in this case, they are bonded to each other via anyone atom of oxygen, sulfur, carbon, and nitrogen to form a six-membered ring. Itis $CS_1S_2$ for carbon and $NR_1$ for nitrogen. $L_3$ and $L_4$ each independently represent an oxygen atom, a sulfur atom, $-CS_{n1}S_{n2}$ or $-NR_n$ (where n represents 3 or 4, and each is a substitution group $-CS_{31}S_{32}$, $-NR_{33}$, $-CS_{41}S_{42}$ or $-NR_{43}$ corresponding to either $L_3$ or $L_4$, respectively).

In the above structure represented by $NR_1$, $NR_{33}$, and $NR_{43}$, $R_1$, $R_{33}$, and $R_{43}$ independently represents either a hydrogen atom, a chained alkyl group, a cycloalkyl group, an aromatic hydrocarbon ring group or an aromatic heterocyclic group. The chained alkyl group and the cycloalkyl group represented by $R_1$, $R_{33}$, and $R_{43}$ include a chained alkyl group and a cycloalkyl group among the alkyl groups represented by $W_1$ to $W_9$, $W_{11}$, and $W_{21}$. The aromatic hydrocarbon ring group and the aromatic heterocyclic group include identical aromatic hydrocarbon ring group and the aromatic heterocyclic group represented by $W_1$ to $W_9$, $W_{11}$, and $W_{21}$ described above.

The substituents represented by $S_1$, $S_2$, $S_{31}$, $S_{32}$, $S_{41}$, and $S_{42}$ are a chained alkyl group, a cycloalkyl group, an aromatic hydrocarbon ring group or an aromatic heterocyclic group. The chained alkyl group and the cycloalkyl group represented by $S_1$, $S_2$, $S_{31}$, $S_{32}$, $S_{41}$, and $S_{42}$ include a chained alkyl group and a cycloalkyl group among the alkyl groups represented by $W_1$ to $W_9$, $W_{11}$, and $W_{21}$. The aromatic hydrocarbon ring group and the aromatic heterocyclic group include identical aromatic hydrocarbon ring group and the aromatic heterocyclic group represented by $W_1$ to $W_9$, $W_{11}$, and $W_2$ described above.

The π-conjugated boron compound having the structure represented by Formula (1) is preferably a π-conjugated boron compound having the structure represented by the following Formula (2).

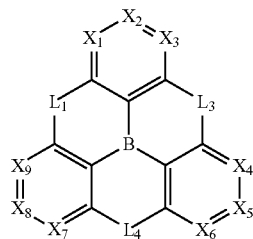

Formula (2)

In Formula (2), $X_1$ to $X_9$ each independently represent —$CW_m$ (where m represents 1 to 9, and representing each of the substituents —$CW_1$ to —$CW_9$ corresponding to any of $X_1$ to $X_9$) or a nitrogen atom. $W_1$ to $W_9$ each independently represent a hydrogen atom or a substituent. $L_1$, $L_3$, and $L_4$ each independently represent an oxygen atom, a sulfur atom, or —$NR_n$ (where n represents 1, 3, or 4, and representing each of the substituents —$NR_1$, —$NR_3$, and —$NR_4$ corresponding to any of $L_1$, $L_3$, and $L_4$). $R_1$, $R_3$ and $R_4$ each independent represent a substituent. The substituent is preferably a substituent such as an alkyl group, an alkoxy group, an amino group, an aromatic ring group, or an aromatic heterocyclic group, which is mentioned in the description of Formula (1).

Further, the compound having the structure represented by Formula (2) is preferably a compound having the structure represented by the following Formula (3).

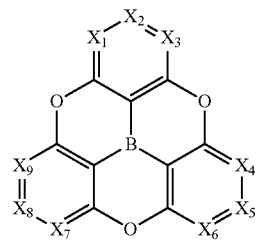

Formula (3)

In Formula (3), $X_1$ to $X_9$ each independently represent —$CW_m$ (where m represents 1 to 9, and representing each of the substituents —$CW_1$ to —$CW_9$ corresponding to any of $X_1$ to $X_9$), and $W_1$ to $W_9$ each independently represent a hydrogen atom or a substituent. The substituent is preferably a substituent such as an alkyl group, an alkoxy group, an amino group, an aromatic ring group, or an aromatic heterocyclic group, which is mentioned in the description of Formula (1).

The π-conjugated boron compound used in the present invention may have only one structure represented by Formula (1) or two or more structures per molecule. When two or more structures represented by Formula (1) are included, they may be the same or different from each other.

Preferred specific examples of the π-conjugated boron compound according to the present invention are given below, but these compounds may further have a substituent, may be structural isomers thereof, and the present invention is not limited to the following description.

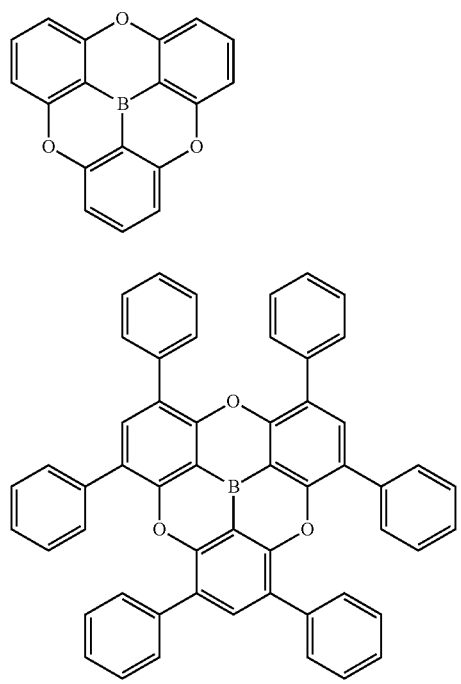

-continued
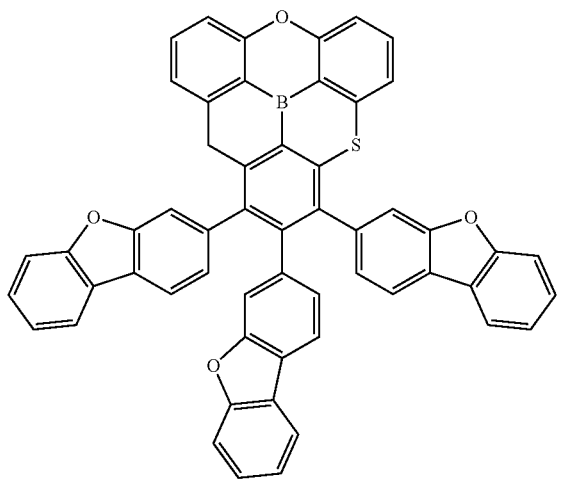
A5
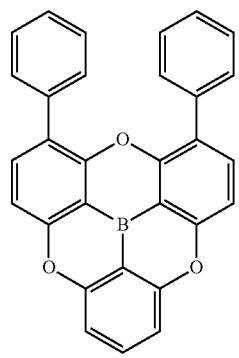
A6
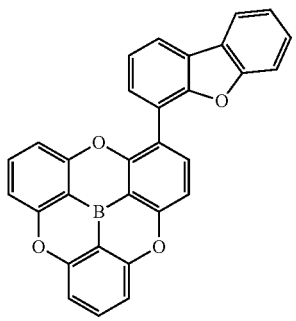
A7
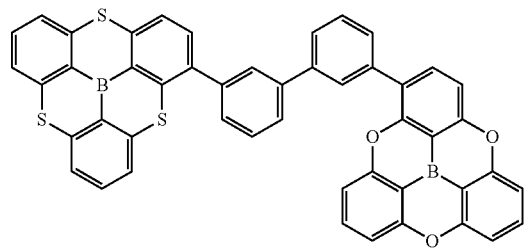
A8
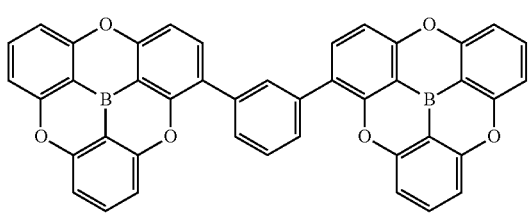
A9
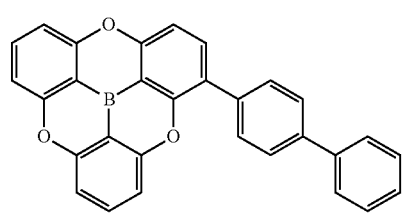
A10
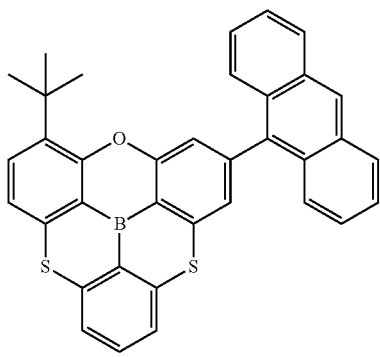
A11
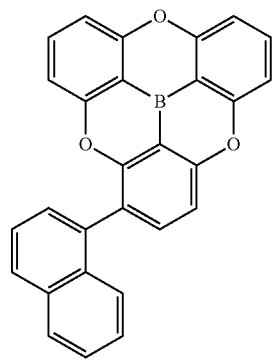
A12

-continued
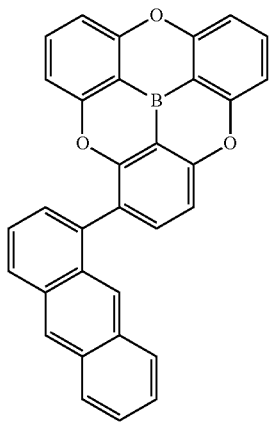
A13
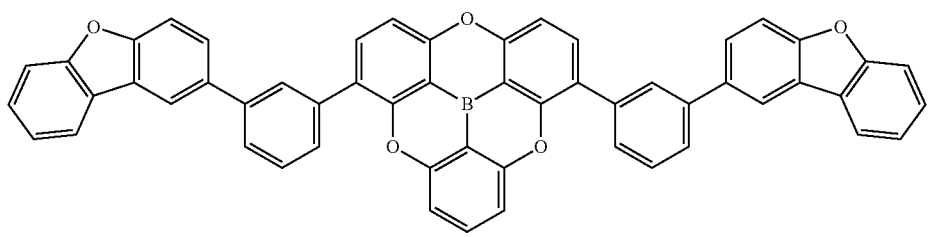
A14
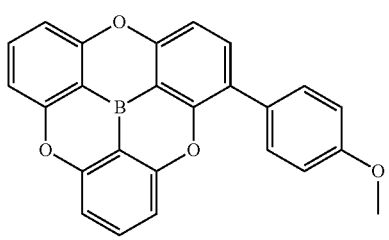
A15
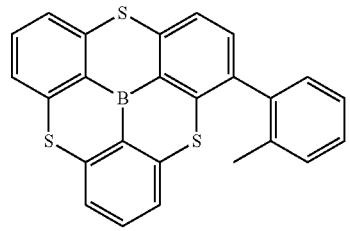
A16
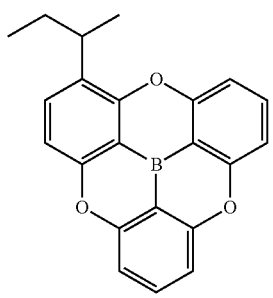
A17
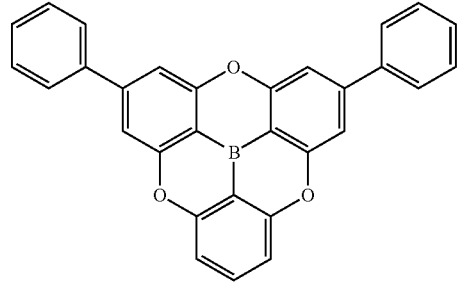
A18
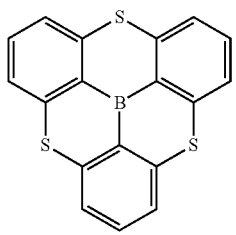
A19
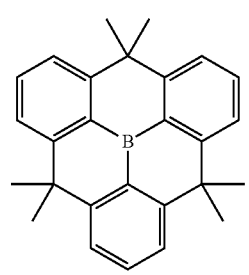
A20

-continued
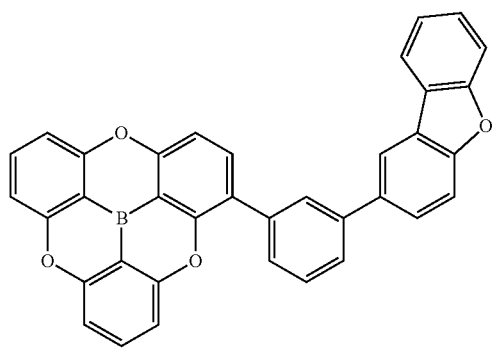
A21
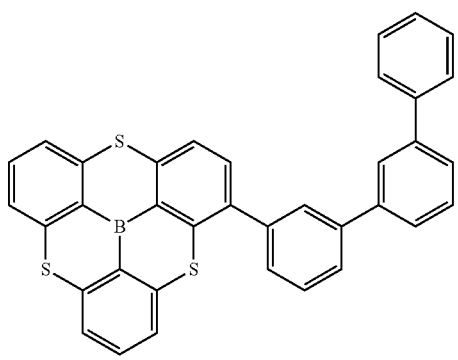
A22
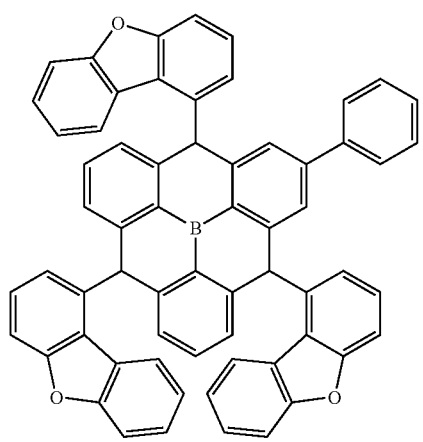
A23
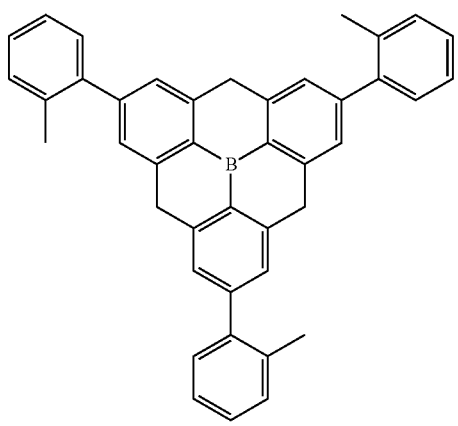
A24
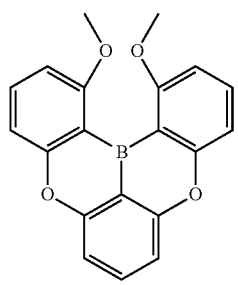
A25
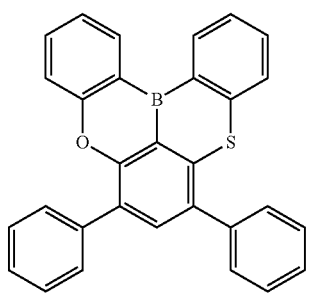
A26
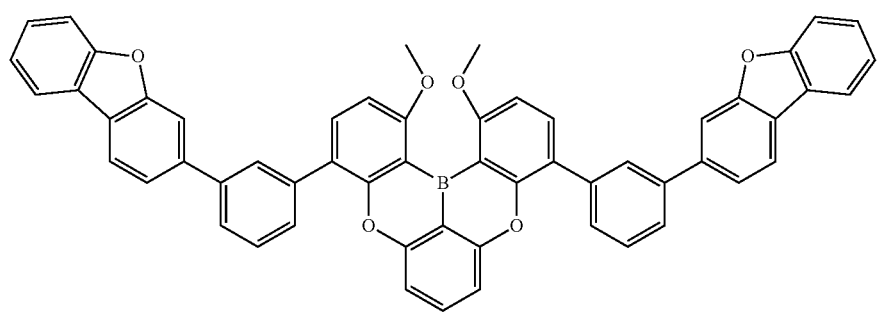
A27

-continued
A28 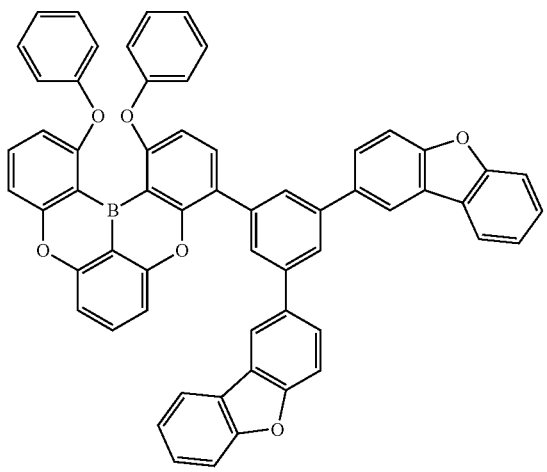
A29 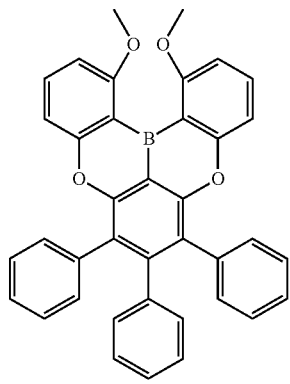
A30 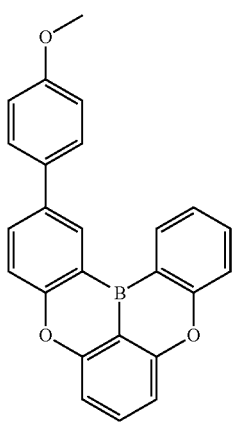
A31 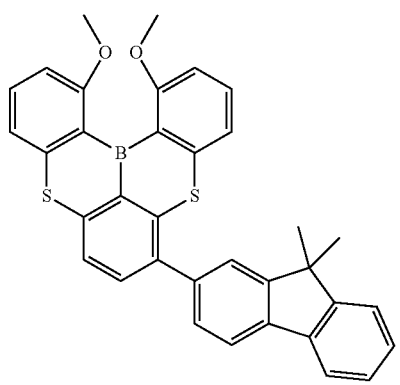
A32 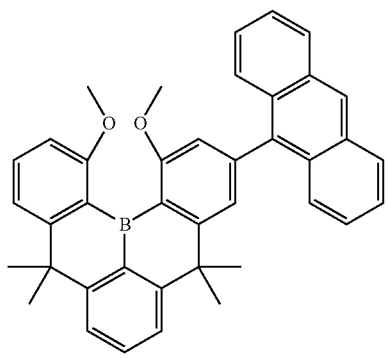
A33 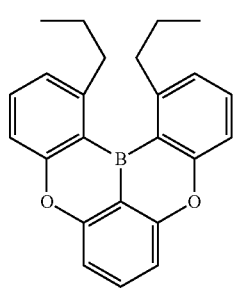

-continued
A34 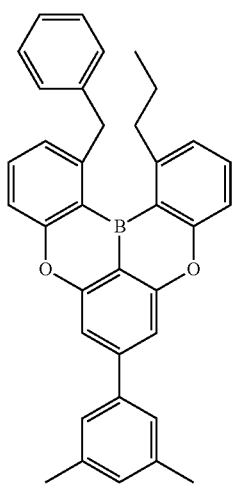 A35 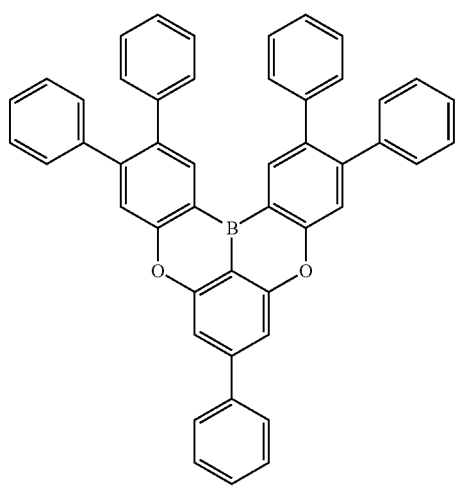
A36 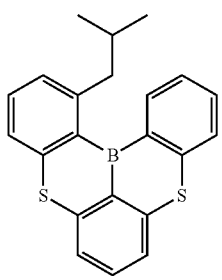 A37 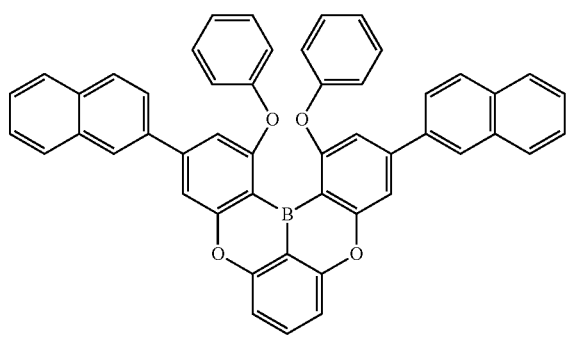
A38 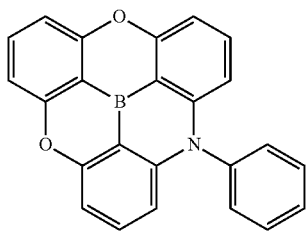 A39 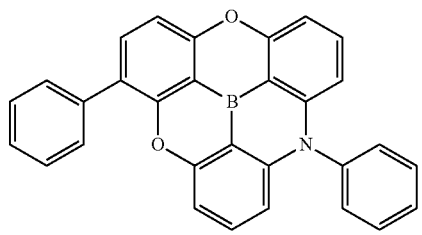
A40 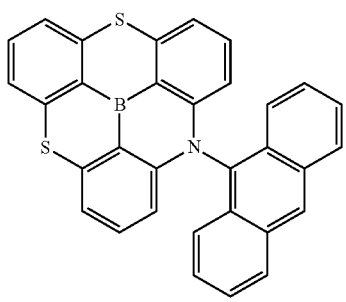 A41 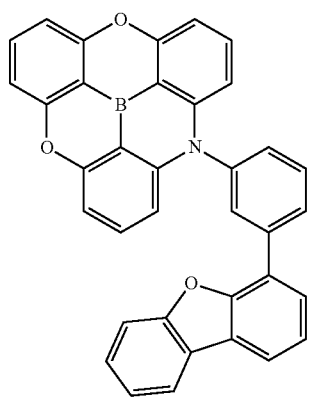

-continued
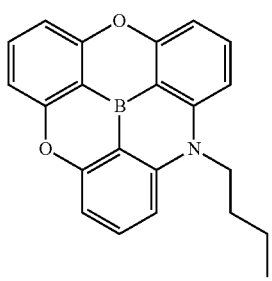
A42
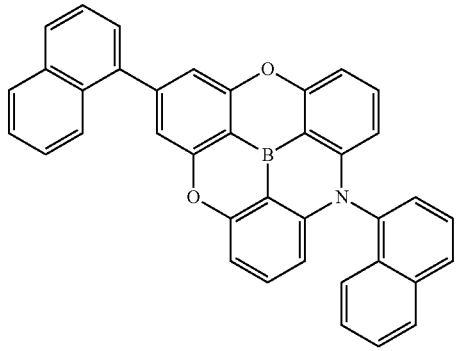
A43
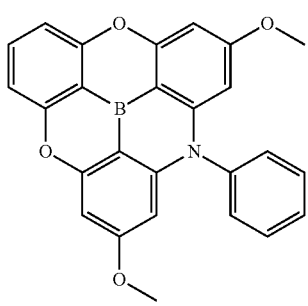
A44
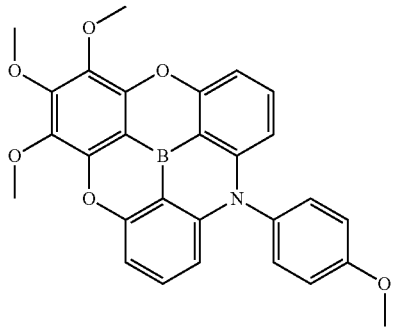
A45
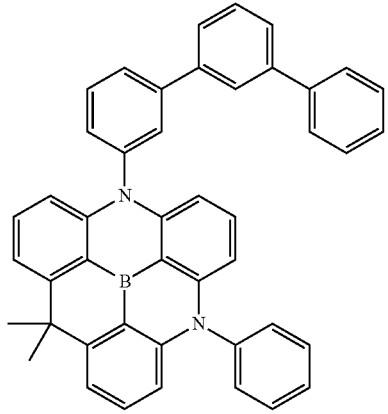
A46
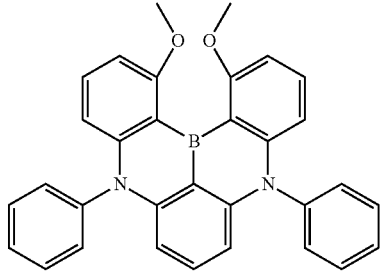
A47
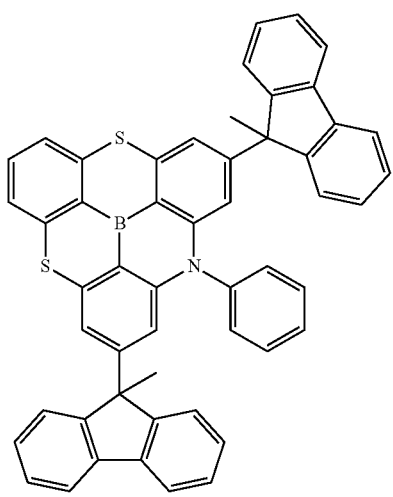
A48
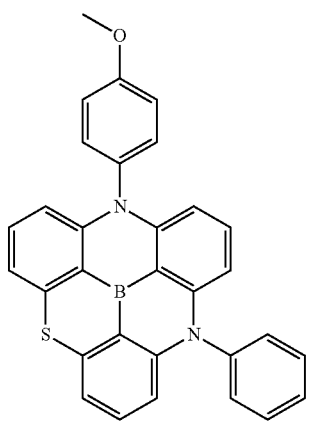
A49

-continued
A50
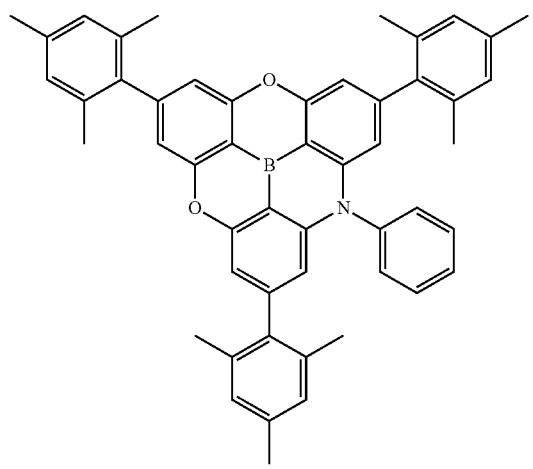
A51
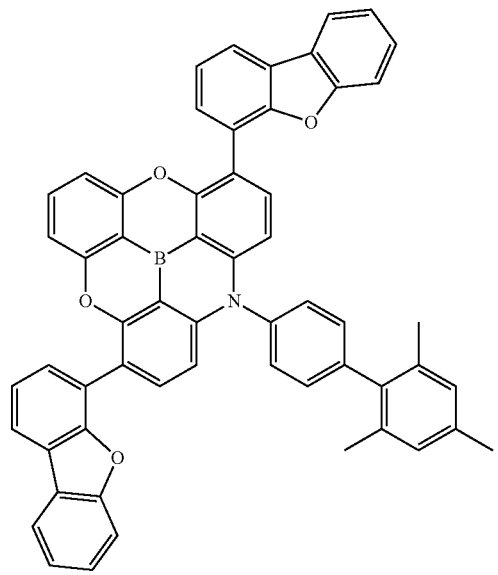
A52
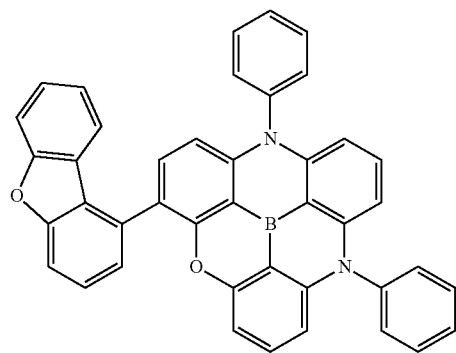
A53
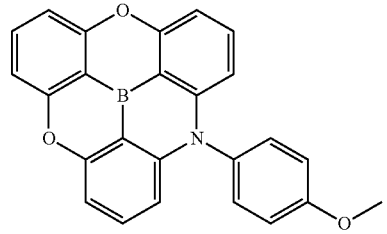
A54
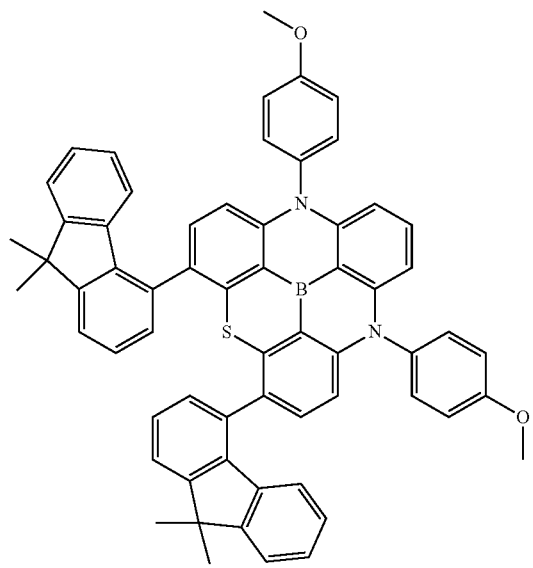
A55
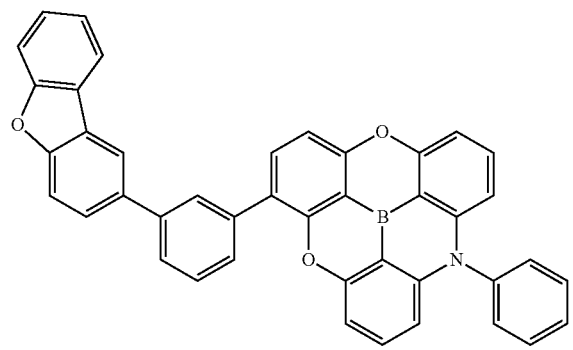

-continued
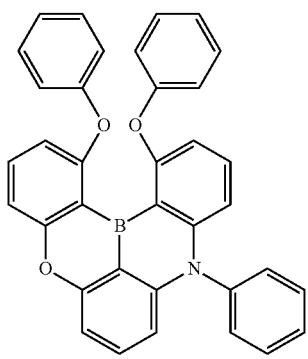
A56
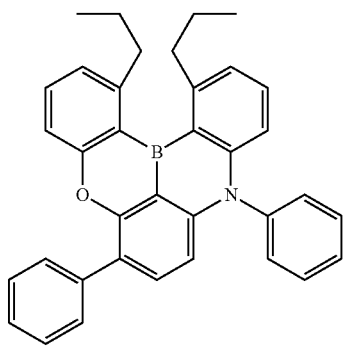
A57
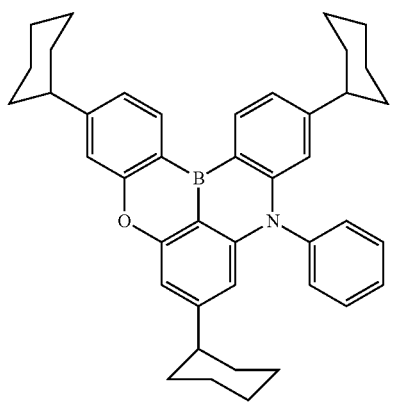
A58
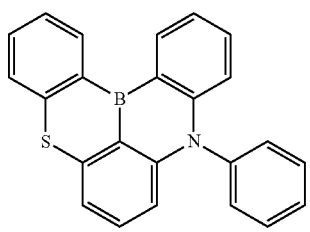
A59
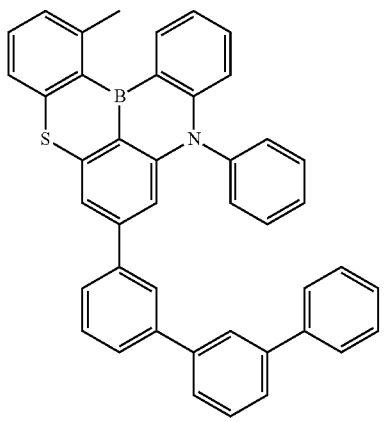
A60
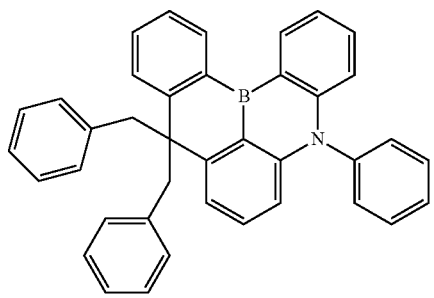
A61
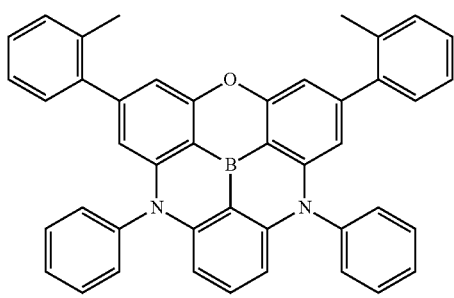
A62
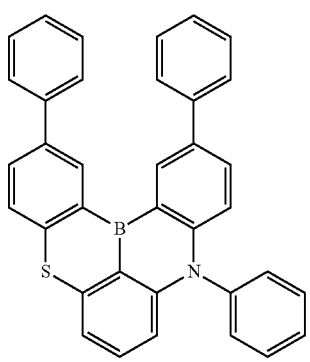
A63

-continued
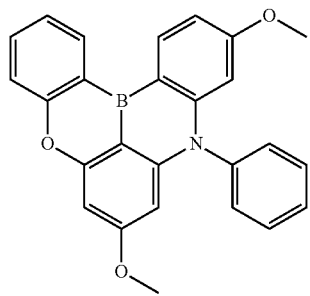 A64
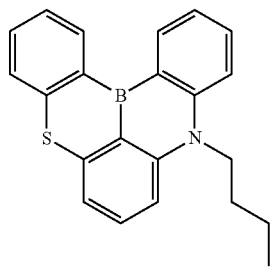 A65
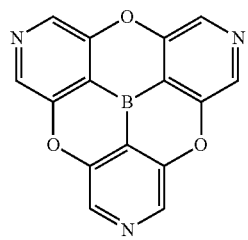 A66
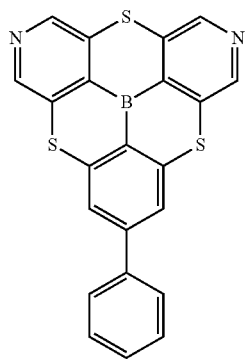 A67
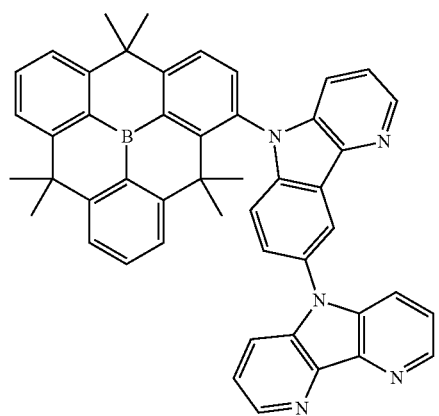 A68
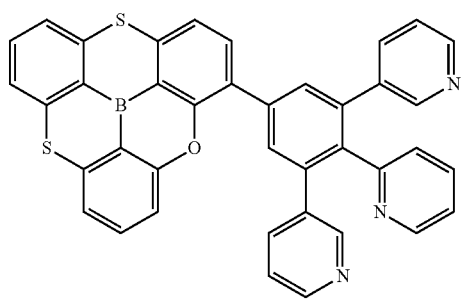 A69
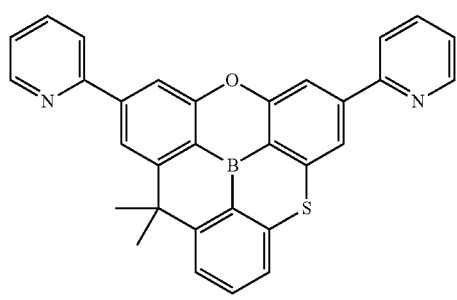 A70
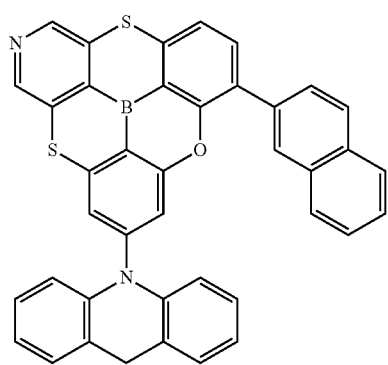 A71

-continued
A72 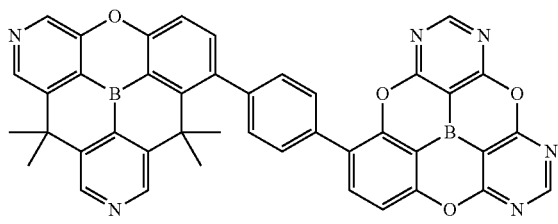 A73 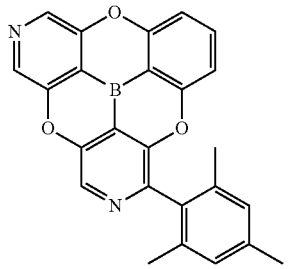
A74 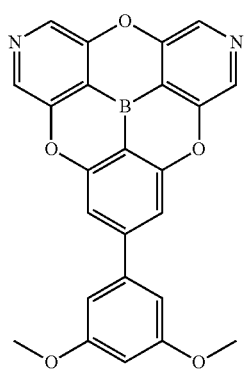 A75 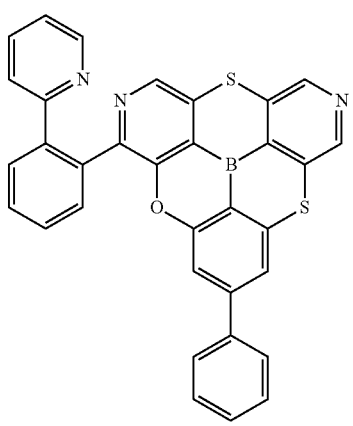
A76 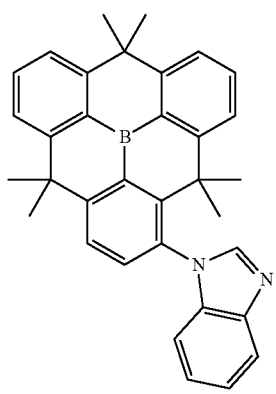 A77 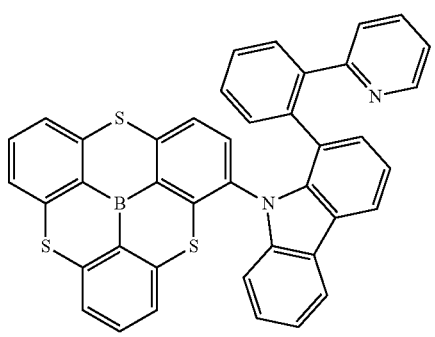
A78 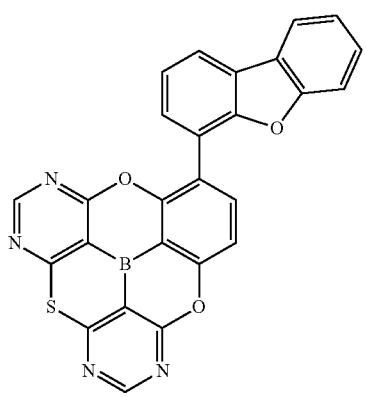 A79 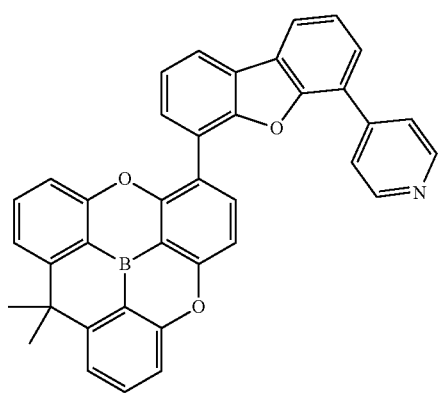

-continued
A80 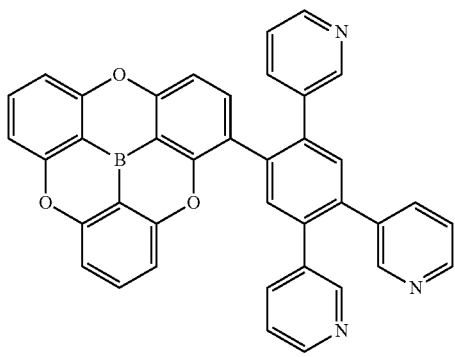
A81 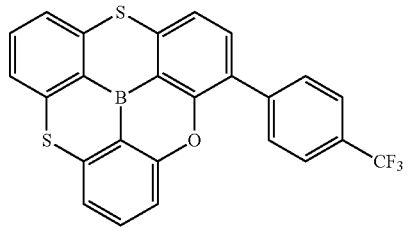
A82 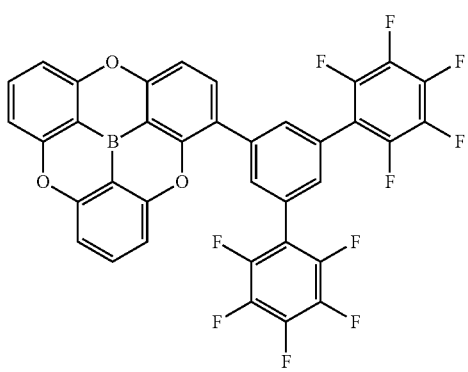
A83 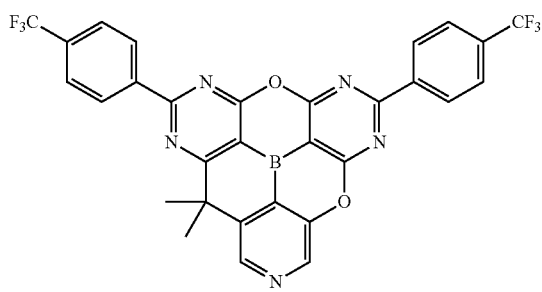
A84 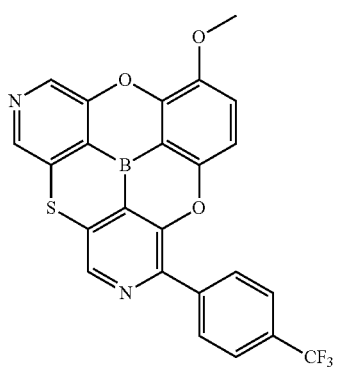
A85 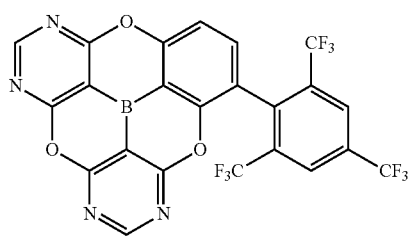
A86 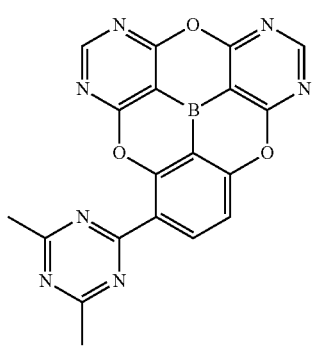
A87 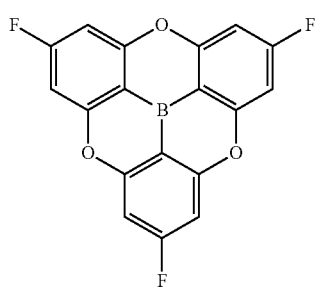

-continued
| | |
|---|---|
| A88 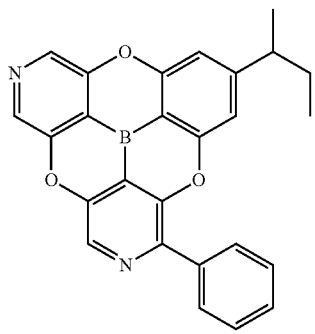 | A89 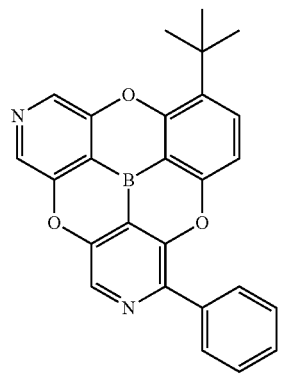 |
| A90 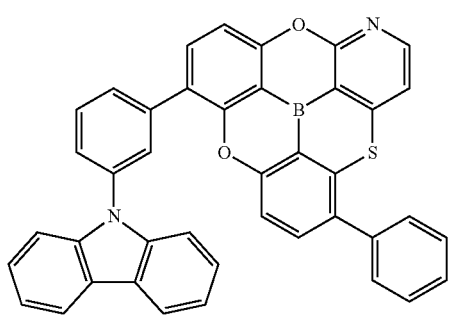 | A91 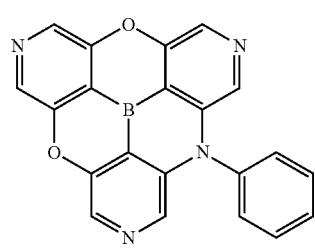 |
| A92 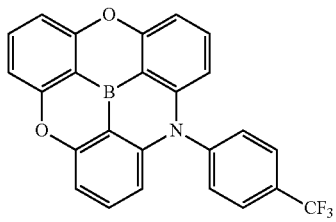 | A93 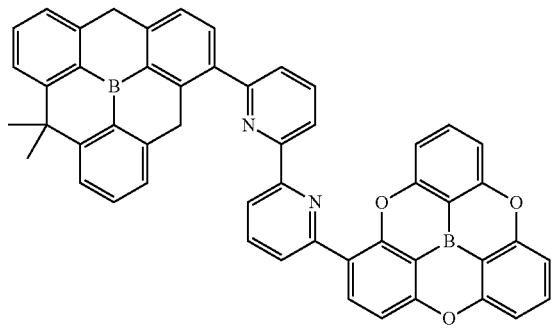 |
| A94 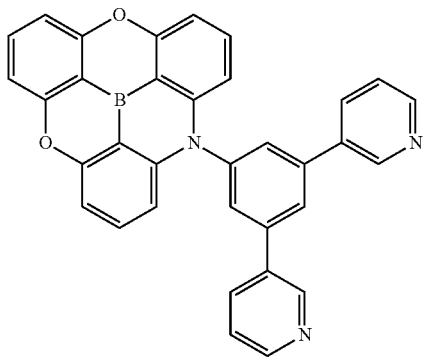 | A95 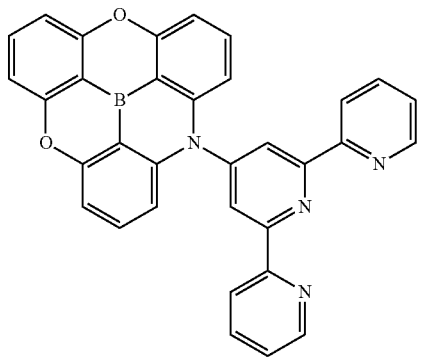 |

-continued
A96
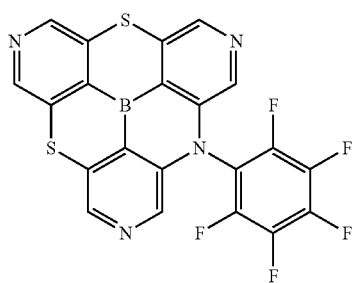
A97
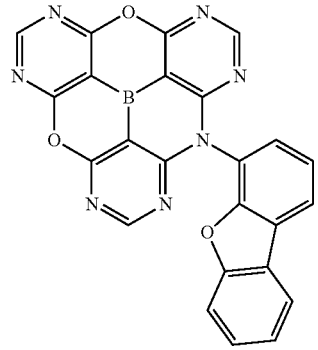
A98
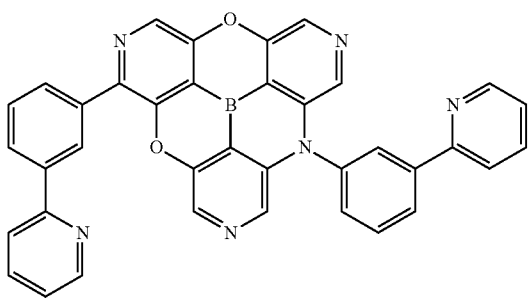
A99
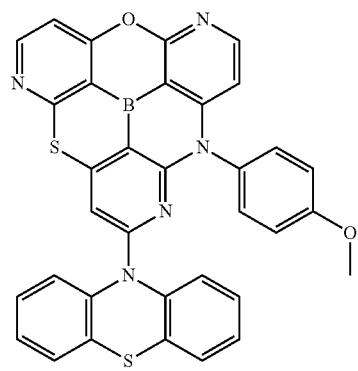
A100
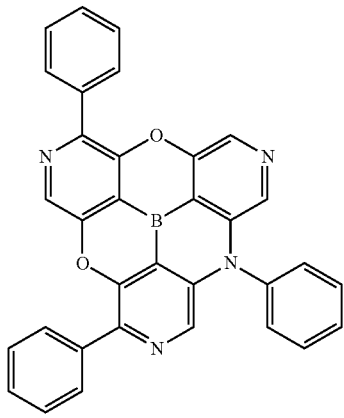
A101
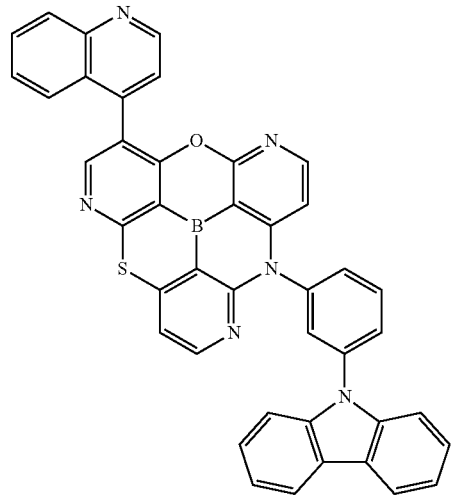
A102
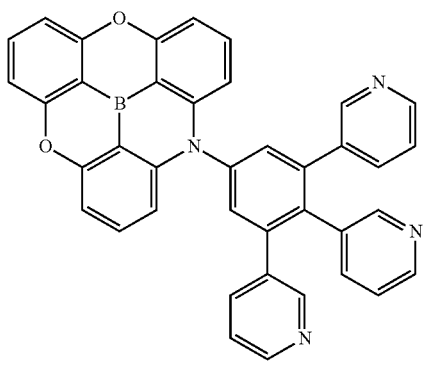
A103
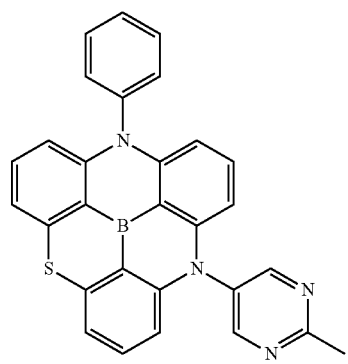

-continued
A104
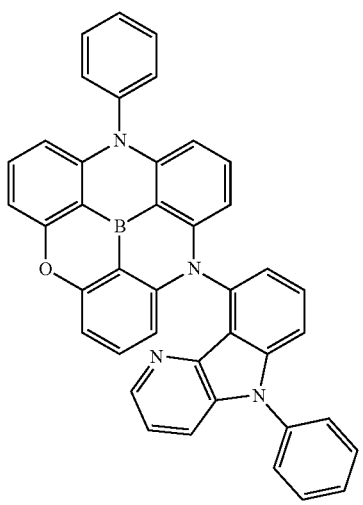
A105
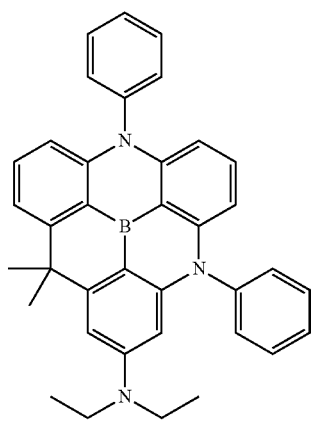
A106
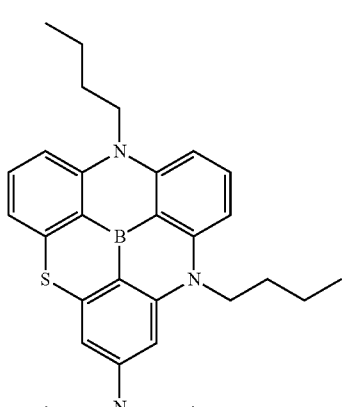
A107
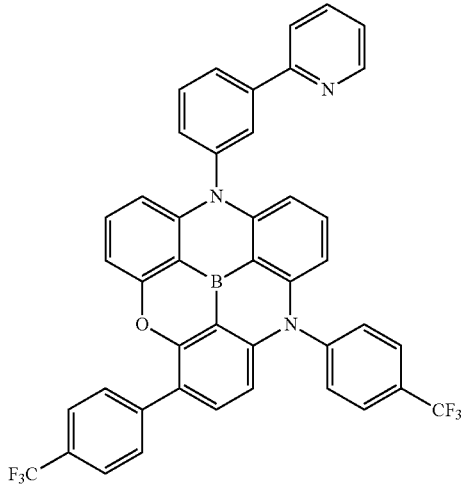
A108
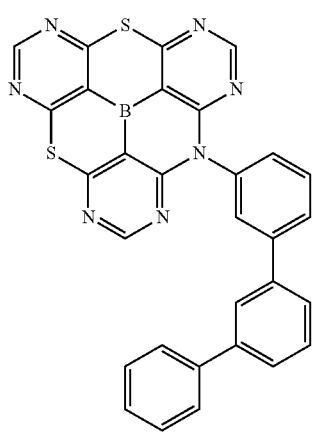
A109
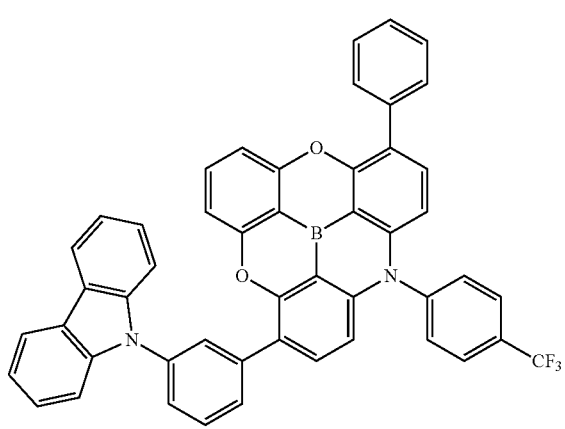

A110 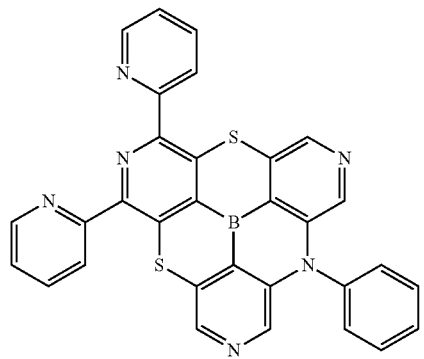
A111 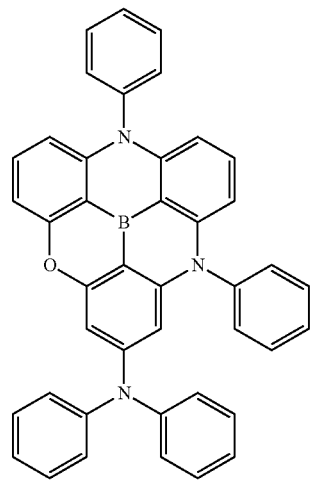
A112 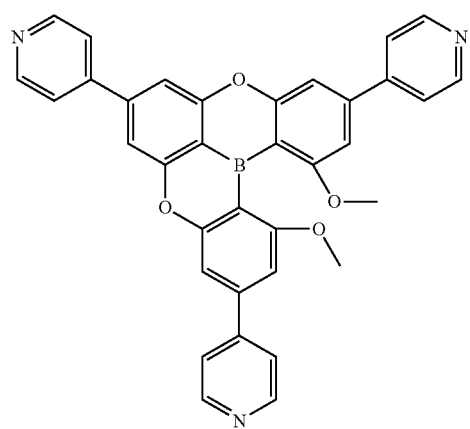
A113 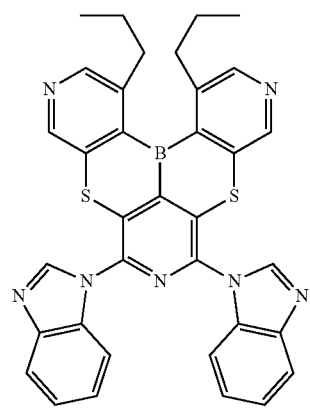
A114 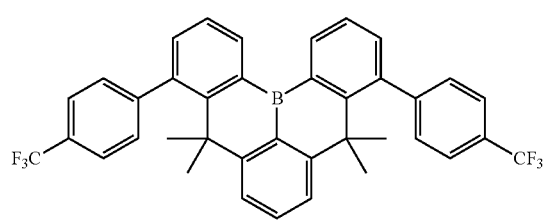
A115 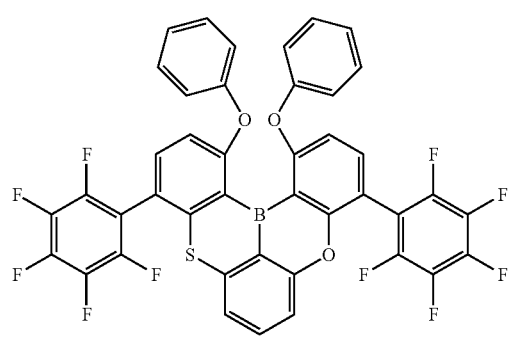

-continued
A116
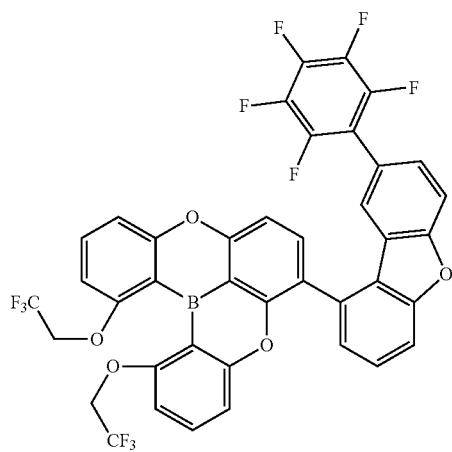
A117
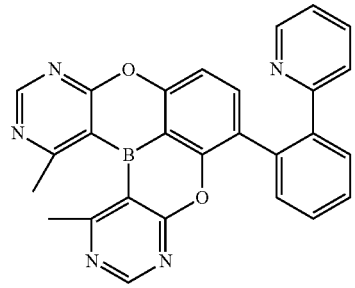
A118
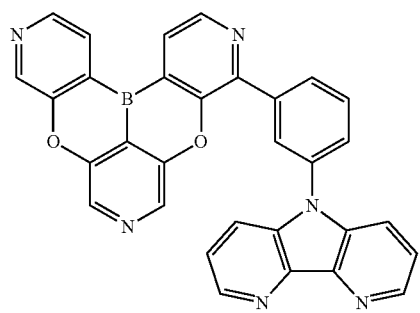
A119
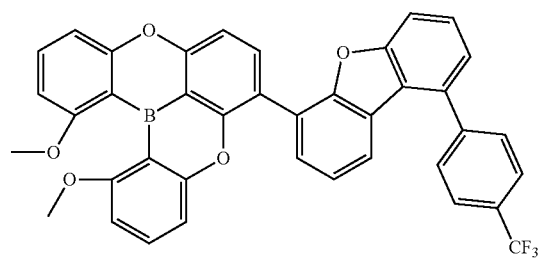
A120
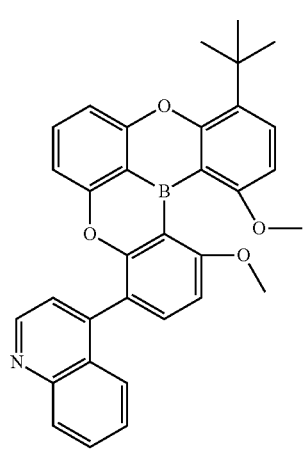
A121
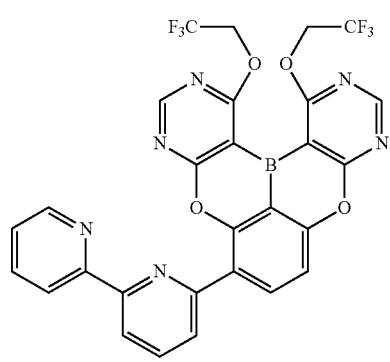

-continued
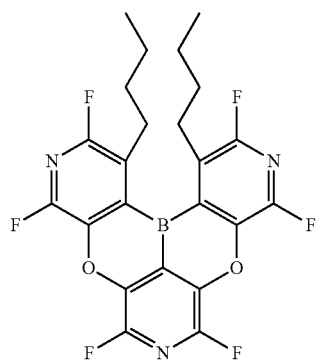
A122
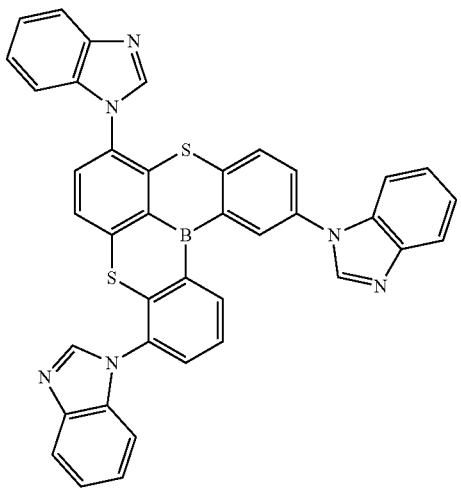
A123
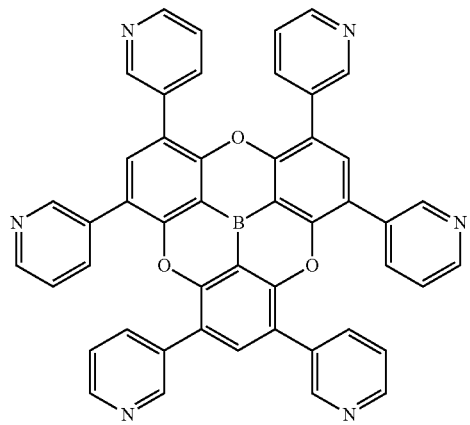
A124
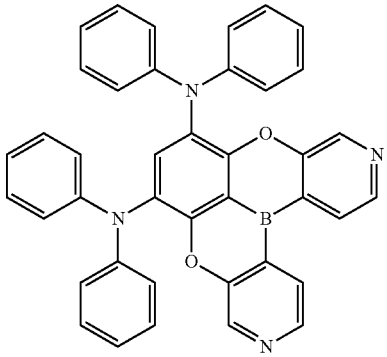
A125
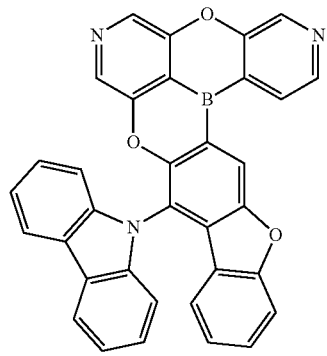
A126
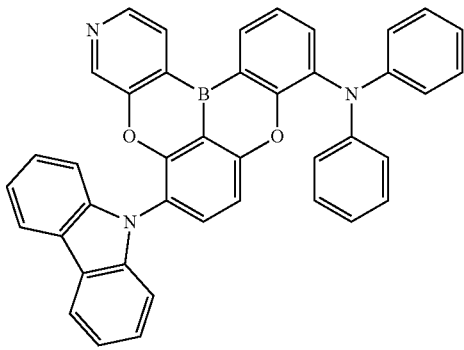
A127

-continued
| A128 | A129 |
|---|---|
| 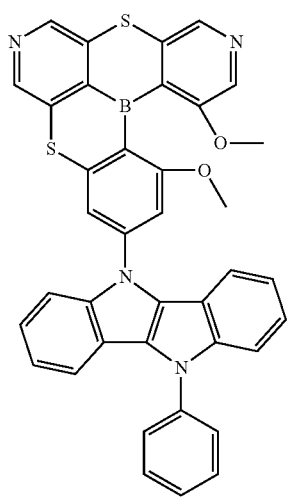 | 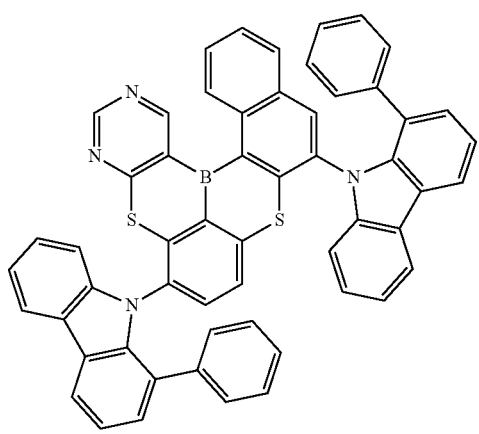 |
| A130 | A131 |
| 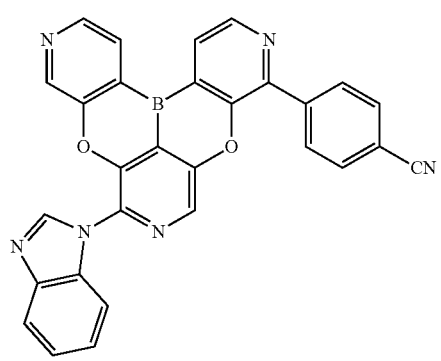 | 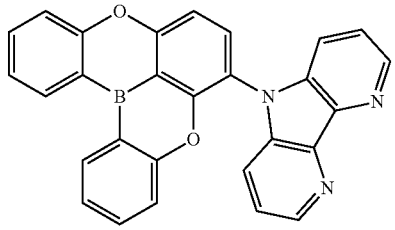 |
| A132 | A133 |
| 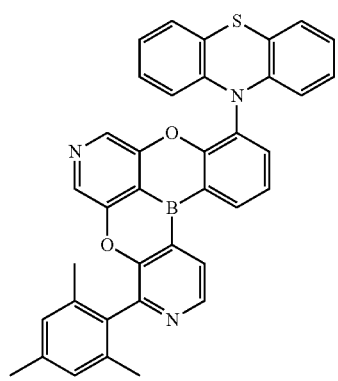 | 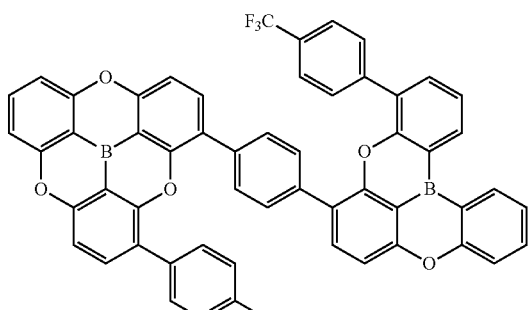 |
| A134 | A135 |
| 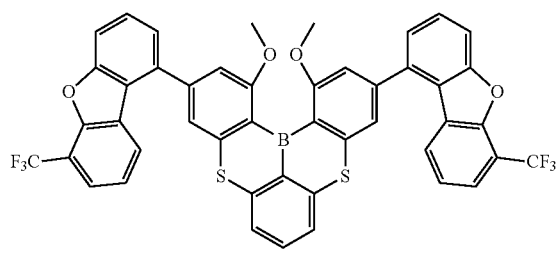 | 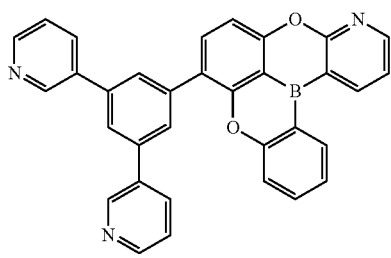 |

-continued
A136
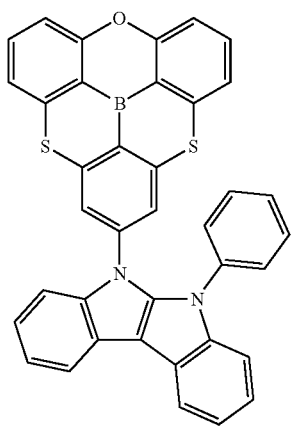
A137
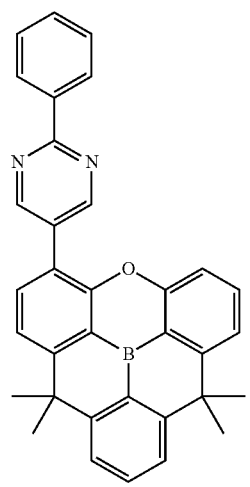
A138
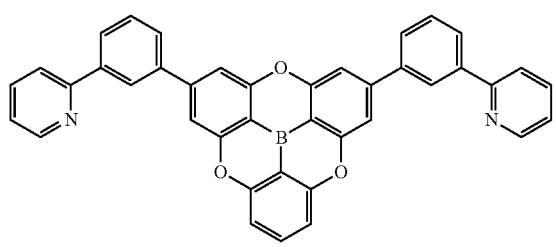
A139
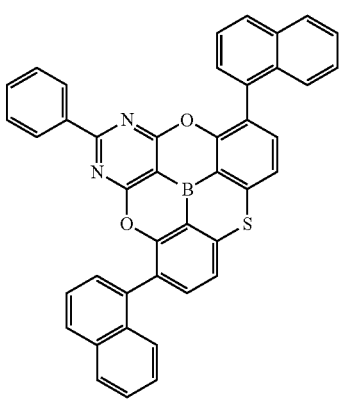
A140
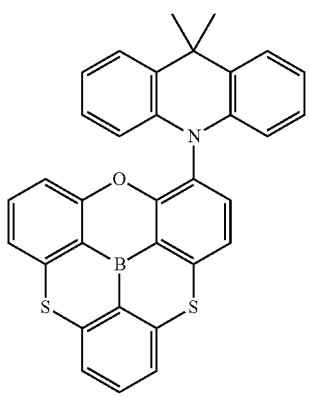
A141
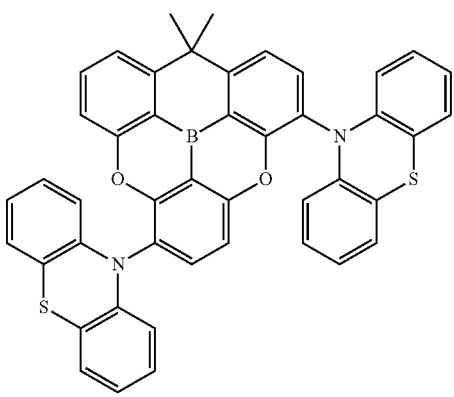
A142
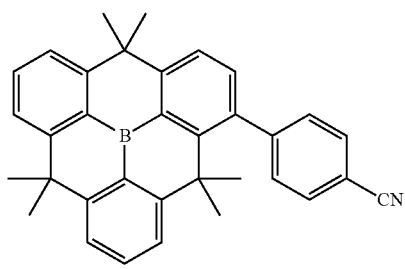
A143
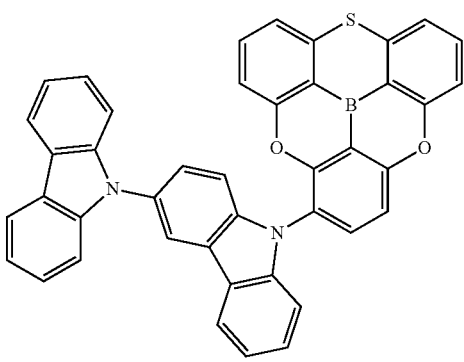

A144 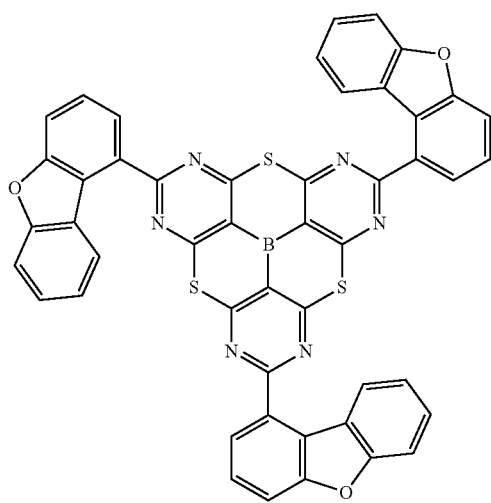
A145 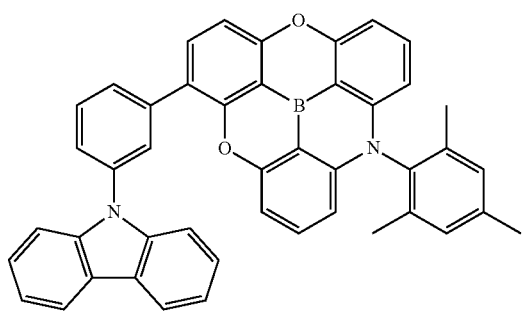
A146 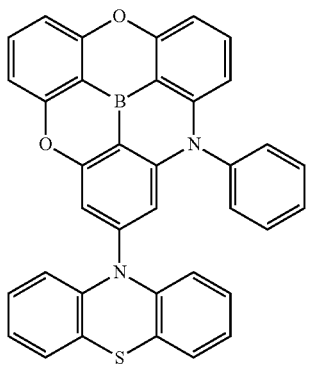
A147 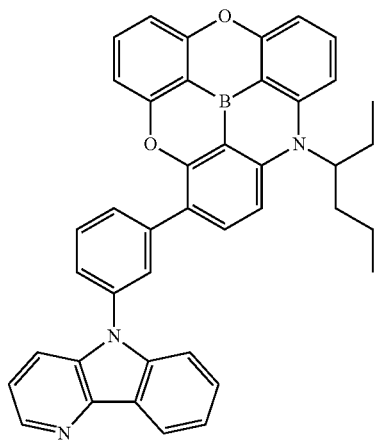
A148 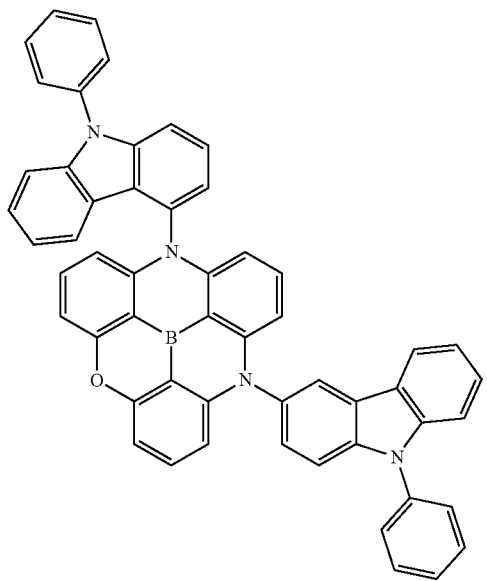
A149 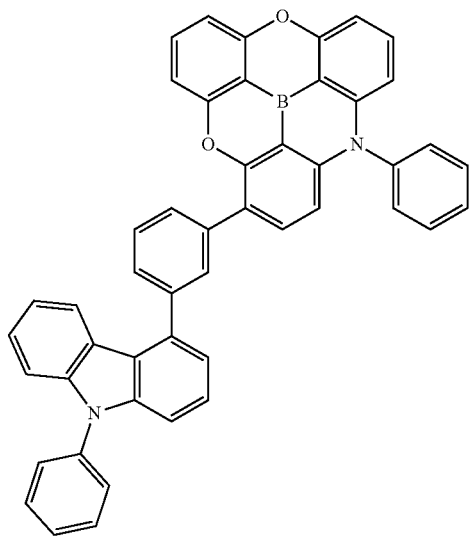

-continued
A150
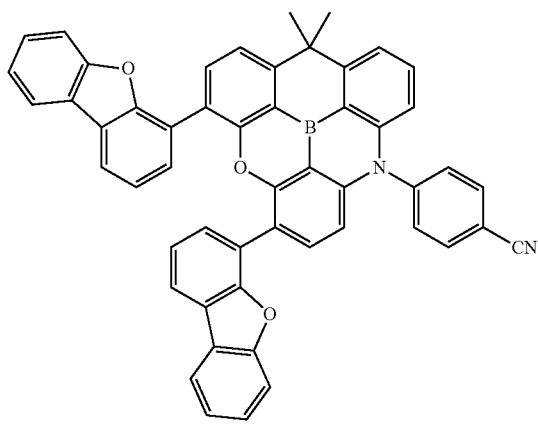
A151
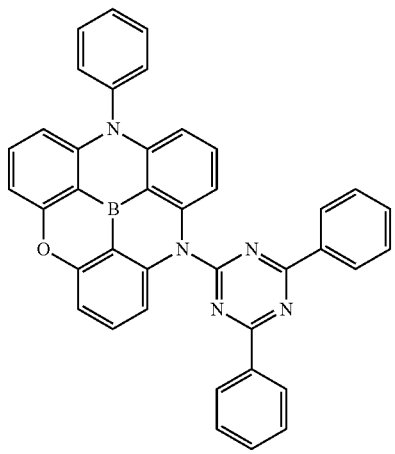
A152
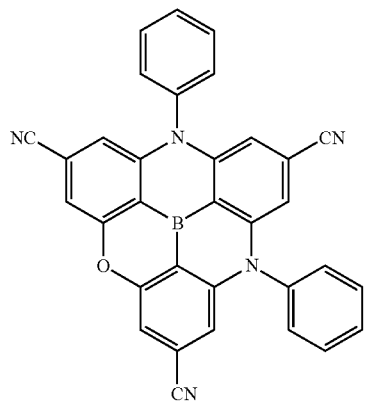
A153
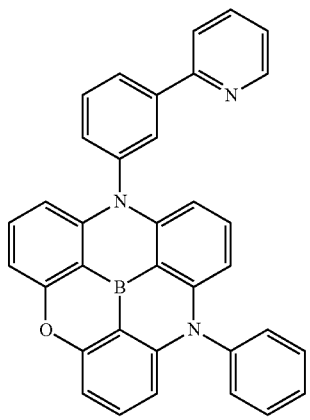
A154
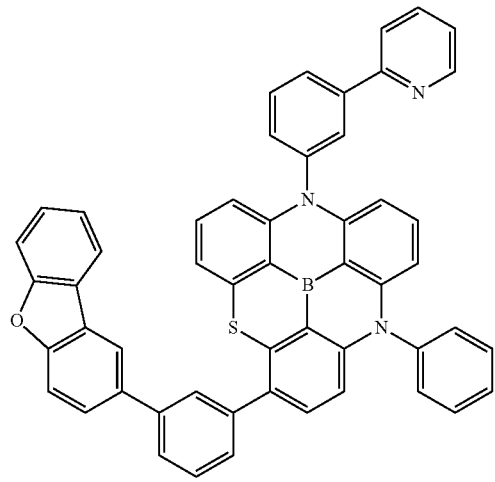

(2.2) Synthesis of π-Conjugated Boron Compounds Having Structure Represented by Formulas (1) to (3)

The π-conjugated boron compound having the structure represented by one of Formulas (1) to (3) is synthesized by a known synthesis method.

For example, in the method for producing triarylborane, which is an example compound, it is preferable to produce triarylborane having the structure represented by the following Formula (5) using a triarylborane intermediate having the structure represented by the following Formula (4).

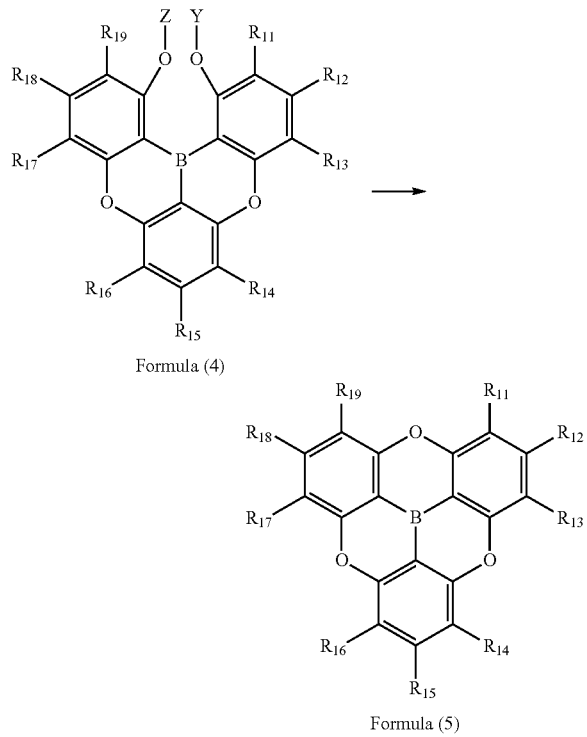

Formula (4)

Formula (5)

In Formula (4) and Formula (5), Y and Z each independently represent a hydrogen atom, a methyl group, or a hydroxyl protecting group. $R_{11}$ to $R_{19}$ each independently represent a hydrogen atom, a chained alkyl group, a cycloalkyl group, an aromatic hydrocarbon ring group, or an aromatic heterocyclic group. $R_{11}$ to $R_{19}$ are synonymous with $X_1$ to $X_9$ described in Formula (1).

As the protecting group of the hydroxy group represented by Y and Z, a sulfonyl group may be preferably used. In particular, a trifluoromethanesulfonate group is preferable. It is preferable that Y represents a hydrogen atom, and Z represents a trifluoromethanesulfonate group.

In this synthetic method, first, a compound (Formula (4)) having a structure in which the phenoxaborin skeleton is doubled is prepared. Then, by utilizing the intramolecular cyclization reaction of the ring-opened portion of the compound, the compound of the present invention represented by Formula (5) bridged with an oxygen atom is obtained.

In the intramolecular cyclization reaction, it is preferable to utilize a nucleophilic substitution reaction from the viewpoint of high yield and ease of synthesis. In this case, it is necessary that one of the substituents containing two oxygen atoms is a hydroxy group and the other is a hydroxy-protecting group.

It is preferable to produce the triarylborane intermediate represented by the following Formula (7) using a compound having the structure represented by the following Formula (6).

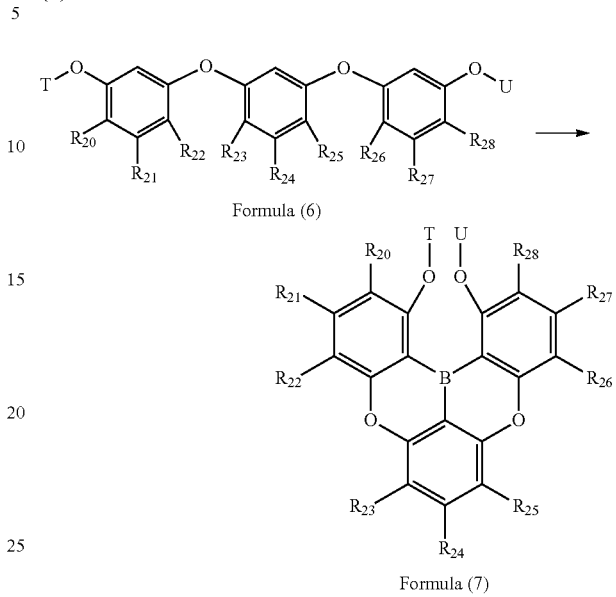

Formula (6)

Formula (7)

In Formula (6) and Formula (7), T and U each independently represent a hydrogen atom, a methyl group, or a hydroxyl protecting group. $R_{20}$ to $R_{28}$ represents a hydrogen atom, a chained alkyl group, a cycloalkyl group, an aromatic hydrocarbon ring group, or an aromatic heterocyclic group. $R_{20}$ to $R_{28}$ are synonymous with $X_1$ to $X_9$ described in Formula (1).

As the protecting group of the hydroxy group represented by T and U, a methyl group or a sulfonyl group may be preferably used. In particular, itis preferable that T and U both represent a methyl group.

This production method is to prepare an ether compound (Formula (6)) in which three aryl groups are bridged by oxygen atoms, and react the compound with a reagent containing boron to form three carbon-boron bonds to obtain a compound (Formula (7)) having a structure in which the phenoxaborin skeleton is doubled.

The substituent of the terminal oxygen atom in Formula (6) is preferably a substituent capable of realizing a high yield without adversely affecting the reaction.

The synthesis of the π-conjugated boron compound according to the present invention may be performed with reference to WO2017/018326, WO 2015/102118, JP-A 2017-126606, Chinese Patent No. 106167553, and Chinese Patent No. 106467554.

(2.3) Applications of π-Conjugated Boron Compounds Having a Structure Represented by Formulas (1) to (3)

In the present invention, a boron compound having a structure represented by the above Formulas (1) to (3) is used as a π-conjugated boron compound. The boron compound is excellent in electron transporting property and high luminous efficiency which are originally derived from boron. However, boron, which is a group 13 element, is vulnerable to attack by nucleophiles and is unstable because it is an electronic-deficient element with empty p orbitals. By incorporating boron into the carbon backbone and preferably completely cyclizing three sides around it, the boron becomes less susceptible to detachment from the molecular. As a result, the thermal stability at a high temperature may be enhanced without impairing the electron acceptance of boron. Such a boron compound is excellent in electron transporting property and high luminous efficiency.

Further, when the π-conjugated boron compound contains an electron-donating group, charge-separated states may be stabilized on a wide π-conjugate plane, and the charge-separated states may be used as an acceptor unit of a delayed fluorescent material (also referred to as a TADF light emitting material).

The π-conjugated boron compound according to the present invention may be a fluorescence emitting compound in an electronic device such as an organic EL element. The π-conjugated boron compound of the present invention may be a host compound of an organic EL element. In this case, it is preferable that the light emitting layer contains the π-conjugated boron compound of the present invention, and at least one of the fluorescent compound and the phosphorescent compound from the viewpoint of high luminescence. Further, the π conjugated boron compound according to the present invention may be an assist dopant in the organic EL element. In this case, it is preferable that the light emitting layer contains the π-conjugated boron compound of the present invention, at least one of the fluorescence emitting compound and the phosphorescence emitting compound, and the host compound from the viewpoint of high luminescence.

Further, since the π-conjugated boron compound according to the present invention has a bipolar property and may cope with various energy levels, it may be used not only as a fluorescent compound, a light emitting host, and an assist dopant, but also as a compound suitable for hole transport and electron transport. Therefore, the π-conjugated boron compound according to the present invention is not limited to use in a light emitting layer of an organic EL element, and may be used in a hole injection layer, a hole transport layer, an electron blocking layer, a hole blocking layer, an electron transport layer, an electron injection layer, or an intermediate layer, which will be described later.

The π-conjugated boron compound according to the present invention is preferably a triarylborane having a structure in which boron is incorporated into a carbon skeleton and three sides around boron are preferably cyclized, and the ring around boron contains a single bond oxygen atom or sulfur atom, as is obvious from the above Formula (1). Conventional triarylborane does not stably exist without a large steric hindrance group so as to surround boron, but in the π-conjugated boron compound according to the present invention, by the disk-shape and electron injection from three oxygen atoms or sulfur atoms, preferably oxygen atoms, it resulted in a compound which is very stable and does not decompose even when heated in air, although it is quite flat. In the present invention, attention was paid to interaction with a tertiary amine typified by triarylamine and a nitrogen-containing aromatic heterocyclic ring typified by pyridine based on the characteristic that the π-conjugated boron compound is entirely planar and has an electronic-deficient vacant orbital. By utilizing this interaction and by using the π-conjugated boron compound according to the present invention in combination with the hole transporting material, hole transfer may be improved. It has also been found that electron transfer is improved by using the π-conjugated boron compound according to the present invention in combination with an electron transport material.

The mechanism of improving the hole transfer by using the π-conjugated boron compound according to the present invention in combination with the hole transport material is considered as follows. Normally, in hole transport, holes are transported by intermolecular hopping of amine moieties in which HOMO is present. When considering a system to which a π-conjugated boron compound according to the present invention (hereinafter, often referred to as "planar borane") is added, the amine portion of the hole transport material interacts with the planar borane. Specifically, electron transfer from the amine portion to the planar borane (even in a state in which an electric field is not applied) occurs, so that an overwhelming repulsion force is exerted and the hole transport property is improved as compared with a simple system in which the amine portion is hopped between molecules.

Next, the electron transport enhancement mechanism will be described. In general, electron transport is performed by moving an aromatic heterocycle (e.g., an oxazole portion) in which a LUMO (lowest unoccupied molecular orbital) exists by intermolecular hopping. When considering a system in which planar borane is added to this, the oxazole portion interacts with the planar borane. Specifically, electron transfer from the oxazole portion to the planar borane occurs (even in a state where no electric field is applied), whereby an overwhelming repulsive force acts and the electron transporting property is improved as compared with a simple system of intermolecular hopping of the oxazole moiety.

In addition, a planar borane not only interacts with an amine compound and a nitrogen-containing aromatic heterocycle, but also interacts with a metal used in the cathode. The metal used in the cathode is a metal having a small work function. In particular, as the cathode for an organic EL element, aluminum, silver, magnesium silver alloy is often used. Since the planar borane also interacts with these metals, when an organic layer containing a π-conjugated boron compound is adjacent to the cathode, interface polarization caused by the interaction occurs at the interface between the cathode and the adjacent layer. As a result, the work function of the metal is lowered, and electron injection may be accelerated.

In particular, from the viewpoint of more effectively expressing the effect of the present invention in which the material of the upper layer may be dissolved without dissolving the lower layer, the residual amount of the solvent containing the fluorine-containing solvent in the film is reduced, and the effect of the present invention capable of exhibiting high device performance by suppressing the influence on the device, it is preferable that the composition for an electronic device or ink of the present invention is used for the electron transport layer or the electron injection layer.

(3) Component C

When the composition for an electronic device containing a fluorine-containing solvent and a π-conjugated boron compound according to the present invention is used in a wet process as an ink for an electronic device, it is preferable that the liquid stability is high, and as a means for improving the liquid stability, a third component (also referred to as "component C" according to the present invention) other than the component A and the component B is mixed in a range that does not affect the residual amount of the fluorine-containing solvent in the film.

The component C according to the present invention may be a solute or a solvent, but it is preferable that the component C contains an atom having an unshared electron pair, and it is preferable that the component C is an alcohol solvent. Further, it is preferable that the atom having an unshared electron pair of the component C is a nitrogen atom having an unshared electron pair that does not participate in aromaticity.

(3.21) Alcohol

Alcohol solvents preferably used in the present invention are general alcohols and polyhydric alcohols, and are not particularly limited. Examples thereof are: methanol, ethanol, n-propanol, ethylene glycol, cyclopentane, o-xylene, toluene, hexane, tetralin, mesitylene, benzene, methylcyclohexane, ethylbenzene, 1,3-diethylbenzene, isophorone, 2-hexanol, triethylamine, cyclohexanone, diisopropyl Amine, isopropyl alcohol, pyridine, acetophenone, 2-butoxyethanol, 1-butanol, triethanolamine, aniline, diethylene glycol monobutyl ether (DEGMBE), tributylamine, diethylaminoethylamine, 1-pentanol, and dioxane.

(3.2) Organic Compound Having a Nitrogen Atom with an Unshared Electron Pair that does not Participate in Aromaticity As the component C of the present invention, it is preferable to use an organic compound having a nitrogen atom having an unshared electron pair that does not participate in aromaticity from the viewpoint of further enhancing liquid stability.

In the present invention, "a nitrogen atom having an unshared electron pair which does not participate in aromaticity" means a nitrogen atom having an unshared electron pair, and the unshared electron pair does not directly participate as an essential element in the aromaticity of the unsaturated cyclic compound. That is, it refers to a nitrogen atom in which an unshared electron pair does not participate in a delocalized π electron system on a conjugated unsaturated ring structure (aromatic ring) as an essential element for aromatic expression in terms of a chemical structural formula.

Hereinafter, "a nitrogen atom having an unshared electron pair not involved in aromaticity" according to the present invention will be described.

The nitrogen atom is a Group 15 element and has five electrons in the outermost shell. Three of these unpaired electrons are used for covalent bonding with other atoms, and the remaining two are a pair of unshared electrons, so that the number of bonded nitrogen atoms is usually three.

Examples include an amino group (—NR$^1$R$^2$), an amide group (—C(=O)NR$^1$R$^2$), a nitro group (—NO$_2$), a cyano group (—CN), a diazo group (—N$_2$), an azide group (—N$_3$), a urea bond (—NR$^1$C=ONR$^2$—), an isothiocyanate group (—N=C=S), and a thioamide group (—C(=S)NR$^1$R$^2$). These fall under "a nitrogen atom having an unshared electron pair not involved in aromaticity" of the present invention. R$^1$ and R$^2$ represent a substituent, respectively.

Of these, for example, the resonance formula of the nitro group (—NO$_2$) may be expressed as follows. Although the unshared electron pair of the nitrogen atom in the nitro group is utilized for the resonance structure with the oxygen atom in a strict sense, in the present invention, it is defined that the nitrogen atom of the nitro group also has the unshared electron pair.

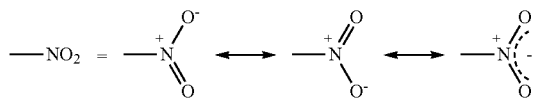

On the other hand, the nitrogen atom may also create a fourth bond by using an unshared electron pair. For example, as shown below, tetrabutylammonium chloride (TBAC) is a quaternary ammonium salt in which a fourth butyl group is ionically bonded to a nitrogen atom and has a chloride ion as a counter ion.

Tris(2-phenylpyridine)iridium(III) (abbreviation: Ir(ppy)$_3$) is a neutral metal complex in which an iridium atom and a nitrogen atom are coordinated. Although these compounds have a nitrogen atom, since the unshared electron pair is used for ionic bonding and coordination bonding, respectively, they do not fall under "a nitrogen atom having an unshared electron pair which does not participate in aromaticity" of the present invention.

Namely, the present invention effectively utilizes an unshared electron pair of a nitrogen atom which is not utilized for bonding.

In the structural formulae shown below, the left side shows the structure of tetrabutylammonium chloride (abbreviation: TBAC), and the right side shows the structure of tris(2-phenylpyridine)iridium(III) (abbreviation: Ir(ppy)$_3$).

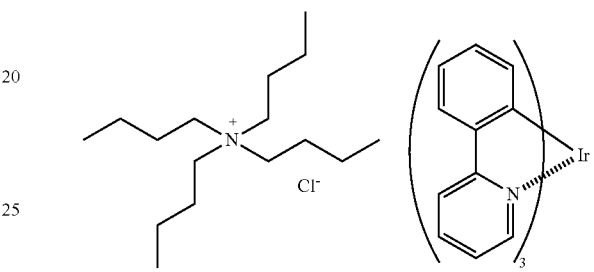

The nitrogen atom is common as a heteroatom which will constitute an aromatic ring, and contributes to the expression of aromaticity. Examples of the "nitrogen-containing aromatic ring" include a pyridine ring, a pyrazine ring, a pyrimidine ring, a triazine ring, a pyrrole ring, an imidazole ring, a pyrazole ring, a triazole ring, and a tetrazole ring.

For a pyridine ring, the six-membered conjugated (resonant) unsaturated ring structure satisfies the Huckel's rule of "4n+2" (n=0 or a natural number) because the number of delocalized π electrons is six, as shown below. Since the nitrogen atom in the six-membered ring is a substitution of —CH=, it only mobilizes one unpaired electron to the 6-π electron system, and the unshared electron pair does not participate as essential for the expression of aromaticity.

Therefore, the nitrogen atom of the pyridine ring corresponds to "a nitrogen atom having an unshared electron pair not involved in aromaticity" according to the present invention. The molecular orbitals of the pyridine ring are shown below.

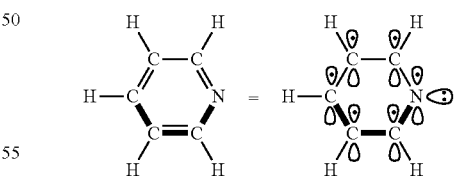

In the case of a pyrrole ring, as shown below, one of the carbon atoms constituting the five-membered ring is substituted with a nitrogen atom, but the number of π electrons is also 6, which is a nitrogen-containing aromatic ring satisfying the Huckel's rule. Since the nitrogen atom of the pyrrole ring is also bonded to the hydrogen atom, the unshared electron pair is mobilized to the 6-π electron system.

Therefore, although the nitrogen atom of the pyrrole ring has an unshared electron pair, it is not included in the "nitrogen atom having an unshared electron pair which does not participate in aromaticity" of the present invention because it has been used as an essential element for aromaticity expression.

The molecular orbitals of the pyrrole ring are shown below.

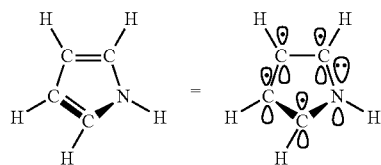

On the other hand, as shown below, the imidazole ring has a structure in which two nitrogen atoms are substituted at positions 1 and 3 in the 5-membered ring, and is also a nitrogen-containing aromatic ring having 6-π electrons. The nitrogen atom $N^1$ is a pyridine-ring type nitrogen atom that recruits only one unpaired electron to the 6-π electron system and does not utilize an unshared electron pair for aromaticity expression. On the other hand, the nitrogen atom $N^2$ is a pyrrole-ring type nitrogen atom that is mobilized an unshared electron pair into a 6-π electron system.

Therefore, the nitrogen atom $N^1$ of the imidazole ring corresponds to "a nitrogen atom having an unshared pair of electrons not involved in aromaticity". The molecular orbitals of the imidazole ring are shown below.

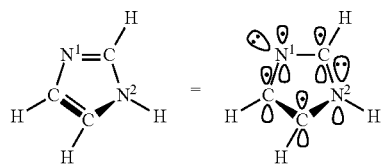

The same applies to the case of a condensed ring compound having a nitrogen-containing aromatic ring skeleton. For example, δ-carboline is an azacarbazole compound in which a benzene ring skeleton, a pyrrole ring skeleton, and a pyridine ring skeleton are fused in this order, as shown below. The nitrogen atom $N^3$ of the pyridine ring mobilizes only one unpaired electron, and the nitrogen atom $N^4$ of the pyrrole ring mobilizes an unshared electron pair in a π-electron system, and together with 11-π electrons from the carbon atoms forming the pyridine ring, the aromatic ring has 14 total π electrons.

Therefore, among the two nitrogen atoms of δ-carboline, the nitrogen atom $N^3$ of the pyridine ring corresponds to "a nitrogen atom having an unshared electron pair which does not participate in aromaticity", but the nitrogen atom $N^4$ of the pyrrole ring does not correspond to this.

Thus, even when the pyridine ring and the pyrrole ring are incorporated in the fused ring compound, the effect thereof is not inhibited or suppressed, and there is no difference when the pyridine ring and the pyrrole ring are used as a single ring. The molecular orbitals of δ-carboline are shown below.

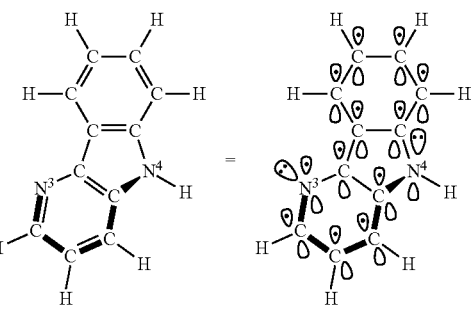

As described above, the "nitrogen atom having an unshared electron pair not involved in aromaticity" defined in the present invention is important for expressing a strong interaction of the unshared electron pair with copper, gold, or platinum which is a main component of the conductive layer. The nitrogen atom is preferably a nitrogen atom in a nitrogen-containing aromatic ring from the viewpoints of stability and durability.

The organic compound having a nitrogen atom having an unshared electron pair which does not participate in the aromaticity according to the present invention preferably has an aromatic heterocycle, and the pyridine ring is preferable as the aromatic heterocycle.

Further, it is preferable that the organic compound having a nitrogen atom having an unshared electron pair which does not participate in the aromaticity according to the present invention is an organic compound having a bromine atom, an iodine atom or a sulfur atom. By using these atoms, the organic compound contained in the intermediate layer exhibits the object effect of the present invention without depending on the main skeleton.

As a specific compound of the organic compound having a nitrogen atom having an unshared electron pair which does not participate in the aromaticity according to the present invention, there is no particular limitation, but a compound represented by the following Formulas (I) to (IV) may be cited as an example.

As the organic compound having a nitrogen atom having an unshared electron pair which does not participate in the aromaticity according to the present invention, a compound represented by the following Formula (I) may be mentioned.

Formula (I)

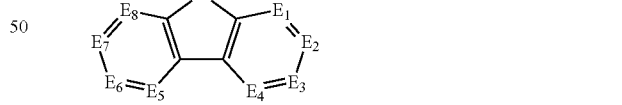

In the above Formula (I), X represents $NR_1$, an oxygen atom, or a sulfur atom. $E_1$ to $E_8$ each independently represent $CR_2$ or a nitrogen atom, and at least one of $E_1$ to $E_8$ represents a nitrogen atom. $R_1$ and $R_2$ each independently represent a hydrogen atom or a substituent.

In Formula (I), examples of the substituent represented by $R_1$ (I) are: an alkyl group, a cycloalkyl group, an alkynyl group, an aromatic hydrocarbon group, an aromatic heterocyclic group, a heterocyclic group, an alkoxy group, a cycloalkoxy group, an aryloxy group, an alkylthio group, a cycloalkylthio group, an arylthio group, an alkoxycarbonyl group, an aryloxycarbonyl group, a sulfamoyl group, an acyl group, an acyloxy group, an amide group, a carbamoyl group, an ureido group, a sulfinyl group, an alkylsulfonyl group, an arylsulfonyl group, a heteroarylsulfonyl group, an amino group, a halogen atom, a fluorohydrocarbon group, a cyano group, a nitro group, a hydroxy group, a mercapto group, a silyl group, a phosphate group, and a phosphono group.

In Formula (I), the substituent represented by $R_2$ may be the same as the substituent represented by $R_1$.

The compound represented by the above Formula (I) is preferably a compound represented by the following Formula (II).

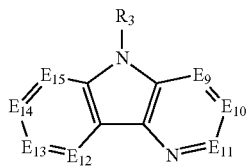

Formula (II)

In Formula (II), $E_9$ to $E_{15}$ each independently represent $CR_4$. $R_3$ and $R_4$ each independently represent a hydrogen atom or a substituent.

In Formula (II), examples of the substituent represented by $R_3$ and $R_4$ include the same as the substituent represented by $R_1$ in Formula (I).

The compound represented by Formula (I) is preferably a compound represented by the following Formula (III).

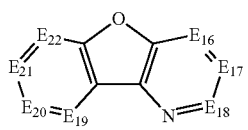

Formula (III)

In Formula (III), $E_{16}$ to $E_{22}$ each independently represent $CR_5$. $R_5$ represents a hydrogen atom or a substituent.

In Formula (III), examples of the substituent represented by $R_5$ include the same as the substituent represented by $R_1$ in Formula (I).

The compound represented by Formula (I) is preferably a compound represented by the following Formula (IV).

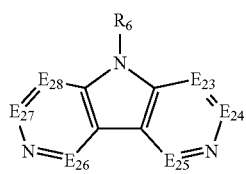

Formula (IV)

In Formula (IV), $E_{23}$ to $E_{28}$ each independently represent $CR_7$. $R_6$ and $R_7$ each independently represent a hydrogen atom or a substituent.

In Formula (IV), examples of the substituent represented by $R_6$ and $R_7$ include the same as the substituent represented by $R_1$ in Formula (I).

Hereinafter, as specific examples of the organic compound having a nitrogen atom having an unshared electron pair not involved in the aromaticity according to the present invention, examples of the compounds represented by the above Formulas (I) to (IV) and examples of the organic compound having other structures are shown, but the present invention is not limited only to these exemplified organic compounds.

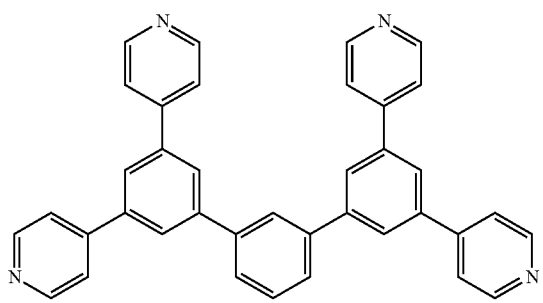

Compound (1)

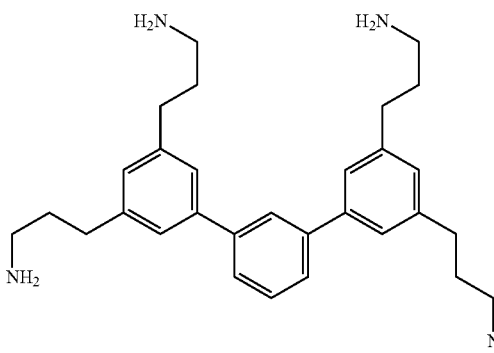

Compound (2)

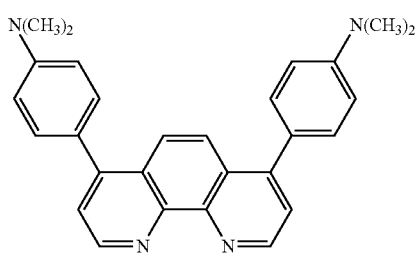

Compound (3)

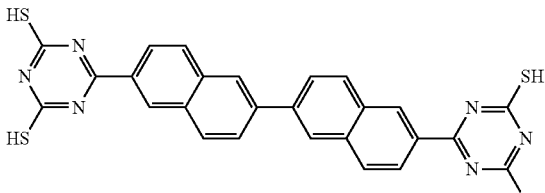

Compound (4)

-continued
Compound (5)
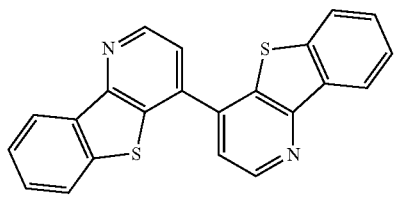
Compound (6)
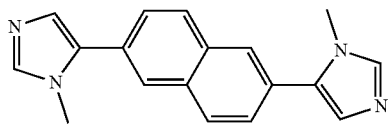
Compound (7)
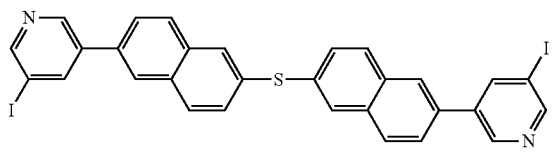
Compound (8)
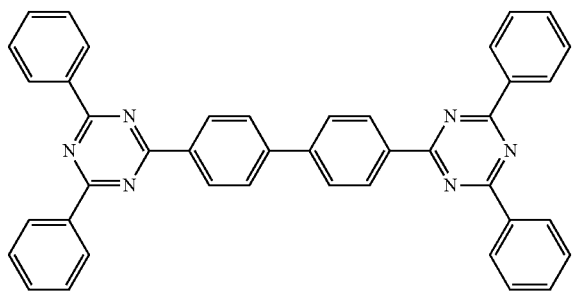
Compound (9)
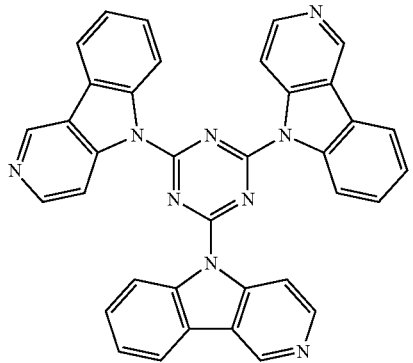
Compound (10)
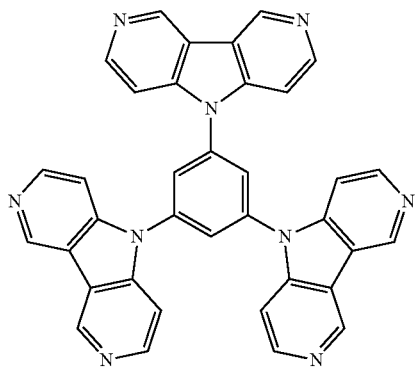
Compound (11)
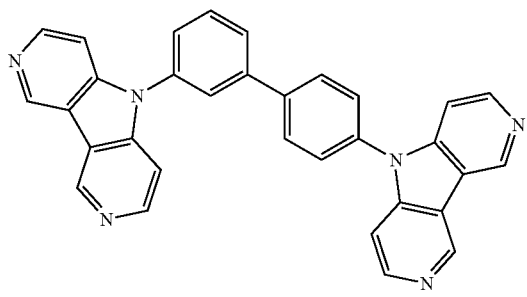
Compound (12)
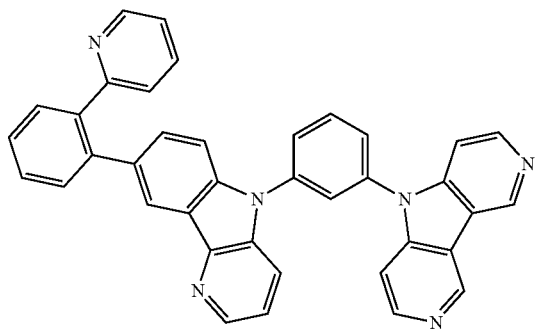

-continued
Compound (13)
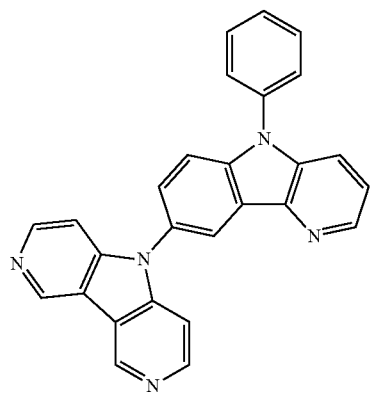
Compound (14)
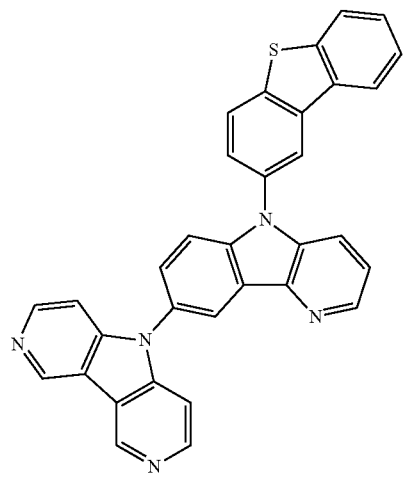
Compound (15)
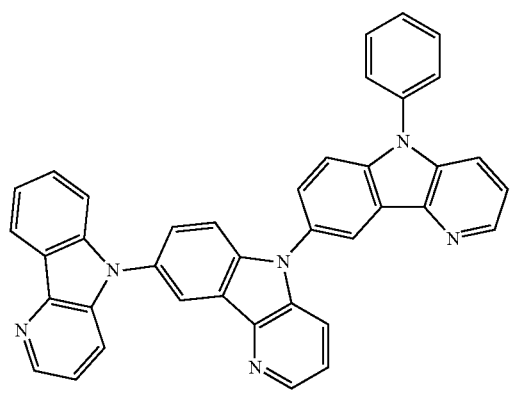
Compound (16)
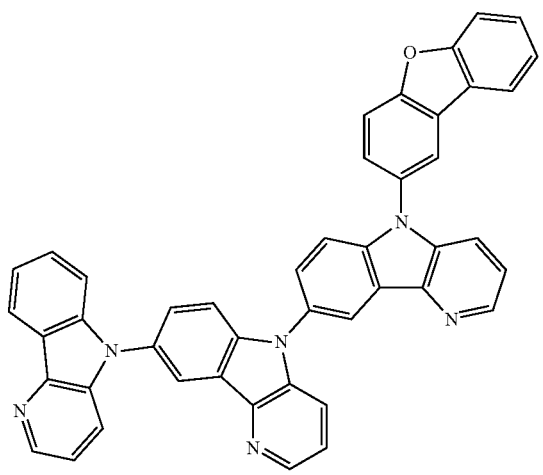
Compound (17)
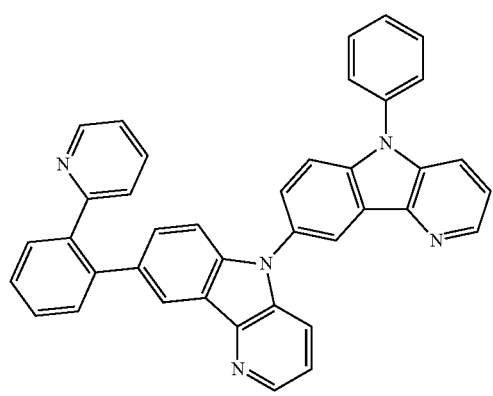
Compound (18)
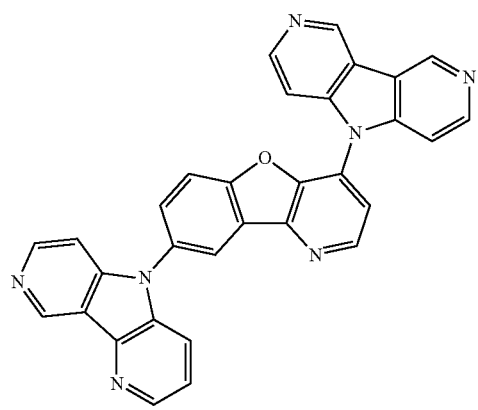

-continued
Compound (19)
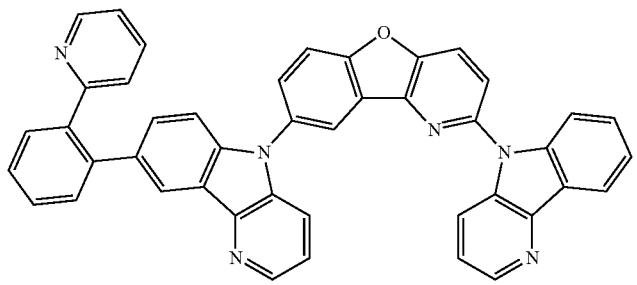
Compound (20)
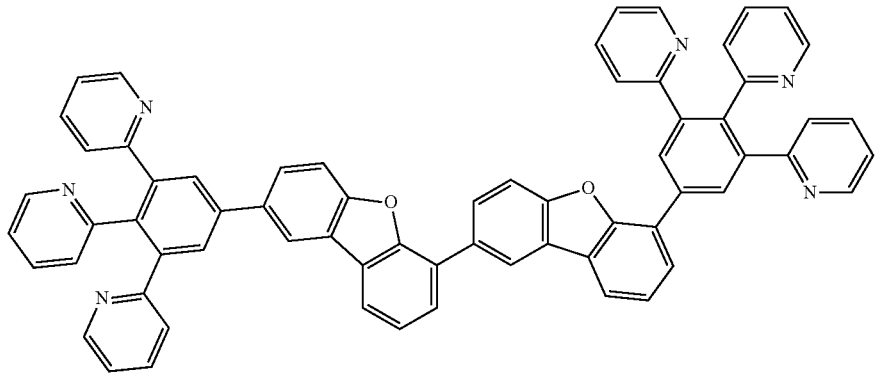
Compound (21)
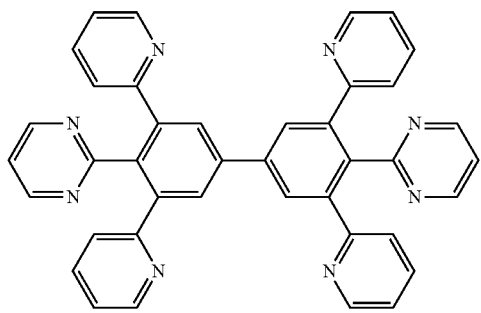
Compound (22)
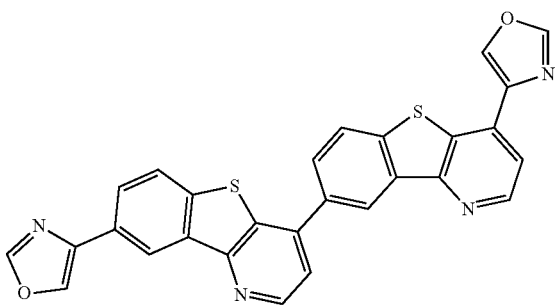
Compound (23)
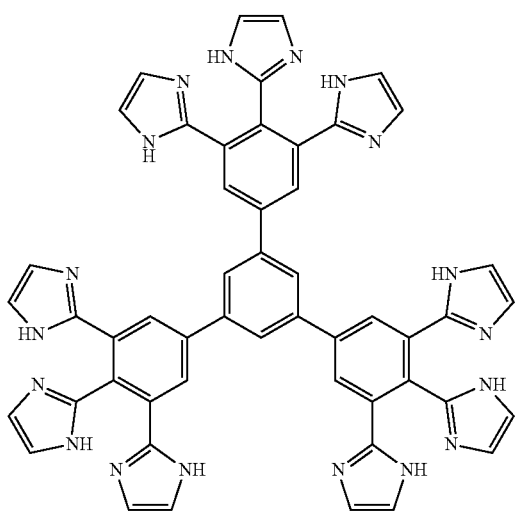
Compound (24)
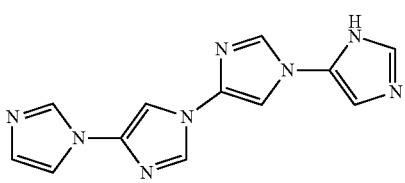

-continued
Compound (25)
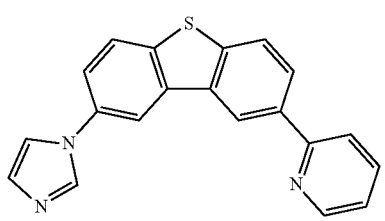
Compound (26)
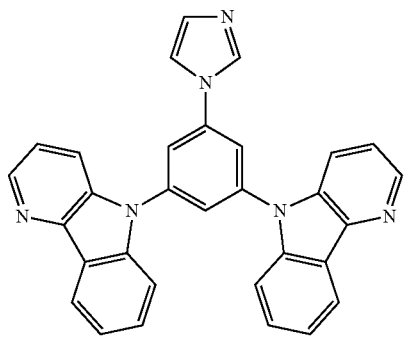
Compound (27)
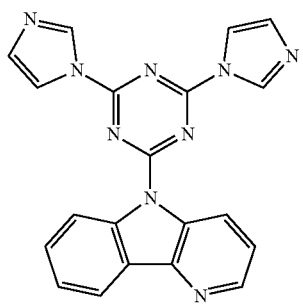
Compound (28)
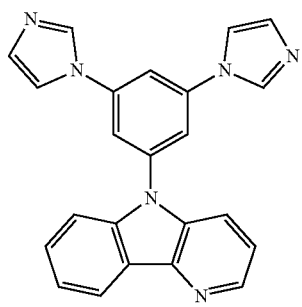
Compound (29)
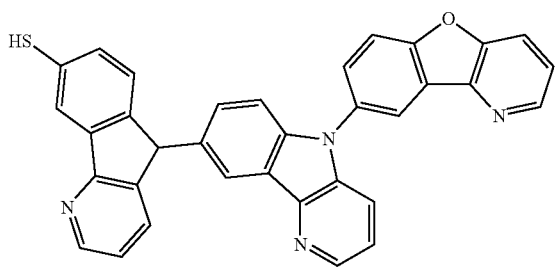
Compound (30)
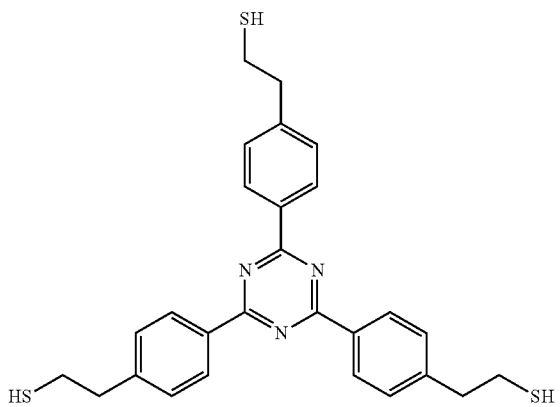
Compound (31)
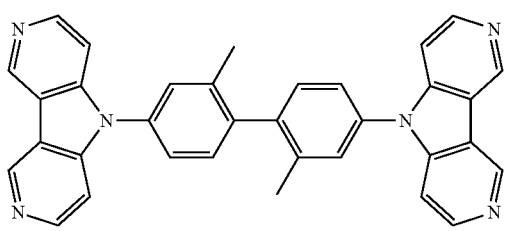
Compound (32)
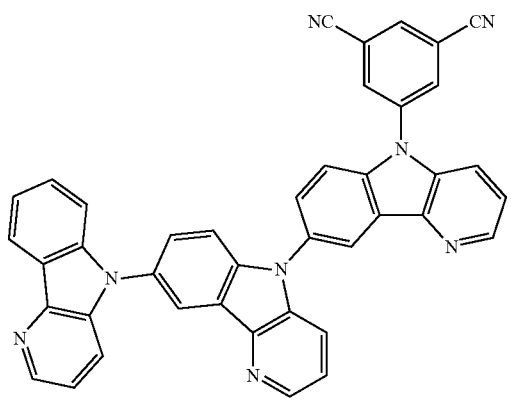

Compound (33)

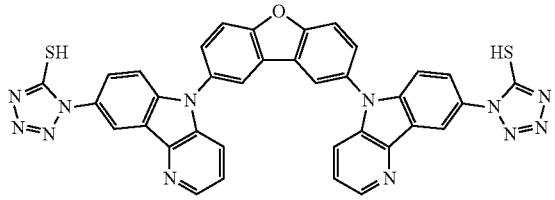

Compound (34)

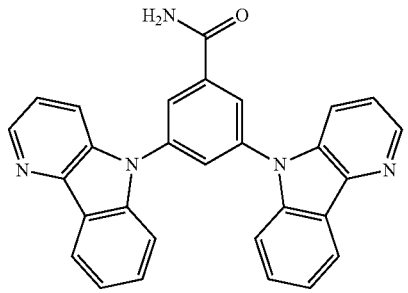

The organic compound having a nitrogen atom having an unshared electron pair which does not participate in the aromaticity according to the present invention may be easily synthesized and obtained according to a conventionally known synthesis method.

(4) Organic EL Element as Electronic Device

The composition for an electronic device of the present invention may be used for forming an organic EL element as described above. The organic EL element is an element having at least a light emitting layer between an anode and a cathode, and it is preferable that at least one light emitting layer contains the aforementioned π-conjugated boron compound. The organic EL element may be suitably provided in the lighting device and the display device.

Representative element constitutions used for an organic EL element of the present invention are as follows, however, the present invention is not limited to these.

(1) Anode/light emitting layer/cathode
(2) Anode/light emitting layer/electron transport layer/cathode
(3) Anode/hole transport layer/light emitting layer/cathode
(4) Anode/hole transport layer/light emitting layer/electron transport layer/cathode
(5) Anode/hole transport layer/light emitting layer/electron transport layer/electron injection layer/cathode
(6) Anode/hole injection layer/hole transport layer/light emitting layer/electron transport layer/cathode
(7) Anode/hole injection layer/hole transport layer/(electron blocking layer/) light emitting layer/(hole blocking layer/) electron transport layer/electron injection layer/cathode Among these, the constitution (7) is preferably used. However, the present invention is not limited to this.

The light emitting layer according to the present invention is composed of one or a plurality of layers. When a plurality of layers are employed, it may be placed a non-light emitting intermediate layer between the light emitting layers. According to necessity, it may be provided with a hole blocking layer (it is also called as a hole barrier layer) or an electron injection layer (it is also called as a cathode buffer layer) between the light emitting layer and the cathode. Further, it may be provided with an electron blocking layer (it is also called as an electron barrier layer) or a hole injection layer (it is also called as an anode buffer layer) between the light emitting layer and the anode.

An electron transport layer according to the present invention is a layer having a function of transporting an electron. An electron transport layer includes an electron injection layer, and a hole blocking layer in abroad sense. Further, an electron transport layer unit may be composed of plural layers.

A hole transport layer according to the present invention is a layer having a function of transporting a hole. A hole transport layer includes a hole injection layer, and an electron blocking layer in abroad sense. Further, a hole transport layer unit may be composed of plural layers.

In the representative element constitutions as described above, the layers eliminating an anode and a cathode are also called as "organic layers".

(Tandem Structure)

An organic EL element according to the present invention may be so-called a tandem structure element in which plural light emitting units each containing at least one light emitting are laminated.

A representative example of an element constitution having a tandem structure is as follows.

Anode/first light emitting unit/intermediate layer/second light emitting unit/intermediate layer/third light emitting unit/cathode.

Here, the above-described first light emitting unit, second light emitting unit, and third light emitting unit may be the same or different. It may be possible that two light emitting units are the same and the remaining one light emitting unit is different.

The plural light emitting units each may be laminated directly or they may be laminated through an intermediate layer. Examples of an intermediate layer are: an intermediate electrode, an intermediate conductive layer, a charge generating layer, an electron extraction layer, a connecting layer, and an intermediate insulating layer. Known composing materials may be used as long as it can form a layer which has a function of supplying an electron to an adjacent layer to the anode, and a hole to an adjacent layer to the cathode.

Examples of a material used in an intermediate layer are: conductive inorganic compounds such as ITO (indium tin oxide), IZO (indium zinc oxide), $ZnO_2$, TiN, ZrN, HfN, $TiO_X$, $VO_X$, CuI, InN, GaN, $CuAO_2$, $CuGaO_2$, $SrCu_2O_2$, $LaB_6$, $RuO_2$, and Al; a two-layer film such as $Au/Bi_2O_3$; a multi-layer film such as $SnO_2/Ag/SnO_2$, $ZnO/Ag/ZnO$, $Bi_2O_3/Au/Bi_2O_3$, $TiO_2/TiN/TiO_2$, and $TiO_2/ZrN/TiO_2$; fullerene such as $C_{60}$; and a conductive organic layer such as oligothiophene, metal phthalocyanine, metal-free phthalocyanine, metal porphyrin, and metal-free porphyrin. The present invention is not limited to them.

Examples of a preferable constitution in the light emitting unit are the constitutions of the above-described (1) to (7) from which an anode and a cathode are removed. However, the present invention is not limited to them.

Examples of a tandem type organic EL element are described in: U.S. Pat. Nos. 6,337,492, 7,420,203, 7,473,923, 6,872,472, 6,107,734, 6,337,492, WO 2005/009087, JP-A 2006-228712, JP-A 2006-24791, JP-A 2006-49393, JP-A 2006-49394, JP-A 2006-49396, JP-A 2011-96679, JP-A 2005-340187, JP Patent 4711424, JP Patent 3496681, JP Patent 3884564, JP Patent 4213169, JP-A 2010-192719, JP-A 2009-076929, JP-A 2008-078414, JP-A 2007-059848, JP-A 2003-272860, JP-A 2003-045676, and WO 2005/094130. The constitutions of the elements and the composing materials are described in these documents, however, the present invention is not limited to them.

Hereinafter, each layer which constitutes the organic EL element of the present invention will be described.

(Substrate)

The substrate applicable to the organic EL element is not particularly limited, and examples thereof include glass and plastic.

The substrate used in the present invention may be transparent or to light or not transparent to light. The substrate applicable to the present invention is not particularly limited, and examples thereof include a resin substrate, a thin film metal foil, and a thin flexible glass plate.

Examples of the resin substrate applicable to the present invention include: polyesters such as polyethylene terephthalate (PET) and polyethylene naphthalate (PEN), polyethylene, polypropylene, cellophane, cellulose esters and their derivatives such as cellulose diacetate, cellulose triacetate (TAC), cellulose acetate butyrate, cellulose acetate propionate (CAP), cellulose acetate phthalate, and cellulose nitrate, polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyether imide, polyether ketone imide, polyamide, fluororesin, Nylon, polymethyl methacrylate, acrylic resin, polyallylates and cycloolefin resins such as ARTON (trade name, made by JSR Co. Ltd.) and APEL (trade name, made by Mitsui Chemicals, Inc.).

Among these resin substrates, in terms of cost and availability, a film of polyethylene terephthalate (abbreviation: PET), polybutylene terephthalate, polyethylene naphthalate (abbreviation: PEN), or polycarbonate (abbreviation: PC) is preferably used as a flexible resin substrate.

The thickness of the resin substrate is preferable a thin film resin substrate in the range of 3 to 200 µm, more preferably in the range of 10 to 150 µm, and particularly preferably in the range of 20 to 120 µm.

The thin glass applicable as the substrate used in the present invention is a glass plate that is thin enough to be curved. Thickness of the thin glass sheet may be appropriately set in a range where the thin glass sheet exhibits flexibility.

Examples of the thin plate glass include soda lime glass, barium strontium containing glass, lead glass, aluminosilicate glass, borosilicate glass, barium borosilicate glass, and quartz. The thickness of the thin plate glass is, for example, in the range of 5 to 300 µm, and preferably in the range of 20 to 150 µm.

Examples of the material for forming the thin-film metal foil include one or more metals or alloys selected from the group consisting of stainless steel, iron, copper, aluminum, magnesium, nickel, zinc, chromium, titanium, molybdenum, silicon, germanium, and tantalum. The thickness of the thin-film metal foil may be appropriately set within a range in which the thin-film metal foil exhibits flexibility, and is, for example, within a range of 10 to 100 µm, preferably within a range of 20 to 60 µm.

(First Electrode: Anode)

As the anode constituting the organic EL element, a metal such as Ag, Au or an alloy containing a metal as a main component, CuI, or metal oxides such as indium-tin complex oxide (ITO), $SnO_2$ and ZnO may be mentioned, but it is preferable that the anode is a metal or an alloy containing a metal as a main component, and it is more preferable that the anode is silver or an alloy containing silver as a main component.

When the transparent anode is composed mainly of silver, the purity of silver is preferably 99% or more. In order to secure the stability of silver, palladium (Pd), copper (Cu), or gold (Au) may be added.

The transparent anode is a layer composed mainly of silver, but specifically, it may be formed of silver alone or an alloy containing silver (Ag). Examples of such alloys include silver-magnesium (Ag—Mg), silver-copper (Ag—Cu), silver-palladium (Ag—Pd), silver-palladium-copper (Ag—Pd), and silver-indium (Ag—In).

Among the constituent materials constituting the anode, it is preferable that the anode constituting the organic EL element used in the present invention is a transparent anode which is composed mainly of silver and has a thickness in the range of 2 to 20 nm, and more preferably has a thickness in the range of 4 to 12 nm. When the thickness is 20 nm or less, the absorption component and the reflection component of the transparent anode may be suppressed to be low, and high light transmittance may be maintained, which is preferable.

The layer composed mainly of silver referred to in the present invention means that the content of silver in the transparent anode is 60 mass % or more, preferably the content of silver is 80 mass % or more, more preferably the content of silver is 90 mass % or more, and particularly preferably the content of silver is 98 mass % or more. The term "transparent" as used in the transparent anode according to the present invention means that the light transmittance at a wavelength of 550 nm is 50% or more.

In the transparent anode, a layer configuration of silver as a main component may be divided into a plurality of layers and laminated as necessary.

In addition, in the present invention, when the anode is a transparent anode composed mainly of silver, it is preferable to provide an underlayer under the anode from the viewpoint of enhancing the uniformity of the silver film of the transparent anode to be formed. There are no particular restrictions on the underlayer, but a layer containing an organic compound having a nitrogen atom or a sulfur atom is preferable, and a method of forming a transparent anode on the underlayer is preferable.

(Light Emitting Layer)

As the light emitting layer constituting the organic EL element, a phosphorescence emitting compound or a fluorescence emitting compound may be used as a light emitting material, but in the present invention, a configuration in which a phosphorescence emitting compound is contained as a light emitting material is particularly preferable.

The light emitting layer is a layer that emits light by recombination of electrons injected from an electrode or an electron transport layer and holes injected from the hole transport layer, and the portion that emits light may be within the layer of the light emitting layer or at the interface between the light emitting layer and an adjacent layer.

The structure of such a light emitting layer is not particularly limited as long as the light emitting material contained therein satisfies the light emitting requirements. Alternatively, there may be a plurality of layers having the same emission spectrum or emission maximum wavelength. In this case, it is preferable to have a non-luminescent intermediate layer between the light emitting layers.

The total thickness of the light emitting layer is preferably in the range of 1 to 100 nm, and more preferably in the range of 1 to 30 nm in order to obtain a lower drive voltage. Note that the total thickness of the light emitting layers is a thickness including the intermediate layer when a non-luminescent intermediate layer exists between the light emitting layers.

The light emitting layers described above may be formed by known methods such as a vacuum deposition method, a spin coating method, a casting method, an LB (Langmuir-Blodgett) method and an inkjet method.

The light emitting layer may be formed by mixing a plurality of light emitting materials, or by mixing a phosphorescence emitting material and a fluorescence emitting material (also referred to as a fluorescent dopant or a fluorescent compound) in the same light emitting layer. The light emitting layer preferably contains a host compound (form referred to as a light emitting host) and a light emitting material (also referred to as a light emitting dopant compound) and emits light from the light emitting material.

(Host Compound)

As the host compound contained in the light emitting layer, a compound having a phosphorescence quantum yield of less than 0.1 at room temperature (25° C.) is preferable. Further, it is preferable that the phosphorescence quantum yield is less than 0.01. Among the compounds contained in the light emitting layer, the volume ratio of the host compound in the layer is preferably 50% or more.

As the host compound, a known host compound may be used alone, or a plurality of types of host compounds may be used. By using a plurality of host compounds, charge transfer may be adjusted, and the efficiency of the organic electroluminescent element may be increased. Further, by using a plurality of light emitting materials described later, different luminescence may be mixed, whereby an arbitrary luminescent color may be obtained.

The host compound used in the light emitting layer may be a conventionally known low molecular compound, a polymer compound having a repeating unit, or a low molecular compound having a polymerizable group such as a vinyl group or an epoxy group (vapor deposition polymerizable light emitting host).

Examples of the host compound applicable to the present invention are the compounds described in the following documents: Japanese patent application publication (JP-A) Nos. 2001-257076, 2001-357977, 2002-8860, 2002-43056, 2002-105445, 2002-352957, 2002-231453, 2002-234888, 2002-260861, 2002-305083, US 2005/0112407, US 2009/0030202, WO 2001/039234, WO 2008/056746, WO 2005/089025, WO 2007/063754, WO 2005/030900, WO 2009/086028, WO 2012/02394, JP-A 2007-254297, and EP 2034538.

(Light Emitting Material)

The light emitting material that can be used in the present invention includes a phosphorescence emitting compound (also referred to as a phosphorescent compound, a phosphorescent material, or a phosphorescent dopant) and a fluorescence emitting compound (also referred to as a fluorescent compound or a fluorescent material). It is preferable to use a phosphorescence emitting compound from the viewpoint of obtaining high luminous efficiency.

<Phosphorescence Emitting Compound>

The phosphorescence emitting compound is a compound which is observed emission from an excited triplet state thereof. Specifically, it is a compound which emits phosphorescence at a room temperature (25° C.) and exhibits a phosphorescence quantum yield of at least 0.01 at 25° C. The phosphorescence quantum yield is preferably 0.1 or more.

The phosphorescence quantum yield will be determined via a method described in page 398 "Spectroscopy II of 4th Edition Lecture of Experimental Chemistry 7" (1992, published by Maruzen Co. Ltd.). The phosphorescence quantum yield in a solution will be determined using appropriate solvents. However, it is only necessary for the phosphorescence emitting compound of the present invention to exhibit the above phosphorescence quantum yield of 0.01 or more using any of the appropriate solvents.

The phosphorescence emitting compound may be appropriately selected and used from known compounds used for a light emitting layer of a general organic EL element. A complex compound containing a metal of Group 8 to 10 in the periodic table of elements is preferable, and an iridium compound, an osmium compound, a platinum compound (platinum complex compound) or a rare earth complex is more preferable. The most preferable compound is an iridium compound.

In the present invention, at least one light emitting layer may contain two or more phosphorescence emitting compounds, the concentration ratio of the phosphorescence emitting compound in the light emitting layer may change in the thickness direction of the light emitting layer.

Specific examples of known phosphorescence emitting compound that may be used in the present invention include compounds described in the following documents.

Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991, WO 2008/101842, WO 2003/040257, US 2006/835469, US 2006/0202194, US 2007/0087321, and US 2005/0244673.

Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009/050290, WO 2009/000673, U.S. Pat. No. 7,332,232, US 2009/0039776, U.S. Pat. No. 6,687,266, US 2006/0008670, US 2008/0015355, U.S. Pat. No. 7,396,598, US 2003/0138657, and U.S. Pat. No. 7,090,928.

Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2006/056418, WO 2005/123873, WO 2006/082742, US 2005/0260441, U.S. Pat. No. 7,534,505, US 2007/0190359, U.S. Pat. Nos. 7,338,722, 7,279,704 and US 2006/103874.

WO 2005/076380, WO 2008/140115, WO 2011/134013, WO 2010/086089, WO 2012/020327, WO 2011/051404, WO 2011/073149, JP-A 2009-114086, JP-A 2003-81988, and JP-A 2002-363552.

In the present invention, preferable phosphorescence emitting compounds are organic metal complexes containing Ir as a center metal. More preferable are complexes containing at least one coordination mode selected from a metal-carbon bond, a metal-nitrogen bond, a metal-oxygen bond and a metal-sulfur bond.

The phosphorescence emitting compounds (it may be called as a phosphorescence emitting metal complex) described above may be synthesized by applying the methods disclosed in the following documents: Organic Letter, vol. 3, No. 16, pp. 2579-2581 (2001), Inorganic Chemistry, Vol. 30, No. 8, pp. 1685-1687 (1991), J. Am. Chem. Soc., vol. 123, 4304 (2001), Inorganic Chemistry, vol. 40, No. 7, pp. 1704-1711 (2001), Inorganic Chemistry, Vol. 41, No. 12, pp. 3055-3066 (2002), New Journal of Chemistry, Vol. 26, p. 1171 (2002), European Journal of Organic Chemistry, Vol. 4, pp. 695-709 (2004), and references described in these documents.

<Fluorescence Emitting Compound>

Examples of the fluorescence emitting compound include coumarin-based dyes, pyran-based dyes, cyanine-based dyes, croconium-based dyes, squarium-based dyes, oxobenzanthracene-based dyes, fluorescein-based dyes, rhodamine-based dyes, pyrylium-based dyes, perylene-based dyes, stilbene-based dyes, polythiophene-based dyes, and rare earth complex-based phosphors.

[Organic Functional Layer Group]

Next, each layer constituting the organic functional layer unit will be described in the order of a charge injection layer, a hole transport layer, an electron transport layer, and a blocking layer.

(Charge Injection Layer)

The charge injection layer is a layer provided between the electrode and the light emitting layer in order to reduce the drive voltage and improve the light emission luminance. It is described in detail in Part 2, Chapter 2, "Electrode Materials" (pp. 123-166) of "Organic EL Elements and their Industrialization Frontiers (Nov. 30, 1998, published by N.T.N. Co. Ltd.)". There area hole injection layer and an electron injection layer.

The charge injection layer is generally present between the anode and the light emitting layer or the hole transport layer in the case of the hole injection layer, and between the cathode and the light emitting layer or the electron transport layer in the case of the electron injection layer. However, the present invention is characterized in that the charge injection layer is arranged adjacent to the transparent electrode. When used in the intermediate electrode, at least one of the electron injection layer and the hole injection layer adjacent to each other may satisfy the requirements of the present invention.

The hole injection layer is a layer arranged adjacent to the anode, which is a transparent electrode, in order to reduce the drive voltage and improve the emission luminance. It is described in detail in Part 2, Chapter 2, "Electrode Materials" (pp. 123-166) of "Organic EL Elements and their Industrialization Frontiers (Nov. 30, 1998, published by N.T.N. Co. Ltd.)".

The details of the hole injection layer are described in JP-A 9-45479, JP-A 9-260062, and JP-A 8-288069. Examples of the material used in the hole injection layer include: a porphyrin derivative, a phthalocyanine derivative, an oxazole derivative, an oxadiazole derivative, a triazole derivative, an imidazole derivative, a pyrazoline derivative, a pyrazolone derivative, a phenylenediamine derivative, a hydrazone derivative, a stilbene derivative, a polyarylalkane derivative, a triarylamine derivative, a carbazole derivative, an indolocarbazole derivative, an isoindole derivative, an acene derivative of anthracene or naphthalene, a fluorene derivative, a fluorenone derivative, polyvinyl carbazole, a polymer or an oligomer containing an aromatic amine in a side chain or a main chain, polysilane, and a conductive polymer or an oligomer (e.g., PEDOT (polyethylenedioxythiophene): PSS (polystyrene sulfonic acid), aniline-based copolymer, polyaniline and polythiophene).

Examples of atriarylamine derivative include: abenzidine type represented by α-NPD (4,4'-bis[N-(1-naphthyl)-N-phenylamino]biphenyl), a star burst type represented by MTDATA (4,4',4"-tris[N-(3-methylphenyl)-N-phenylamino]triphenylamine), and a compound having fluorenone or anthracene in a triarylamine bonding core.

A hexaazatriphenylene derivative described in JP-A Nos. 2003-519432 and 2006-135145 may be also used as a hole transport material.

The electron injection layer is a layer provided between the cathode and the light emitting layer for the purpose of lowering the drive voltage and improving the emission luminance, and when the cathode is composed of the transparent electrode according to the present invention, it is provided adjacent to the transparent electrode. It is described in detail in Part 2, Chapter 2, "Electrode Materials" (pp. 123-166) of "Organic EL Elements and their Industrialization Frontiers (Nov. 30, 1998, published by N.T.N. Co. Ltd.)".

An election injection layer is detailed in JP-A Nos. 6-325871, 9-17574, and 10-74586. Examples of a material preferably used in an election injection layer include: a metal such as strontium and aluminum; an alkaline metal compound such as lithium fluoride, sodium fluoride, or potassium fluoride; an alkaline earth metal compound such as magnesium fluoride; a metal oxide such as aluminum oxide; and a metal complex such as lithium 8-hydroxyquinolate (Liq). Moreover, when the transparent electrode in the present invention is a cathode, an organic material such as a metal complex is particularly preferably used. The electron injection layer is preferably a very thin film, and its layer thickness is preferably in the range of 1 nm to 10 μm, although it depends on the constituent material.

(Hole Transport Layer)

The hole transport layer is made of a hole transport material having a function of transporting holes. In a broad sense, the hole injection layer and the electron blocking layer also have a function of the hole transport layer. The hole transport layer may be a single layer or a plurality of layers.

The hole transport material has any of hole injection or transport and electron barrier properties, and may be an organic substance or an inorganic substance. Examples thereof include: a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, a conductive polymer oligomer and a thiophene oligomer.

As the hole transport material, the above materials may be used, and a porphyrin compound, an aromatic tertiary amine compound and a styrylamine compound may be used, and particularly, an aromatic tertiary amine compound is preferably used.

Representative examples of such aromatic tertiary amine compounds and styrylamine compounds are N,N,N',N'-tetraphenyl-4,4'-diaminophenyl; N,N'-diphenyl-N,N'-bis(3-methylphenyl)-[1,1'-biphenyl]-4,4'-diamine (TPD); 2,2-bis (4-di-p-trilaminophenyl)propane; 1,1-bis(4-di-p-trilaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminodiphenyl ether; 4,4'-bis(diphenylamino)

quodriphenyl; N,N,N-tri(p-tolyl)amine; 4-(di-p-tolylamino)-4'-[4-(di-p-tolylamino)styryl]stylbne; 4-N,N-diphenylamino-(2-diphenylvinyl)benzene; 3-methoxy-4'-N,N-diphenylaminostyrben; and N-phenylcarbazole.

The hole transport layer may be formed by thinning the hole transport material by, for example, a vacuum deposition method, a spin coating method, a casting method, a printing method including an inkjet method and a known method such as an LB (Langmuir-Blodgett) method. The layer thickness of the hole transport layer is not particularly limited, but is usually in the range of about 5 nm to 5 μm, preferably in the range of 5 to 200 nm. The hole transport layer may have a single layer structure composed of one kind or two or more kinds of the above-mentioned materials.

In addition, by doping the material of the hole transport layer with an impurity, the p-property may be increased. Examples include those described in JP-A 4-297076, JP-A 2000-196140, JP-A 2001-102175, and J. Appl. Phys., 95, 5773 (2004).

As described above, it is preferable to increase the p-property of the hole transport layer because an element with lower power consumption may be manufactured.

(Electron Transport Layer)

The electron transport layer is made of a material having a function of transporting electrons, and in a broad sense, an electron injection layer and a hole blocking layer are also included in the electron transport layer. The electron transport layer may be provided as a single layer structure or a multilayer structure.

In the electron transporting layer having a single layer structure and the electron transporting layer having a multilayer structure, the electron transporting material which constitutes a layer portion adjacent to the light emitting layer and also serves as a hole blocking material may have a function of transmitting electrons injected from the cathode to the light emitting layer. As such a material, any of conventionally known compounds may be selected and used. For example, a nitro group-substituted fluorene derivative, a diphenylquinone derivative, a thiopyran dioxide derivative, carbodiimide, a fluorenylidenemethane derivative, an anthraquinodimethane, an anthrone derivative and an oxadiazole derivative may be cited. Further, in the oxadiazole derivative, a thiadiazole derivative in which an oxygen atom of an oxadiazole ring is substituted with a sulfur atom, or a quinoxaline derivative having a quinoxaline ring known as an electron withdrawing group may also be used as a material of the electron transport layer. Furthermore, it is also possible to use a polymer material in which these materials are introduced into a polymer chain or a polymer material in which these materials are used as a main chain of a polymer.

Metal complexes of 8-quinolinol derivatives, such as tris(8-quinolinol)aluminum (Alq$_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq), and metal complexes in which the central metal of these metal complexes is replaced with In, Mg, Cu, Ca, Sn, Ga, or Pb, may also be used as electron transport materials.

The electron transport layer may be formed by thinning the above-mentioned material by a known method such as a vacuum deposition method, a spin coating method, a casting method, a printing method including an inkjet method, or an LB method. The thickness of the electron transport layer is not particularly limited, but is usually in the range of about 5 nm to 5 μm, preferably in the range of 5 to 200 nm. The electron transport layer may be a single structure of one or more of the above materials.

(Blocking Layer)

Examples of the blocking layer include a hole blocking layer and an electron blocking layer, which are layers provided as necessary in addition to the constituent layers of the organic functional layer unit 3 described above. For example, the hole blocking (hole block) layers described in JP-A 11-204258, JP-A 11-204359, and p. 237 of "Organic EL Elements and their Industrialization Frontiers (Nov. 30, 1998, published by N.T.N. Co. Ltd.)" may be cited.

The hole blocking layer has a function of an electron transport layer in a broad sense. The hole blocking layer is made of a hole blocking material that has a function of transporting electrons and has an extremely small ability to transport holes. By blocking holes while transporting electrons, the recombination probability of electrons and holes may be improved. Further, the structure of the electron transport layer may be used as a hole blocking layer, if necessary. The hole blocking layer is preferably provided adjacent to the light emitting layer.

On the other hand, the electron blocking layer has a function of a hole transport layer in a broad sense. The electron blocking layer is made of a material that has a function of transporting holes and has a significantly small ability to transport electrons. By blocking electrons while transporting holes, the recombination probability of electrons and holes may be improved. Further, the structure of the hole transport layer may be used as an electron blocking layer, if necessary. The thickness of the hole blocking layer applied to the present invention is preferably in the range of 3 to 100 nm, and more preferably 5 to 30 nm.

(Second Electrode: Cathode)

The cathode is an electrode film which functions to supply holes to the organic functional layer group or the light emitting layer, and a metal, an alloy, an organic or inorganic conductive compound, or a mixture thereof is used. Specific examples include gold, aluminum, silver, magnesium, lithium, magnesium/copper mixtures, magnesium/silver mixtures, magnesium/aluminum mixtures, magnesium/indium mixtures, indium, lithium/aluminum mixtures, rare earth metals, oxide semiconductors such as ITO, ZnO, TiO$_2$, and SnO$_2$.

The cathode may be manufactured by forming a thin film of these conductive materials or dispersions thereof by a spin coating method, a casting method, an inkjet method, an evaporation method, or a printing method. The sheet resistance as the second electrode is preferably several hundred Ω/sq. or less, and the film thickness is usually selected in the range of 5 nm to 5 μm, and preferably 5 to 200 nm.

When the organic EL element is of a double-sided light emitting type in which the emission light L is also extracted from the cathode side, the organic EL element may be configured by selecting a cathode having good light transmittance.

(Sealing Member)

The sealing means used for sealing the organic EL element may include, for example, a method in which a flexible sealing member, a cathode, and a transparent substrate are bonded to each other with a sealing adhesive.

The sealing member may be a concave plate or a flat plate as long as it covers the display region of the organic EL element. The transparency and the electrical insulating property are not particularly limited.

Specifically, a thin film glass plate having flexibility, a polymer plate, a film, or a metal film may be cited. Examples of the glass plate include soda lime glass, barium strontium containing glass, lead glass, aluminosilicate glass, borosilicate glass, barium borosilicate glass, and quartz. Examples of the polymer plate include polycarbonate, acrylic, polyethylene terephthalate, polyether sulfide, and polysulfone. Examples of the metal film include one or more metals or alloys selected from the group consisting of stainless steel, iron, copper, aluminum, magnesium, nickel, zinc, chromium, titanium, molybdenum, silicon, germanium, and tantalum.

In the present invention, a polymer film and a metal film may be preferably used as the sealing member from the viewpoint of making the organic EL element thinner. Further, the polymer film preferably has a water vapor permeability at a temperature of $25\pm0.5°$ C. and a relative humidity of $90\pm2\%$ RH measured by a method based on JIS K 7129-1992 of $1\times10^{-3}$ μm²·24 h or less, and further preferably has an oxygen permeability measured by a method based on JIS K 7126-1987 of $1\times10^{-3}$ mL/m²·24 h·atom (1 atom: $1.01325\times10^5$ Pa) or less, and a water vapor permeability at a temperature of $25\pm0.5°$ C. and a relative humidity of $90\pm2\%$ RH of $1\times10^{-3}$ μm²·24 h or less.

An inert gas such as nitrogen or argon, or an inert liquid such as a fluorocarbon or a silicone oil may be injected into the gap between the sealing member and the display region of the organic EL element in the gas phase and the liquid phase. In addition, a gap between the sealing member and the display region of the organic EL element may be made a vacuum, or a hygroscopic compound may be sealed in the gap.

In addition, a sealing film may be provided on the transparent substrate to completely cover the light emitting functional layer unit in the organic EL element in a state where the terminal portions of the anode (3) which is the first electrode and the cathode (6) which is the second electrode in the organic EL element are exposed.

Such a sealing film is formed using an inorganic material or an organic material, and particularly, a material having a function of suppressing penetration of moisture or oxygen, for example, an inorganic material such as silicon oxide, silicon dioxide, or silicon nitride is used. Further, in order to improve the fragility of the sealing film, a multilayer structure using a film made of an organic material as well as a film made of such an inorganic material may be employed.

There are no particular limitations on the formation method of these encapsulation films. For example, the following methods may be used: a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, and a coating method.

The sealing material as described above is provided so as to expose the terminal portions of the anode (3) that is the first electrode and the cathode (6) that is the second electrode in the organic EL element, and at least cover the light emitting functional layer.

(Manufacturing Method of Organic EL Element)

As a method of manufacturing an organic EL element, an anode, an organic functional layer group 1, a light emitting layer, an organic functional layer group 2, and a cathode are laminated on a transparent base material to form a laminate.

First, a transparent base material is prepared, and a thin film made of a desired electrode material, for example, a material for an anode is formed on the transparent base material by a method such as evaporation or sputtering so as to have a thickness of 1 μm or less, preferably in the range of 10 to 200 nm, thereby forming an anode. At the same time, a connection electrode portion to be connected to the external power source is formed at the anode terminal.

Next, a hole injection layer and a hole transport layer constituting the organic functional layer group 1, a light emitting layer, and an electron transporting layer constituting the organic functional layer group 2 are stacked in this order thereon.

These layers are formed by a spin coating method, a casting method, an inkjet method, an evaporation method, or a printing method, but a vacuum deposition method or a spin coating method is particularly preferable from the viewpoint that a uniform layer is easily obtained and a pinhole is not easily generated. Furthermore, different formation methods may be applied for each layer. When a vapor deposition method is employed to form each of these layers, although the deposition conditions vary depending on the type of the compound used, it is generally desirable to appropriately select each condition within a range of a boat heating temperature of 50 to 450° C., a vacuum degree of $1\times10^{-6}$ to $1\times10^{-2}$ Pa, a deposition rate of 0.01 to 50 nm/sec, a substrate temperature of −50 to 300° C., and a layer thickness of 0.1 to 5 μm.

After forming the organic functional layer group 2 as described above, the cathode is formed on the upper portion by an appropriate forming method such as a spin coating method, a casting method, an inkjet method, a vapor deposition method, and a printing method. At this time, the cathode is patterned in a shape in which a terminal portion is drawn out from above the organic functional layer group to the peripheral edge of the transparent substrate while maintaining the insulating state with respect to the anode by the organic functional layer group.

After the formation of the cathode, the transparent base material, the anode, the organic functional layer group, the light emitting layer, and the cathode are sealed with a sealing material. That is, in a state in which the terminal portions of the anode and the cathode are exposed, a sealing material for covering at least the organic functional layer group is provided on the transparent base material.

The organic EL element may be used as an electronic device, for example, a display device, a display device, or various light emitting devices. As a light emitting device, for example, alighting device (household lighting, in-vehicle lighting), a clock or a backlight for liquid crystal, a sign advertisement, a traffic signal, a light source of an optical storage medium, a light source of an electrophotographic copying machine, a light source of an optical communication processor, and a light source of a light sensor may be cited, but not limited thereto. In particular, it can be effectively used in applications as a backlight of a liquid crystal display device and a light source for illumination.

(5) Means for Forming Electronic Device

Generally, the constituent members including the electronic device may be formed by a known method such as a vacuum deposition method, a spin coating method, a casting method, an LB (Langmuir Blodgett) method, or an inkjet printing method as described above for the organic EL device. However, in the present invention, although there are a spin coating method, a casting method, an inkjet printing method, a printing method, a die coating method, a blade coating method, a roll coating method, a spray coating method, a curtain coating method, or an LB (Langmuir-Blodgett) method, from the viewpoint of easily obtaining a uniform thin film and high productivity, a method having high suitability for a roll-to-roll method such as a die coating method, a roll coating method, an inkjet printing method and a spray coating method is preferable.

Among them, forming by a wet coating method such as an inkjet printing method is a preferable embodiment from the viewpoint of productivity and processability.

(5.1) Inkjet Printing Method

Hereinafter, an example of a forming method by an inkjet printing method will be described with reference to the drawings.

FIG. 1 is a schematic diagram illustrating an example of a method of forming an electronic device using an inkjet printing method, which is an example of a wet coating method.

Figure 2:
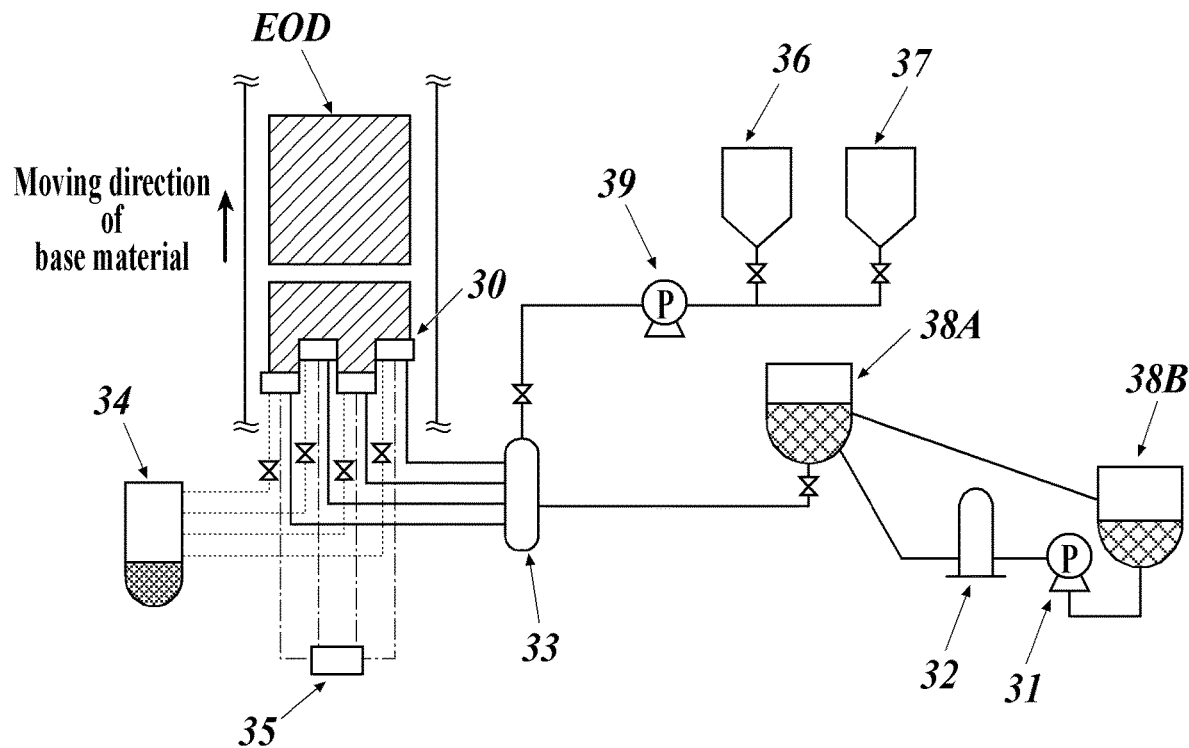
FIG. 2 is a schematic diagram illustrating an example of a method of coating an electronic device using an inkjet printing method.

FIG. 2 illustrates an example of a method of discharging an ink containing the composition for an electronic device of the present invention onto a base material 1 by using a wet coating apparatus using an inkjet head 30.

As illustrated in FIG. 1, as an example, while continuously conveying the base material 1, the ink containing the electronic device forming material by the inkjet head 30 is sequentially ejected as ink droplets to form, for example, an electron transport layer which is an electronic device (electron-only device: denoted as EOD in the figure).

The inkjet head 30 applicable to the method of manufacturing an organic EL device of the present invention is not particularly limited. For example, it may be a shear mode type (piezo type) head which has a vibration plate having a piezoelectric element in the ink pressure chamber, and an ink liquid is discharged by a pressure change of an ink pressure chamber by the vibration plate, or a thermal type head in which a heating element is provided, and ink liquid is discharged from a nozzle by a rapid volume change due to film boiling of an ink liquid due to heat energy from the heating element.

The inkjet head 30 is connected to a supply mechanism of an ink liquid for injection. The ink liquid is supplied by a tank 38A. In this example, the tank liquid level is kept constant so that the ink liquid pressure in the inkjet head 30 is always kept constant. In this method, the ink liquid is overflowed from the tank 38A and returned to a tank 38B under natural flow. The supply of the ink liquid from the tank 38B to the tank 38A is performed by a pump 31, and is controlled so that the liquid level of the tank 38A is stably constant in accordance with the injection condition.

The ink liquid is returned from a pump 31 to the tank 38A after passing through a filter 32. Thus, the ink liquid is preferably passed at least once through a filter medium having an absolute or quasi-absolute filtration accuracy of 0.05 to 50 μm before being supplied to the inkjet head 30.

Further, in order to perform a wash operation or a liquid filling operation of the inkjet head 30, the ink liquid may be forcibly supplied from a tank 36 and the cleaning solvent may be forcibly supplied from a tank 37 to the inkjet head 30 by a pump 39. Such tank pumps may be divided into a plurality with respect to the inkjet head 30, a branch of the pipe may be used, or a combination thereof. In FIG. 2, a piping branch 33 is used. Further, in order to sufficiently remove the air in the inkjet head 30, the ink liquid may be extracted from the air extraction pipe described below and sent to a waste liquid tank 34 while forcibly sending the ink liquid from the tank 36 to the inkjet head 30 by the pump 39.

FIG. 3 is a schematic external view illustrating an example of the structure of an inkjet head applicable to an ink jet printing method.

Figure 3A:
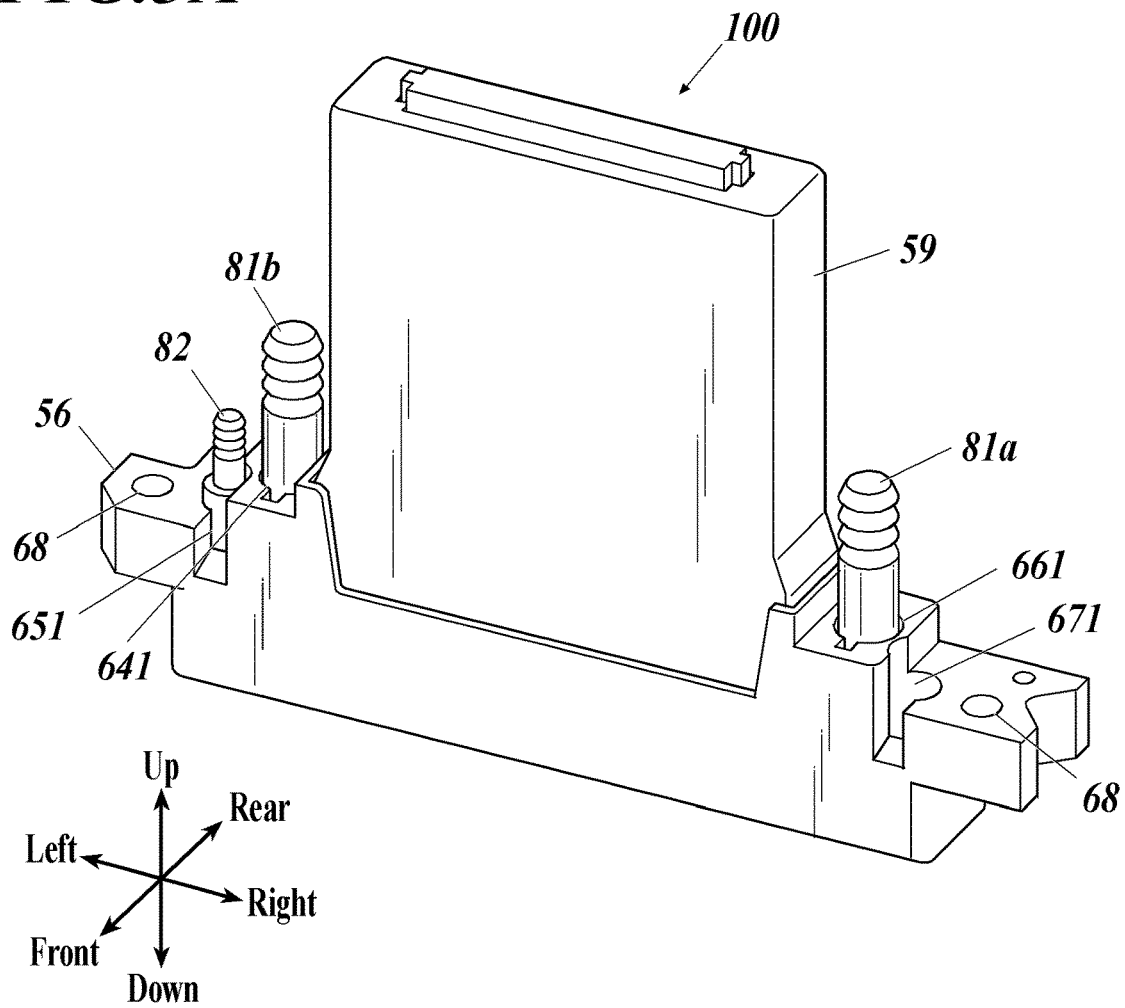
FIG. 3A is a schematic perspective view illustrating an example of the structure of an inkjet head applicable to an inkjet printing method.
Figure 3B:
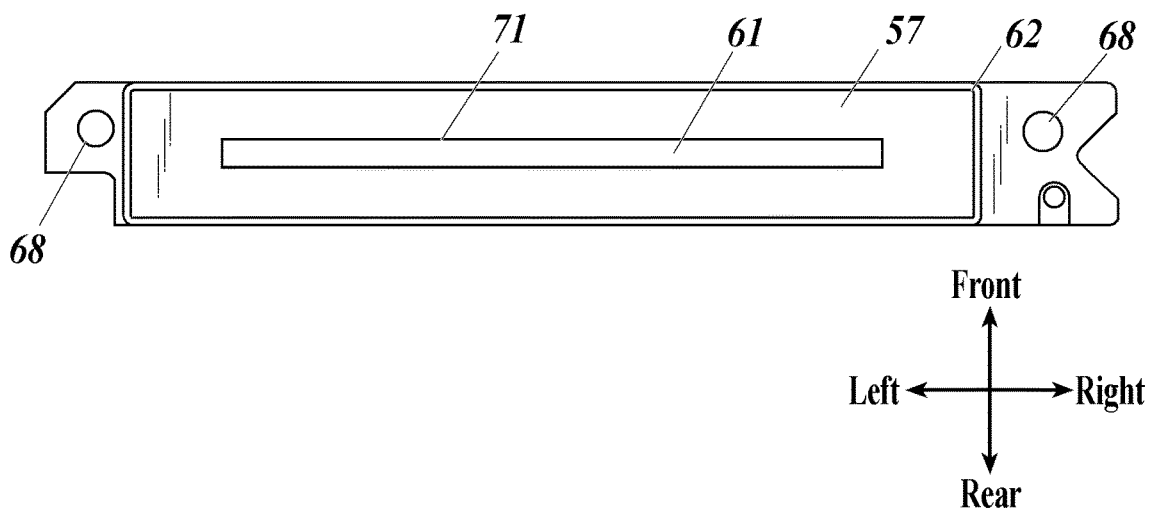
FIG. 3B is a bottom view illustrating an example of the structure of an inkjet head applicable to an inkjet printing method.

FIG. 3A is a schematic perspective view showing an inkjet head 100 applicable to the present invention embodiment, and FIG. 3B is a bottom view of the inkjet head 100.

An inkjet head 100 applicable to the present invention is mounted on an inkjet printer (not shown), and includes: ahead tip for ejecting ink from a nozzle; a wiring board on which the head chip is disposed; a drive circuit board connected to the wiring board via a flexible board; a manifold for introducing ink to a channel of the head chip via a filter; a case 56 in which the manifold is housed inside; a cap receiving plate 57 attached so as to block a bottom surface opening of the case 56; first and second joints 81a and 81b attached to a first ink port and a second ink port of the manifold; a third joint 82 attached to a third ink port of the manifold; and a cover member 59 attached to the case 56. Further, mounting holes 68 for mounting the case 56 to the printer main body side are respectively formed.

In addition, the cap receiving plate 57 shown in the drawing 3B is formed in a substantially rectangular plate shape whose outer shape is long in the left-right direction corresponding to the shape of the cap receiving plate mounting portion 62, and a long nozzle opening portion 71 is provided in the left-right direction in order to expose the nozzle plate 61 in which a plurality of nozzles are arranged in the substantially central portion thereof. Further, with respect to the specific structure inside the inkjet head shown in FIG. 3A, for example, it is possible to refer to FIG. 2 described in JP-A-2012-140017.

FIG. 3 shows a typical example of an inkjet head, but in addition, for example, an inkjet head having a configuration described in the following documents may be appropriately selected and applied: JP-A 2012-140017, JP-A 2013-010227, JP-A 2014-058171, JP-A 2014-097644, JP-A 2015-142979, JP-A 2015-142980, JP-A 2016-002675, JP-A 2016-002682, JP-A 2016-107401, JP-A 2017-109476, and JP-A 2017-177626.

(Preparation of Ink)

In the method for manufacturing an electronic device of the present invention, in addition to the method in which each of the above configuration materials is directly used as an ink for an electronic device, in order to make an ink suitable for an inkjet printing method, the constituent materials are dissolved in an ink solvent or the like to prepare an ink for an electronic device, and various functional additives may be contained.

(5.2) Ink Solvent

When the ink for an electronic device according to the present invention is prepared, various known organic solvents may be used in addition to the component A, the component B, and the component C according to the present invention.

Examples of the organic solvent applicable to the ink of the present invention include: polyhydric alcohol ethers (e.g., ethylene glycol monomethyl ether, ethylene glycol monoethyl ether, ethylene glycol monobuty ether, diethylene glycol monomethyl ether, diethylene glycol monomethyl ether, diethylene glycol monobutyl ether, propylene glycol monomethyl ether, propylene glycol monobutyl ether, ethylene glycol monobutyl ether Methyl ether acetate, triethylene glycol monomethyl ether, triethylene glycol monoethyl ether, triethylene glycol monobutyl ether, ethylene glycol monophenyl ether, propylene glycol monophenyl ether), amides (e.g., formamide, N,N-dimethylformamide, N,N-dimethylacetamide), heterocycles (e.g., 2-pyrrolidone, N-methyl-2-pyrrolidone, cyclohexylpyrrolidone, 2-oxazolidone, 1,3-dimethyl-2-imidazolidinone), sulfoxides (e.g., dimethyl sulfoxide), sulfones (e.g., sulfolanes), urea, acetonitrile, and acetone.

(5.3) Other Additives

In the ink for an electronic device of the present invention, various well-known additives may be appropriately selected and used within a range that does not impair the intended effects of the present invention depending on the purpose of ejection stability, print head compatibility, storage stability, image storability, and other performance improvements. Examples thereof include: solvents, viscosity modifiers, surface tension modifiers, resistivity modifiers, film formers, dispersants, surfactants, UV absorbers, antioxidants, anti-fading agents, fungicides, and rust inhibitors.

(5.4) Composition of Each Component of the Composition for Electronic Device

A preferred embodiment of the composition for electronic devices of the present invention is to use in a composition for forming an electron transport layer, as an example. From the viewpoint of the good solubility of each component in the composition, the good film quality of the coating film obtained from the composition for forming the electron transport layer, the good ejection property when the ink jet printing method is used, and the good electrical properties of the organic element having the electron transport layer produced by using the composition, it is preferable that the component A is 90.0 to 99.9 mass % with respect to the total mass of the composition for forming the electron transport layer, the component B is 0.1 to 10.0 mass % with respect to the total mass of the composition for forming the electron transport layer, the component C is 0.001 to 10.0 mass % with respect to the total mass of the composition for forming the electron transport layer, and the total mass of the component B and the component C is 10.0 mass % or less with respect to the total mass of the composition for forming the electron transport layer.

More preferably, the component A is 95.0 to 99.9 mass % based on the total mass of the composition for forming the electron transport layer, the component B is 0.1 to 5.0 mass % based on the total mass of the composition for forming the electron transport layer, the component C is 0.1 to 5.0 mass % based on the total mass of the composition for forming the electron transport layer, and the total mass of the component B and the component C is 5.0 mass % or less based on the total mass of the composition for forming the electron transport layer.

More preferably, the component A is 98.0 to 99.9 mass % based on the total mass of the composition for forming the electron transport layer, the component B is 0.1 to 2.0 mass % based on the total mass of the composition for forming the electron transport layer, and the component C is 0.1 to 2.0 mass % based on the total mass of the composition for forming the electron transport layer. The total mass of the component B and the component C is 2.0 mass % or less with respect to the total mass of the electron transport layer forming composition.

EXAMPLES

Hereinafter, the present invention will be described in detail with reference to examples, but the present invention is not limited thereto. In the examples, the indication of "parts" or "%" is used, but unless otherwise specified, it represents "parts by mass" or "mass %".

The abbreviations in the examples and Tables I to IV represent the following compounds (solvents).

TFPO: 1H,1H,3H-Tetrafluoropropanol,
HFIP: Hexafluoro-2-propanol,
HFBO: 1H,1H-Heptafluoro-1-butanol,
TFAMH: Trifluoroacetaldehyde methylhemiacetal,
TFB: 1,2,4,5-Tetrafluorobenzene,
OFPO: 1H,1H,5H-Octafluoro-1-pentanol,
DFHO: 1H,1H,7H-Dodecafluoro-1-heptanol,
PFBFO: 2,3,4,5,6-Pentafluorobenzophenone,
EGMBE: Ethylene glycol monobutyl ether Compounds B1 to B20 and Compounds C1 to C4 are the compounds indicated below.

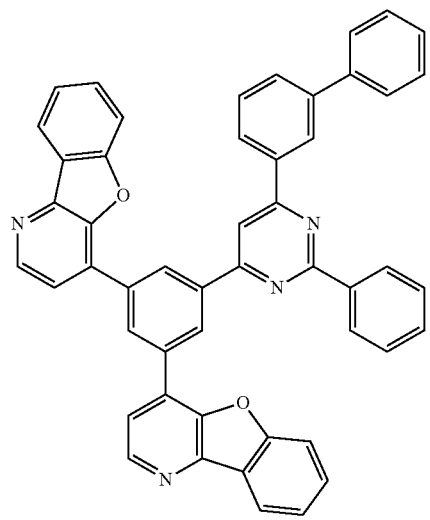

B1

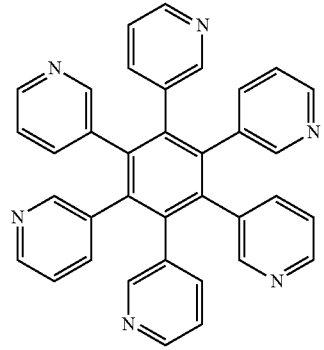

B2

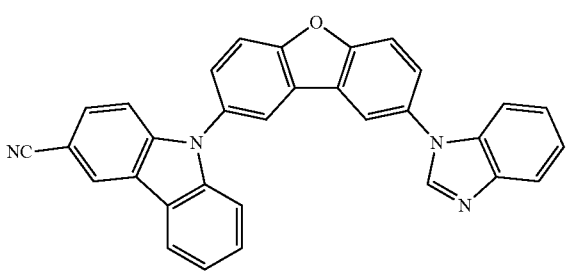

B3

B4
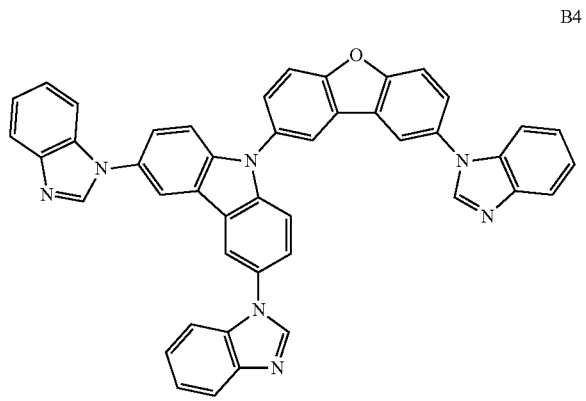
B5
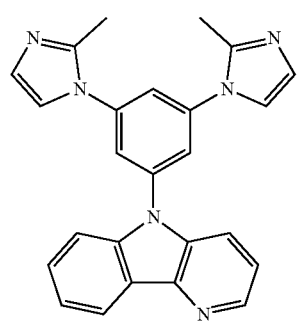
B6
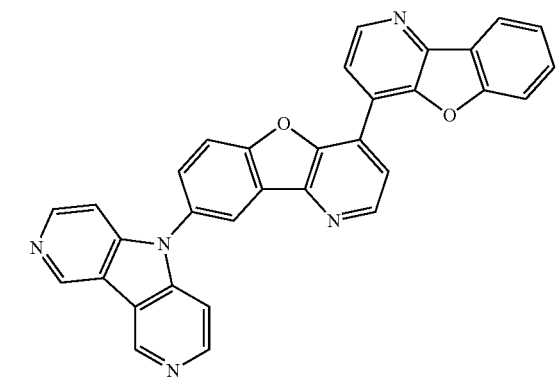
B7
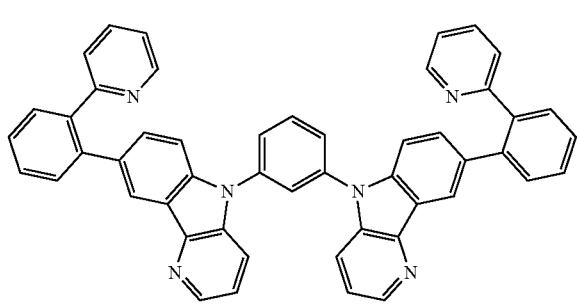
B8
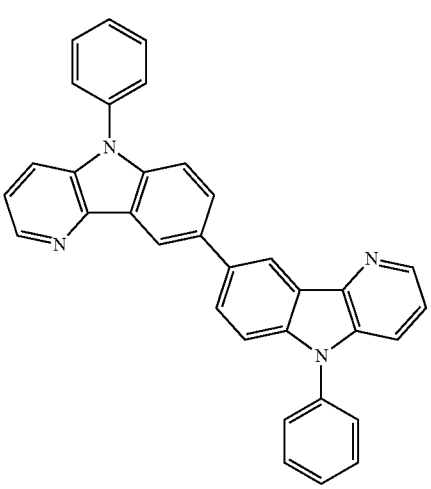
B9
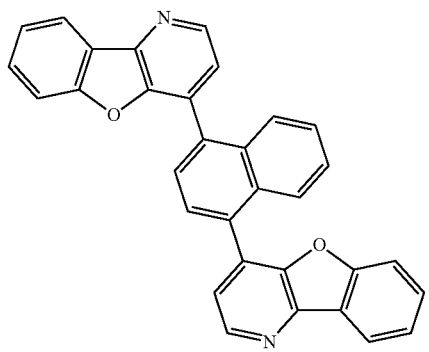
B10
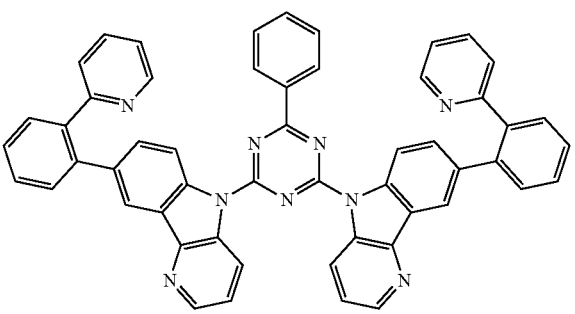
B11
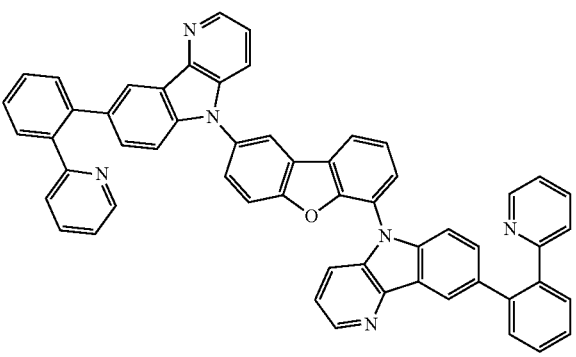

B12
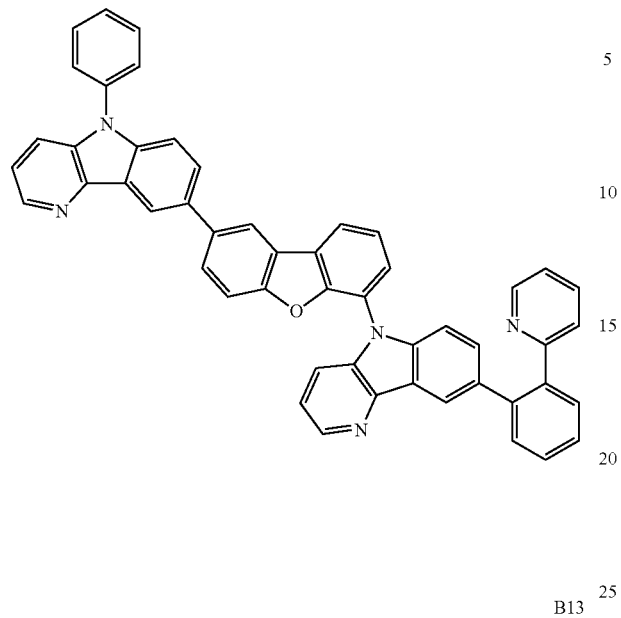
B16
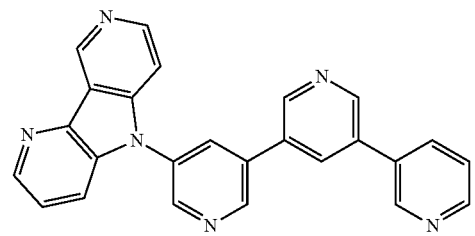
B17
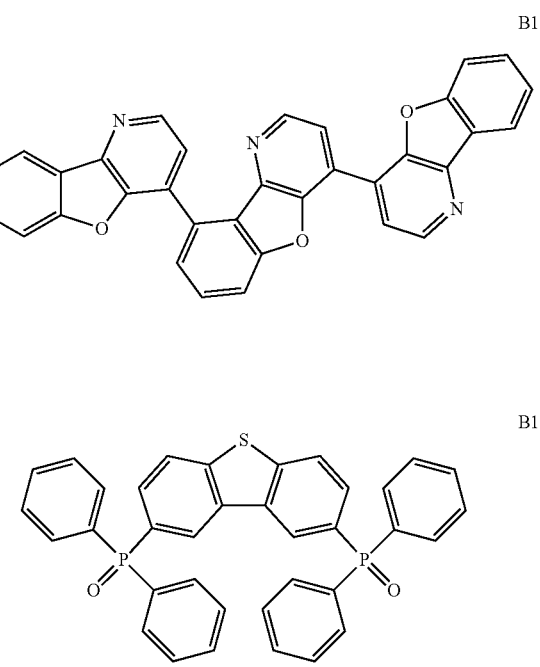
B13
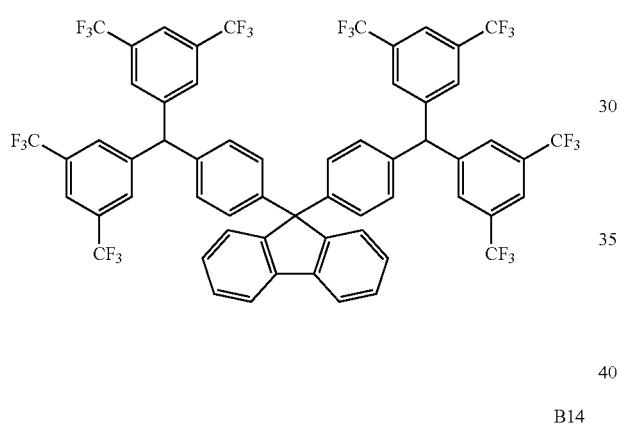
B18
B14
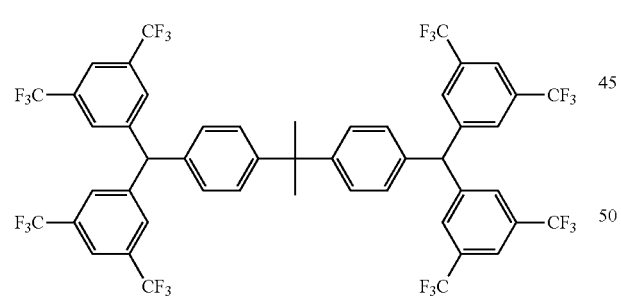
B19
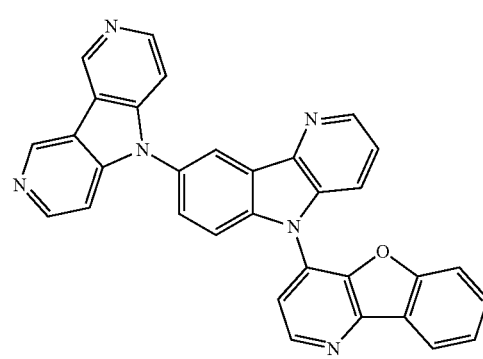
B15
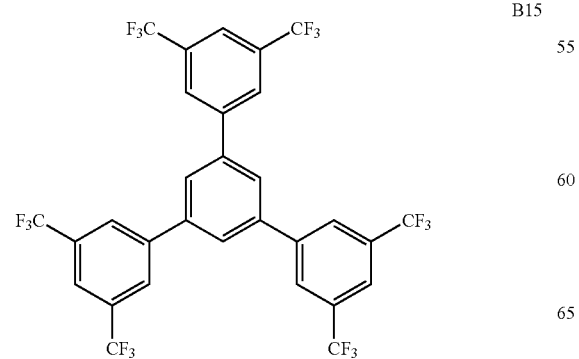
B20
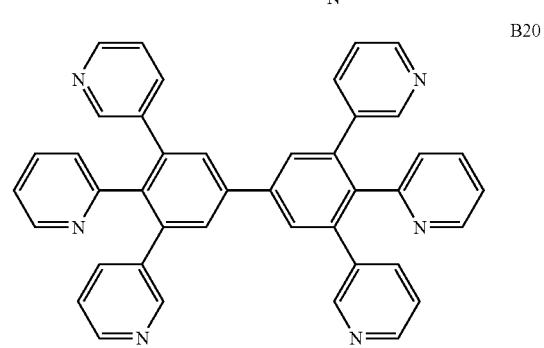

-continued

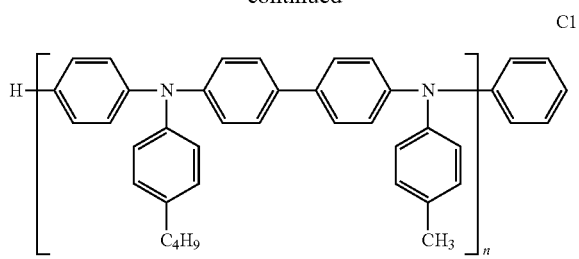

C1

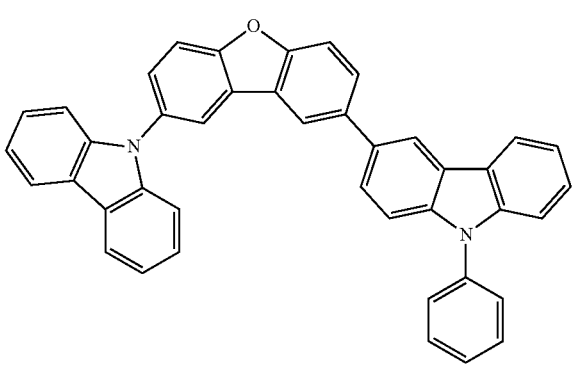

C2

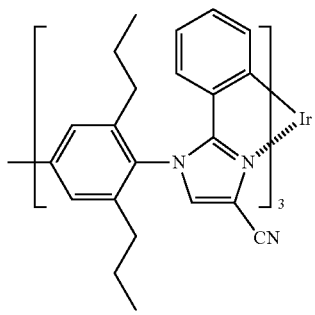

C3

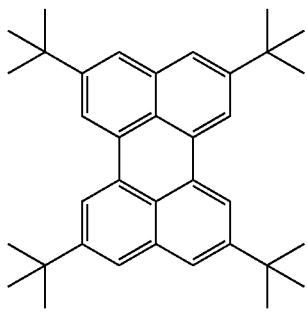

C4

Example 1

In Example 1, a thin film was formed from the composition for an electronic device of the present invention, and the residual amount of the fluorine-containing solvent was evaluated.

<Formation of Evaluation Monolayer 1-1>

A quartz substrate having a length of 10 mm, a width of 10 mm, and a thickness of 0.7 mm was ultrasonically cleaned with isopropyl alcohol, dried with dry nitrogen gas, and UV ozone cleaning was performed for 5 minutes.

Compound B1 was dissolved in the solvent TFPO at a concentration of 1 mass % in a nitrogen-atmosphere as a component A. The obtained TFPO solution was used as an ink to form a 50 nm-thick film on the quartz substrate by an inkjet printing method shown in FIG. 1 and FIG. 2, and the quartz substrate was dried at 120° C. for 30 minutes in a nitrogen-gas atmosphere to form an evaluation monolayer 1-1.

<Formation of Evaluation Monolayers 1-2 to 1-31>

The evaluation monolayer 1-2 was formed in the same manner as used for the formation of the evaluation monolayer 1-1 except that Compound B1 was replaced with Compound B2 and TFPO was replaced with a mixed solution of HFIP and acetonitrile (HFIP/acetonitrile=93 volume %/7 volume %.

Further, the evaluation monolayers 1-3 to 1-31 were formed in the same manner as used for the formation of the evaluation monolayers 1-2 except that Compound B2 and the solvent were replaced with the compound or the solvent described in Table I.

In the table, Compound 1 used in Examples 1-6 to 1-31 is a component B according to the present invention, and Solvent 1 is a component A according to the present invention.

<Evaluation of the Residual Amount of Fluorine-Containing Solvent in Evaluation Monolayer>

The amount of the solvent present in the coating may be determined by a temperature rising desorption gas analysis method. The temperature rising desorption gas analysis method is a method for identifying an adsorption chemical species on a solid surface by measuring a change in pressure due to a desorbing chemical species or a change in an amount of a desorbing chemical species while increasing a temperature of a solid surface at a constant rate, and obtaining information on an adsorption amount, an adsorption state, and a desorption process from the surface. Specifically, a sample having a 1 $cm^2$ square was introduced into an analysis chamber using a temperature rising desorption analyzer TDS-1200 manufactured by Electronic Sciences Co., Ltd., and mass spectrum corresponding to the solvent was monitored by a quadrupole mass spectrometer while the temperature was raised at 60° C./min by an infra-red heater, and the solvent content was calculated from the detected signal intensities.

Here, when the residual amount of the fluorine-containing solvent of the evaluation single film 1-1 was set to the relative value reference value of 1.00, the ratio of the residual amount of the fluorine-containing solvent of each evaluation single film was calculated as a relative value. A smaller value than 1.00 means that the residual amount of the fluorine-containing solvent is smaller.

TABLE I

| Example 1 | Example 2 | Compound 1 | Solvent 1 | Solvent 2 | Volume ratio | Residual amount of fluorine-containing solvent | Relative drive voltage |
|---|---|---|---|---|---|---|---|
| Comparison 1-1 | Comparison 2-1 | B1 | TFPO | — | — | 1.00 | 1.00 |
| Comparison 1-2 | Comparison 2-2 | B2 | HFIP | Acetonitrile | 93:7 | 0.99 | 0.94 |
| Comparison 1-3 | Comparison 2-3 | B3 | HFBO | — | — | 1.02 | 1.06 |
| Comparison 1-4 | Comparison 2-4 | B4 | TFAMH | — | — | 1.01 | 1.01 |
| Comparison 1-5 | Comparison 2-5 | B5 | TFPO | — | — | 1.05 | 1.05 |
| Example 1-6 | Example 2-6 | A2 | TFAMH | — | — | 0.37 | 0.55 |
| Example 1-7 | Example 2-7 | A8 | TFPO | — | — | 0.40 | 0.54 |
| Example 1-8 | Example 2-8 | A11 | HFIP | Acetonitrile | 93:7 | 0.45 | 0.70 |
| Example 1-9 | Example 2-9 | A20 | TFPO | — | — | 0.36 | 0.54 |
| Example 1-10 | Example 2-10 | A24 | TFPO | — | — | 0.40 | 0.55 |
| Example 1-11 | Example 2-11 | A30 | TFB | — | — | 0.42 | 0.54 |
| Example 1-12 | Example 2-12 | A34 | TFAMH | — | — | 0.36 | 0.60 |
| Example 1-13 | Example 2-13 | A35 | HFBO | — | — | 0.39 | 0.63 |
| Example 1-14 | Example 2-14 | A39 | HFIP | Acetonitrile | 93:7 | 0.38 | 0.58 |
| Example 1-15 | Example 2-15 | A41 | TFAMH | — | — | 0.42 | 0.52 |
| Example 1-16 | Example 2-16 | A45 | TFB | — | — | 0.36 | 0.47 |
| Example 1-17 | Example 2-17 | A51 | TFAMH | — | — | 0.40 | 0.55 |
| Example 1-18 | Example 2-18 | A52 | TFB | — | — | 0.38 | 0.49 |
| Example 1-19 | Example 2-19 | A60 | TFAMH | — | — | 0.44 | 0.63 |
| Example 1-20 | Example 2-20 | A64 | HFBO | — | — | 0.44 | 0.70 |
| Example 1-21 | Example 2-21 | A75 | HFIP | Acetonitrile | 93:7 | 0.38 | 0.48 |
| Example 1-22 | Example 2-22 | A81 | HFBO | — | — | 0.41 | 0.64 |
| Example 1-23 | Example 2-23 | A89 | TFPO | — | — | 0.39 | 0.50 |
| Example 1-24 | Example 2-24 | A91 | TFB | — | — | 0.38 | 0.49 |
| Example 1-25 | Example 2-25 | A114 | TFAMH | — | — | 0.40 | 0.52 |
| Example 1-26 | Example 2-26 | A123 | HFIP | Acetonitrile | 93:7 | 0.36 | 0.54 |
| Example 1-27 | Example 2-27 | A125 | TFPO | — | — | 0.40 | 0.66 |
| Example 1-28 | Example 2-28 | A133 | HFIP | — | — | 0.42 | 0.50 |
| Example 1-29 | Example 2-29 | A137 | HFBO | — | — | 0.36 | 0.55 |
| Example 1-30 | Example 2-30 | A146 | TFB | — | — | 0.38 | 0.68 |
| Example 1-31 | Example 2-31 | A150 | HFBO | — | — | 0.44 | 0.62 |

As shown in Table I, it was found that the residual ratio of the fluorine-containing solvent was clearly smaller in the evaluation single films 1-6 to 1-31 containing the π-conjugated boron compound according to the present invention than in the comparative example. It was also found that the residual ratio was low regardless of the connecting site or substituent of the π-conjugated boron material.

Example 2

In Example 2, the drive voltage of a single-charge device (abbreviated as an electron-only device (EOD)) in which a coating film formed using a composition containing a π-conjugated boron compound and a fluorine-containing solvent according to the present invention was incorporated was evaluated.
<Preparation of Evaluation EOD 2-1>
(Formation of Anode)

On a glass substrate having a length of 50 mm, a width of 50 mm, and a thickness of 0.7 mm, ITO (indium tin oxide) was formed to a thickness of 120 nm and patterned to form an anode made of an ITO transparent electrode. Thereafter, ultrasonic cleaning was performed with isopropyl alcohol, dried with dry nitrogen gas, and UV ozone cleaning was performed for 5 minutes.
(Formation of Hole Blocking Layer)

Next, the substrate on which the anode was formed was fixed to a substrate holder of a commercially available vacuum deposition apparatus.

A resistance heating boat for deposition in the vacuum deposition apparatus was filled with an optimal amount of calcium. The resistance heating boat for evaporation was made of tungsten.

After reducing the degree of vacuum to $1 \times 10^{-4}$ Pa, calcium was evaporated to a thickness of 5 nm to form a hole blocking layer.
(Formation of Electron Transport Layer)

Next, the evaluation monolayer 1-1 was formed on the substrate on which the hole blocking layer was formed by the inkjet printing method described in Example 1 under a nitrogen environment to obtain an electron transport layer.
(Cathode and Sealing)

Next, after forming cathodes by evaporating 100 nm of aluminum, the non-emitting surface of the EOD was covered with a glass case, and a sealing agent using an epoxy-based photo-curing adhesive (Luxtrack LC0629B manufactured by Toa Synthesis Co., Ltd.) was provided in a peripheral portion of the glass case covering the EOD, which was contacted with the glass substrates on which the EOD was manufactured. Then, the sealing material was superposed on the cathode side of the EOD to be in close contact with the glass substrate. Thereafter, UV-light was irradiated from the glass case side to cure the sealing material, thereby sealing the EOD to produce an evaluation EOD 2-1. Note that the sealing operation in the glass case was performed in a glove box (in an atmosphere of a high purity nitrogen gas having a purity of 99.999% or more) under a nitrogen atmosphere without contacting the EOD with the atmosphere.
<Preparation of Evaluation EOD 2-2 to 2-31>

The evaluation EOD 2-2 was prepared in the same manner as used for the preparation of the evaluation EOD 2-1 except that Compound B1 was replaced with Compound B2, and TFPO was replaced with a mixed solution of HFIP:acetonitrile (HFIP/acetonitrile=93 volume %/7 volume %).

In addition, the evaluation EOD 2-3 to 2-31 were prepared in the same manner as used for the preparation of the evaluation EOD 2-2 except that Compounds B2 and the solvents were replaced by the compounds or solvents described in Table I.
<Evaluation of Drive Voltage of Evaluation EOD>
Here, the ratio of the drive voltage of each evaluation EOD was calculated as a relative value when the evaluation EOD2-1 was set to a relative value of 1.00 using the voltage of each evaluation EOD at $1\times10^{-4}$ mA as a drive voltage. A smaller than 1.00 means better drive voltage.

As shown in Table I, it was found that the evaluation EOD 2-6 to 2-31 containing the π-conjugated boron compound according to the present invention exhibited a clear decrease in the drive voltage with a decrease in the residual amount of the fluorine-containing solvent.

As for the cathode, a similar experiment was conducted by changing aluminum to silver, but the drive voltage has a similar tendency, confirming a decrease in the drive voltage.

Example 3

In Example 3, the stability of a composition for an electronic device containing a π-conjugated boron compound, a fluorine-containing solvent, and a component C according to the present invention was evaluated.
<Preparation of Evaluation Composition 3-1>
After heating at 85° C. for 15 minutes in a nitrogen atmosphere, the mixture was returned to room temperature to prepare the following evaluation composition 3-1.
(Evaluation Composition 3-1)
Compound B6: 10 parts by mass
HFBO: 2000 parts by mass
The evaluation composition 3-2 was prepared in the same manner as used for the preparation of the evaluation composition 3-1 except that Compound B6 was replaced with Compound B7, and HFBO was replaced with TFPO.

Furthermore, the evaluation compositions 3-3 to 3-25 were prepared in the same manner as used for the preparation of the evaluation composition 3-2 except that Compound B7 and TFPO were replaced with the compounds or solvents listed in Table II. When there were a plurality of compounds, the total amount of the compounds was set to 10 parts by mass, and the mass ratio was set to the value shown in Table II. When there were a plurality of solvents, the total amount of the solvents was set to 2000 parts by mass, and the volume ratio was set to the value shown in Table II.

In Table II, Compound 2 and Solvent 2 are a component C according to the present invention.
<Evaluation of Liquid Stability>
After the above-mentioned composition for evaluation was measured immediately after preparation using a viscometer (manufactured by VM-10A (made by SEKONIC Co., Ltd.), the composition was hermetically sealed and stored at 60° C. After 2 days, 5 days, 10 days, and 15 days, the solution was returned to room temperature (25° C.), and then the viscosity of the liquid was measured after confirming that there was no precipitate. The viscosity was evaluated as I when no precipitation occurred and the viscosity changed by ±1.5 mPa·s or more from the viscosity measured before storage after 2 days of storage, it was evaluated as II after 5 days, III after 10 days, IV after 15 days, and V after 15 days when the viscosity change was within ±1.5 mPa·s %. It should be noted that the more the liquid stability is from I to V, the better the storage stability of the liquid is.
<Measurement of Hansen Solubility Parameter (HSP) Distance>

The Hansen solubility parameter (HSP) distance ($Ra_1$) between all solvents in the composition for electronic devices and all solutes in the composition for electronic devices, and the Hansen solubility parameter (HSP) distance ($Ra_2$) between the Component A and the Component B were measured in the following manner.

The Forcite module of Material Studio ver. 8 was used to calculate the dispersion term and the polarity term for the HSPs of the solvents and solutes. When there area plurality of solvents, the HSP distance was obtained by multiplying the ratio corresponding to each material according to the volume ratio of the solvents. When a π-conjugated boron material and a Lewis basic material were used, their coordination complex was calculated as a solute.

TABLE II

| Example 3 | Example 4 | Compound 1 | Compound 2 | Mass ratio | Solvent 1 | Solvent 2 | Volume ratio | $R_{a1}$ | $R_{a2}$ | Liquid stability | Relative drive voltage |
|---|---|---|---|---|---|---|---|---|---|---|---|
| Comparison 3-1 | Comparison 4-1 | B6 | — | — | HFBO | — | — | 13.3 | — | II | 1.00 |
| Comparison 3-2 | Comparison 4-2 | B7 | — | — | TFPO | — | — | 14.3 | — | I | 1.03 |
| Comparison 3-3 | Comparison 4-3 | B8 | — | — | DFHO | — | — | 10.2 | — | III | 1.10 |
| Comparison 3-4 | Comparison 4-4 | B9 | — | — | OFPO | — | — | 13.2 | — | II | 0.99 |
| Example 3-5 | Example 4-5 | A3 | — | — | HFBO | — | — | 12.5 | 12.5 | I | 0.61 |
| Example 3-6 | Example 4-6 | A6 | — | — | DFHO | — | — | 13.5 | 13.5 | I | 0.66 |
| Example 3-7 | Example 4-7 | A51 | — | — | TFPO | — | — | 15.0 | 15.0 | I | 0.66 |
| Example 3-8 | Example 4-8 | A55 | — | — | OFPO | — | — | 14.5 | 14.5 | I | 0.59 |
| Example 3-9 | Example 4-9 | A4 | B10 | 70:30 | OFPO | — | — | 11.7 | 12.4 | III | 0.62 |
| Example 3-10 | Example 4-10 | A6 | — | — | DFHO | Cyclopentane | 50:50 | 11.9 | 13.5 | II | 0.55 |
| Example 3-11 | Example 4-11 | A7 | — | — | DFHO | o-Xylene | 70:30 | 11.8 | 14.5 | II | 0.67 |
| Example 3-12 | Example 4-12 | A15 | B11 | 70:30 | HFBO | — | — | 12.0 | 16.8 | III | 0.57 |
| Example 3-13 | Example 4-13 | A16 | — | — | HFBO | Toluene | 50:50 | 12.2 | 18.1 | II | 0.51 |
| Example 3-14 | Example 4-14 | A17 | — | — | DFHO | Hexane | 30:70 | 12.2 | 15.1 | II | 0.57 |
| Example 3-15 | Example 4-15 | A26 | — | — | OFPO | Tetralin | 60:40 | 9.2 | 13.9 | III | 0.65 |
| Example 3-16 | Example 4-16 | A27 | B12 | 66:34 | TFPO | — | — | 9.9 | 14.8 | IV | 0.69 |
| Example 3-17 | Example 4-17 | A33 | B13 | 60:40 | OFPO | — | — | 11.1 | 15.7 | II | 0.62 |
| Example 3-18 | Example 4-18 | A36 | B14 | 70:30 | HFBO | — | — | 11.0 | 12.3 | II | 0.65 |
| Example 3-19 | Example 4-19 | A43 | — | — | OFPO | Mesitylene | 70:30 | 9.7 | 13.7 | III | 0.59 |
| Example 3-20 | Example 4-20 | A46 | — | — | TFPO | Benzene | 85:15 | 11.2 | 13.9 | II | 0.69 |
| Example 3-21 | Example 4-21 | A48 | B15 | 60:40 | TFPO | — | — | 12.2 | 14.8 | II | 0.60 |

TABLE II-continued

| Example 3 | Example 4 | Compound 1 | Compound 2 | Mass ratio | Solvent 1 | Solvent 2 | Volume ratio | $R_{a1}$ | $R_{a2}$ | Liquid stability | Relative drive voltage |
|---|---|---|---|---|---|---|---|---|---|---|---|
| Example 3-22 | Example 4-22 | A57 | B16 | 66:34 | TFPO | — | — | 12.1 | 13.0 | III | 0.62 |
| Example 3-23 | Example 4-23 | A62 | — | — | HFBO | Methylcyclohexane | 80:20 | 8.7 | 12.0 | IV | 0.62 |
| Example 3-24 | Example 4-24 | A65 | B17 | 60:40 | OFPO | — | — | 9.8 | 12.3 | IV | 0.52 |
| Example 3-25 | Example 4-25 | A66 | B18 | 50:50 | DFHO | — | — | 10.5 | 16.8 | III | 0.50 |

As shown in Table II, the solute or solvent is selected so as to shorten the HSP distance as the component C according to the present invention, thereby improving the liquid stability. In addition, it was found that the liquid stability is further improved for materials with $Ra_1$ below 10. In addition, when a material containing nitrogen atoms is used as the solute, it is understood that the liquid stabilities are drastically improved even if $Ra_1$ of the material is not less than 10.

Example 4

In Example 4, the drive voltage of an electron-only device (EOD) incorporating a coating film formed using a composition containing a π-conjugated boron compound according to the present invention, a fluorine-containing solvent, and a component C according to the present invention was evaluated. The residual amount of the fluorine-containing solvent as shown in Example 1 was also evaluated at the same time, and it was confirmed that the residual amount of the fluorine-containing solvent was approximately the same as that in Example 1 in the composition containing the π-conjugated boron compound.

<Preparation of Evaluation EOD 4-1 to 4-25>

The evaluation EOD 4-1 to 4-25 were prepared in the same manner as used for the preparation of evaluation EOD 2-1 in Example 2 except that the electron transport layers were changed the layers containing the compounds and solvents shown in Table II, and the coating method was performed by an inkjet print method.

<Evaluation of Drive Voltage of Evaluation EOD>

Here, the ratio of the drive voltage of each evaluation EOD was calculated as a relative value when the evaluation EOD2-1 was set to a relative value of 1.00 using the voltage of each evaluation EOD at $1 \times 10^{-4}$ mA as a drive voltage. A smaller than 1.00 means better drive voltage.

As shown in Table II, in the EOD containing the π-conjugated boron compound, a decrease in the relative drive voltage is observed in the same manner as in Example 2. In the evaluation compositions 3-5 to 3-8, the stability of the solution is I, but by devising the process from the preparation of the solution to the film formation, the level is tolerated for practical use. Therefore, the evaluation compositions 3-9 to 3-25 are compatible with both the drive voltage and the liquid stability in comparison with the evaluation compositions 3-1 to 3-4 of the comparative examples. Therefore, as also shown above, by containing the component C of the present invention in the evaluation compositions 3-5 to 3-8, the liquid stability was improved and the drive voltage was also improved.

Example 5

In Example 5, the liquid stability of a composition containing a π-conjugated boron compound as a component B according to the present invention, a fluorine-containing solvent as a component A according to the present invention, and a component C according to the present invention was evaluated. As the component C according to the present invention, one having an atom having an unshared electron pair, one in which the atom is nitrogen, or an alcohol solvent is used. The residual amount of the fluorine-containing solvent as shown in Example 1 and the drive voltage as shown in Example 2 were also evaluated. It was confirmed that the residual amount of the fluorine-containing solvent and the drive voltage of the composition containing the π-conjugated boron compound were approximately the same as those of Examples 1 and 2.

<Preparation of Evaluation Compositions 5-1 to 5-23>

The evaluation compositions 5-1 to 5-23 were prepared in the same manner as used for the preparation in Example 3 except that the compounds and solvents were replaced by those listed in Table III. When there were a plurality of compounds, the total amount of the compounds was set to 10 parts by mass, and the mass ratio was set to the value shown in Table III. When there were a plurality of solvents, the total amount of the solvents was set to 2000 parts by mass, and the volume ratio was set to the value shown in Table III.

In Table III, Compound 2 and Solvent 2 of Examples 5-1 to 5-23 are a component C according to the present invention.

<Evaluation of Liquid Stability>

After the above-mentioned composition for evaluation was measured immediately after preparation using a viscometer (manufactured by VM-10A (made by SEKONIC Co., Ltd.), the composition was hermetically sealed and stored at 60° C. After 2 days, 5 days, 10 days, and 15 days, the solution was returned to room temperature (25° C.), and then the viscosity of the liquid was measured after confirming that there was no precipitate. The viscosity was evaluated as I when no precipitation occurred and the viscosity changed by ±1.5 mPa·s or more from the viscosity measured before storage after 2 days of storage, it was evaluated as II after 5 days, III after 10 days, IV after 15 days, and V after 15 days when the viscosity change was within ±1.5 mPa·s %. It should be noted that the more the liquid stability is from I to V, the better the storage stability of the liquid is.

TABLE III

| Level | Compound 1 | Compound 2 | Mass ratio | Solvent 1 | Solvent 2 | Volume ratio | $R_{a1}$ | $R_{a2}$ | Liquid Stability |
|---|---|---|---|---|---|---|---|---|---|
| Comparison 3-1 | B6 | — | — | HFBO | — | — | 13.3 | — | II |
| Comparison 3-2 | B7 | — | — | TFPO | — | — | 14.3 | — | I |

TABLE III-continued

| Level | Compound 1 | Compound 2 | Mass ratio | Solvent 1 | Solvent 2 | Volume ratio | $R_{a1}$ | $R_{a2}$ | Liquid Stability |
|---|---|---|---|---|---|---|---|---|---|
| Comparison 3-3 | B8 | — | — | DFHO | — | — | 10.2 | — | III |
| Comparison 3-4 | B9 | — | — | OFPO | — | — | 13.2 | — | II |
| Example 5-1 | A9 | — | — | HFBO | 2-Hexanol | 20:80 | 9.1 | 15.0 | IV |
| Example 5-2 | A14 | — | — | OFPO | Triethylamine | 95:5 | 9.0 | 14.4 | V |
| Example 5-3 | A20 | — | — | TFPO | Cyclohexanone | 60:40 | 7.8 | 11.2 | IV |
| Example 5-4 | A21 | — | — | HFBO | Diisopropylamine | 95:5 | 8.8 | 16.5 | V |
| Example 5-5 | A22 | — | — | OFPO | Isopropyl alcohol | 65:35 | 9.1 | 12.5 | IV |
| Example 5-6 | A25 | B9 | 60:40 | HFBO | — | — | 9.6 | 13.4 | V |
| Example 5-7 | A27 | — | — | OFPO | HFPI | 50:50 | 7.9 | 12.5 | IV |
| Example 5-8 | A28 | — | — | OFPO | Pyridine | 90:10 | 10.0 | 12.2 | V |
| Example 5-9 | A37 | — | — | DFHO | Acetophenone | 80:20 | 9.1 | 11.0 | IV |
| Example 5-10 | A38 | B10 | 50:50 | DFHO | — | — | 9.2 | 14.5 | V |
| Example 5-11 | A47 | — | — | TFPO | Isophorone | 60:40 | 9.2 | 12.9 | IV |
| Example 5-12 | A49 | B11 | 66:34 | HFBO | — | — | 8.9 | 12.8 | V |
| Example 5-13 | A53 | — | — | DFHO | 1-Butanol | 50:50 | 9.9 | 12.4 | IV |
| Example 5-14 | A59 | — | — | TFPO | Triethanolamine | 95:5 | 8.8 | 12.5 | V |
| Example 5-15 | A63 | B12 | 90:10 | TFPO | — | — | 9.7 | 11.3 | IV |
| Example 5-16 | A67 | — | — | HFBO | Aniline | 75:25 | 9.3 | 17.7 | V |
| Example 5-17 | A69 | — | — | OFPO | EGMBE | 80:20 | 9.8 | 11.2 | V |
| Example 5-18 | A82 | — | — | DFHO | Tributylamine | 95:5 | 7.6 | 11.4 | V |
| Example 5-19 | A92 | — | — | HFBO | Diethylaminoethylamine | 95:5 | 8.9 | 14.0 | V |
| Example 5-20 | A95 | — | — | TFPO | 1-Pentanol | 50:50 | 9.0 | 14.8 | V |
| Example 5-21 | A144 | B17 | 66:34 | HFBO | — | — | 8.9 | 11.9 | V |
| Example 5-22 | A147 | — | — | DFHO | Cyclopentanone | 80:20 | 9.6 | 10.3 | V |
| Example 5-23 | A151 | — | — | HFBO | Dioxane | 60:40 | 7.4 | 13.1 | V |

As shown in Table III, when an alcohol solvent or an organic compound having an atom having an unshared electron pair is mixed as the component C according to the present invention, the liquid stability is drastically improved. In particular, when the atom having an unshared electron pair is a nitrogen atom which does not participate in aromaticity, the liquid stability is best.

Example 6

In Example 6, the liquid stability was evaluated when the component B according to the present invention is a π-conjugated boron compound having a fluorine-containing solvent solubilizing group.

<Preparation of Evaluation Compositions 6-1 to 6-10>

The evaluation compositions 6-1 to 6-10 were prepared in the same manner as used for the preparation in Example 3 except that the compounds and solvents were replaced by those listed in Table IV. When there were a plurality of compounds, the total amount of the compounds was set to 10 parts by mass, and the mass ratio was set to the value shown in Table IV. When there were a plurality of solvents, the total amount of the solvents was set to 2000 parts by mass, and the ratio was set to the value shown in Table III.

In Table IV, Compound 2 and Solvent 2 of Examples 6-1 to 6-10 are a component C according to the present invention.

<Evaluation of Liquid Stability>

After the above-mentioned composition for evaluation was measured immediately after preparation using a viscometer (manufactured by VM-10A (made by SEKONIC Co., Ltd.), the composition was hermetically sealed and stored at 60° C. After 2 days, 5 days, 10 days, and 15 days, the solution was returned to room temperature (25° C.), and then the viscosity of the liquid was measured after confirming that there was no precipitate. The viscosity was evaluated as I when no precipitation occurred and the viscosity changed by ±1.5 mPa·s or more from the viscosity measured before storage after 2 days of storage, it was evaluated as II after 5 days, III after 10 days, IV after 15 days, and V after 15 days when the viscosity change was within ±1.5 mPa·s %. It should be noted that the more the liquid stability is from I to V, the better the storage stability of the liquid is.

TABLE IV

| Level | Compound 1 | Compound 2 | Mass ratio | Solvent 1 | Solvent 2 | Volume ratio | $R_{a1}$ | $R_{a2}$ | Liquid Stability |
|---|---|---|---|---|---|---|---|---|---|
| Comparison 3-1 | B6 | — | — | HFBO | — | — | 13.3 | — | II |
| Comparison 3-2 | B7 | — | — | TFPO | — | — | 14.3 | — | I |
| Comparison 3-3 | B8 | — | — | DFHO | — | — | 10.2 | — | III |
| Comparison 3-4 | B9 | — | — | OFPO | — | — | 13.2 | — | II |
| Example 6-1 | A70 | — | — | DFHO | — | — | 9.8 | 9.8 | IV |
| Example 6-2 | A85 | — | — | TFPO | PFBFO | 50:50 | 7.7 | 10.3 | V |
| Example 6-3 | A94 | — | — | OFPO | — | — | 9.7 | 9.7 | IV |
| Example 6-4 | A98 | A85 | 50:50 | TFPO | — | — | 8.8 | 11.0 | IV |
| Example 6-5 | A110 | — | — | HFBO | — | — | 9.2 | 9.2 | IV |
| Example 6-6 | A116 | B19 | 66:34 | OFPO | — | — | 8.6 | 10.5 | V |
| Example 6-7 | A124 | — | — | TFPO | o-Xylene | 70:30 | 9.3 | 11.4 | V |
| Example 6-8 | A130 | — | — | OFPO | Triethylamine | 95:5 | 7.6 | 10.2 | V |
| Example 6-9 | A135 | — | — | HFBO | — | — | 8.5 | 8.5 | IV |
| Example 6-10 | A148 | B20 | 60:40 | DFHO | — | — | 8.5 | 10.2 | V |

As shown in Table IV, a material having a solubilizing group in a π-conjugated boron material is excellent in liquid stability even if it does not contain a component C, and further, it is understood that it has vey high liquid stability by containing a component C.

Example 7

In Example 7, the performance of an electronic device manufactured using the composition according to the present invention was evaluated.

<Preparation of Organic EL Element 7-1>

A bottom emission type organic EL element 7 was prepared by stacking on a base material: anode/hole injection layer/hole transport layer/light emitting layer/electron transport layer/electron injection layer/cathode. Then the stacked body was sealed.

(Preparation of Base Material)

First, on the entire surface of a polyethylene naphthalate film (PEN: manufactured by Teijin DuPont Film Co., Ltd.) on which an anode was formed, an inorganic gas barrier layer made of $SiO_x$ was formed to a layer thickness of 500 nm by using an atmospheric pressure plasma discharge treatment device having a structure described in JP-A 2004-68143. Thus, a flexible base material having a gas barrier property with an oxygen permeability of 0.001 mL/(m²·24 h) or less and a water vapor permeability of 0.001 g/(m²·24 h) or less was produced.

(Formation of Anode)

ITO (indium tin oxide) having a thickness of 120 nm was deposited on the base material by a sputtering method, and patterned by a photolithography method to form an anode. The pattern was such that the area of the light emitting region was 5 cm×5 cm.

(Formation of Hole Injection Layer)

The base material on which the anode was formed was ultrasonically cleaned with isopropyl alcohol, dried with dry nitrogen gas, and subjected to UV ozone cleaning for 5 minutes. Then, a 2 mass % solution obtained by diluting a poly(3,4-ethylenedioxythiophene)/polystyrene sulfonate (PEDOT/PSS) dispersion solution prepared in the same manner as in Example 16 of JP-A 4509787 was applied onto the base material on which the anode was formed by a die coating method. The resultant solution was air-dried to form a hole injection layer having a layer thickness of 40 nm.

(Formation of Hole Transport Layer)

Next, the base material on which the hole injection layer was formed was transferred to a nitrogen atmosphere using a nitrogen gas (grade G1), applied by an inkjet printing method using a coating solution for forming a hole transport layer having the following composition, and dried at 130° C. for 30 minutes to form a hole transport layer having a layer thickness of 30 nm.

(Coating Solution for Forming Hole Transport Layer)
 Hole transport materials; Compound C1 (weight-average molecular weight Mw=80000):
  10 parts by mass
 Chlorobenzene: 3000 parts by mass (Formation of Light Emitting Layer)

Next, the base material on which the hole transporting layer was formed was coated by an inkjet printing method using a coating solution for forming a light emitting layer having the following composition, and dried at 120° C. for 30 minutes to form a light emitting layer having a layer thickness of 50 nm.

(Coating Solution for Forming Light Emitting Layer)
 Host compound; Compound C2: 10 parts by mass
 Phosphorescence emitting material; Compound C3:
  1 part by mass
 Fluorescence emitting compound; Compound C4: 0.1 parts by mass
 n-Butyl acetate: 2200 parts by mass (Formation of Electron Transport Layer)

Next, an electron transport layer forming coating solution having the following composition was applied by an inkjet printing method and dried at 80° C. for 30 minutes to form an electron transport layer having a layer thickness of 30 nm.

(Coating Solution for Forming Electron Transport Layer)
 Compound B3: 6 parts by mass
 OFPO: 2000 parts by mass (Formation of Electron Injection Layer and Cathode)

Subsequently, the base material was attached to a vacuum deposition apparatus without exposure to the atmosphere. In addition, potassium fluoride was loaded in the molybdenum resistance heated boat, Al (aluminum) was loaded in the tungsten boat, and Ag (silver) was loaded in the tungsten boat. The prepared boats were attached to the vacuum evaporation device, and the vacuum tank was reduced to $5.0 \times 10^{-5}$ Pa. Thereafter, the boat was energized and heated to deposit potassium fluoride at 0.02 nm/sec on the electron transport layer to form a thin film having a thickness of 1 nm. Subsequently, aluminum was deposited to form a 100 nm-thick cathode.

(Sealing)

A sealing substrate was adhered to the laminate formed by the above steps using a commercially available roll laminating device.

As a sealing substrate, an aluminum foil having flexibility and a thickness of 30 μm (manufactured by Toyo Aluminum Co., Ltd.) was provided with an adhesive layer having a layer thickness of 1.5 μm using a two-component reaction type urethane adhesive for dry lamination, and a polyethylene terephthalate (PET) film having a thickness of 12 μm was laminated.

A thermosetting adhesive as a sealing adhesive was uniformly applied with a thickness of 20 μm along the adhesive surface (gloss surface) of the aluminum foil of the sealing substrate using a dispenser. This was dried under a vacuum of 100 Pa or less for 12 hours. Further, the sealing substrate was moved to a nitrogen atmosphere having a dew point temperature of −80° C. or less and an oxygen concentration of 0.8 ppm and dried for 12 hours or more, and the moisture content of the sealing adhesive was adjusted to be 100 ppm or less.

As the thermosetting adhesive, an epoxy adhesive obtained by mixing the following (A) to (C) was used.
 (A) Bisphenol A diglycidyl ether (DGEBA)
 (B) Dicyandiamide (DICY)
 (C) Epoxy adduct type curing accelerator The sealing substrate was brought into close contact with the above laminate body and tightly sealed under a pressure bonding condition of a pressure roll temperature of 100° C., a pressure of 0.5 MPa, and a machine speed of 0.3 m/min using a pressure roll.

As described above, the organic EL element 7-1 having the same configuration as that of the organic EL element having the above-described configuration was manufactured.

<Preparation of Organic EL Elements 7-2 to 7-10>

The organic EL elements 7-2 to 7-10 was prepared in the same manner as used for the preparation of the organic EL element 7-1 except for changing the electron transport layer forming coating liquid to that in Table V.

<Evaluation of Organic EL Elements 7-1 to 7-10>

The organic EL elements 7-1 to 7-10 produced as described above were evaluated as follows. The evaluation results are shown in Table V.

(1) Measurement of Drive Voltage 1

The drive voltage 1 was measured at room temperature (25° C.) by measuring the front luminance of the prepared organic EL element, and the drive voltage (V) at the time of 1000 cd/m$^2$ was measured by the elements. For measuring the luminance, a spectroradiometer CS-1000 (manufactured by Konica Minolta Sensing) was used. The drive voltage obtained above was applied to the following formula to determine the relative drive voltage of each organic EL element with respect to the drive voltage 1 of the organic EL element 7-1.

Relative drive voltage (%)=(Drive voltage of each organic EL element/Drive voltage 1 of organic EL element 7-1)×100

The lower the obtained numerical value represents that the drive voltage is low and it indicates a favorable result.

(2) Measurement of Drive Voltage 2

In the formation of the electron injection layer and the cathode of the organic EL elements 7-1 to 7-10, the electron injection layer was not vapor-deposited, and Ag was vapor-deposited as the cathode so as to have a thickness of 100 nm. The drive voltage 2 was measured to the organic EL elements thus prepared. The obtained drive voltage was applied to the following formula to determine the relative drive voltage of each organic EL element with respect to the drive voltage 2 of the organic EL element 7-1.

Relative drive voltage (%)=(Drive voltage of each organic EL element/Drive voltage 2 of the organic EL element 7-1)×100

31: Pump
32: Filter
33: Piping branch
34: Waste liquid tank
35: Control section
36: Tank
37: Tank
38A: Tank
38B: Tank
39: Pump
30b: Piezoelectric substrate
30c: Top plate
30d: Nozzle plate
30e: Ink liquid supply pipe
30f: Piping
56: Case
57: Cap receiving plate
59: Cover member
61: Nozzle plate
62: Cap receiving plate mounting part
68: Mounting hole
71: Nozzle opening portion
81a: First joint
81b: Second joint
82: Third joint
641, 651, 661 and 671: Concave portion
EOD: Single-charge device (Electron-only device)

What is claimed is:

1. A composition for an electronic device consisting of a component A, a component B, and optionally a component C which is a solvent or a solute, wherein the component A is a fluorine-containing solvent, and the component B is a compound having a structure represented by the following Formula (1),

TABLE V

| Level | Compound 1 | Compound 2 | Mass ratio | Solvent 1 | Solvent 2 | Volume ratio | Drive voltage 1 | Drive voltage 2 |
|---|---|---|---|---|---|---|---|---|
| Comparison 7-1 | B3 | — | — | OFPO | — | — | 100 | 100 |
| Comparison 7-2 | B10 | — | — | TFPO | Triethylamine | 95:5 | 108 | 94 |
| Comparison 7-3 | B20 | — | — | HFBO | — | — | 122 | 134 |
| Example 7-4 | A3 | B10 | 70:30 | OFPO | — | — | 74 | 63 |
| Example 7-5 | A27 | B3 | 60:40 | OFPO | — | — | 68 | 62 |
| Example 7-6 | A55 | B11 | 65:35 | OFPO | — | — | 77 | 67 |
| Example 7-7 | A48 | B6 | 66:33 | TFPO | Triethylamine | 95:5 | 68 | 58 |
| Example 7-8 | A56 | B12 | 55:45 | TFPO | Triethylamine | 95:5 | 69 | 55 |
| Example 7-9 | A124 | — | — | TFPO | Triethylamine | 95:5 | 61 | 49 |
| Example 7-10 | A148 | — | — | HFBO | — | — | 59 | 48 |

As shown in Table V, the organic EL elements according to the present invention are clearly superior to the organic EL element of the comparative example in drive voltage.

INDUSTRIAL APPLICABILITY

The composition for an electronic device of the present invention is preferably used for a composition for forming an electron transport layer, and is used for manufacturing an organic EL element. In particular, it is suitably used for manufacturing an organic EL element as inkjet ink.

DESCRIPTION OF SYMBOLS

1: Base material
2: Evaluation monolayer
30 and 100: Inkjet head

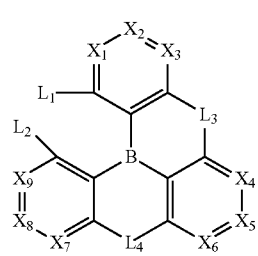

Formula (1)

wherein $X_1$ to $X_9$ each independently represent —$CW_m$ or a nitrogen atom, m of —$CW_m$ represents 1 to 9, and the substituents —$CW_1$ to —$CW_9$ correspond to $X_1$ to $X_9$, respectively; $W_1$ to $W_9$ each independently represent a hydrogen atom or a substituent; when $L_1$ and $L_2$ are not linked to each other, $L_1$ and $L_2$ each independently represent a hydrogen atom or a substituent $W_{m1}$, m of $W_{m1}$ represents 1 or 2, the substituents $W_{11}$ and $W_{21}$ correspond to $L_1$ and $L_2$, respectively; $L_1$ and $L_2$ may be linked to each other, in which case $L_1$ and $L_2$ are linked to each other via any one atom of oxygen, sulfur, carbon and nitrogen to form a 6-membered ring; in the case of a carbon atom, it represents $CS_1S_2$; in the case of a nitrogen atom, it represents $NR_1$; $L_3$ and $L_4$ each independently represent an oxygen atom, a sulfur atom, —$CS_{n1}S_{n2}$, or —$NR_{n3}$, n represents 3 or 4, —$CS_{31}S_{32}$ or —$NR_{33}$ corresponds to $L_3$, and —$CS_{41}S_{42}$ or —$NR_{43}$ corresponds to $L_4$; and $S_1$, $S_2$, $S_{31}$, $S_{32}$, $S_{41}$, $S_{42}$, $R_1$, $R_{33}$, $R_{43}$, $W_{11}$ and $W_{12}$ each independently represent a substituent, and in a case where the component C is present in the composition, a Hansen solubility parameter distance ($Ra_2$) between the component A and the component B is longer than a Hansen solubility parameter distance ($Ra_1$) between all solvents in the composition for an electronic device and all solutes in the composition for an electronic device.

2. The composition for electronic devices described in claim 1, wherein $Ra_1$ is 10 or less.

3. The composition for an electronic device described in claim 1, wherein the component C contains an atom having an unshared electron pair.

4. The composition for an electronic device described in claim 3, wherein the atom having an unshared electron pair of the component C is a nitrogen atom having an unshared electron pair that does not participate in aromaticity.

5. The composition for an electronic device described in claim 1, wherein the component C is an alcohol.

6. The composition for an electronic device described in claim 1, wherein any one of $X_1$ to $X_9$, $W_m$, $R_1$, $R_{33}$ and $R_{43}$ of a compound having the structure represented by Formula (1) has one or more fluorine-containing solvent solubilizing groups, and the fluorine-containing solvent solubilizing group is a substituent having a fluorine atom or a nitrogen atom.

7. The composition for an electronic device described in claim 1, being used as a composition for forming an electron transport layer or an electron injection layer of an organic electroluminescent element.

8. An ink for an electronic device, wherein the ink contains the composition for an electronic device described in claim 1.

9. The ink for an electronic device described in claim 8, wherein the ink for the electronic device is an inkjet printing ink.

10. A method of manufacturing an electronic device, wherein the ink for an electronic device described in claim 9 is discharged from an inkjet head to form a thin film for an electronic device.

\* \* \* \* \*